United States Patent
Lee et al.

(10) Patent No.: US 12,217,790 B2
(45) Date of Patent: Feb. 4, 2025

(54) MEMORY ARRAY CONNECTIONS

(71) Applicant: Taiwan Semiconductor Manufacturing Company, Ltd., Hsinchu (TW)

(72) Inventors: Chieh Lee, Hsinchu (TW); Chia-En Huang, Xinfeng Township (TW); Chun-Ying Lee, Hsinchu (TW); Yi-Ching Liu, Hsinchu (TW); Yih Wang, Hsinchu (TW); Rose Tseng, Hsinchu (TW); Yao-Jen Yang, Hsinchu County (TW); Jonathan Tsung-Yung Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 140 days.

(21) Appl. No.: 18/182,696

(22) Filed: Mar. 13, 2023

(65) Prior Publication Data
US 2023/0410887 A1    Dec. 21, 2023

Related U.S. Application Data

(60) Provisional application No. 63/422,646, filed on Nov. 4, 2022, provisional application No. 63/354,068, filed on Jun. 21, 2022.

(51) Int. Cl.
| | |
|---|---|
| G11C 11/16 | (2006.01) |
| G11C 5/06 | (2006.01) |
| G11C 11/408 | (2006.01) |
| G11C 11/4091 | (2006.01) |

(52) U.S. Cl.
CPC ............ *G11C 11/4091* (2013.01); *G11C 5/06* (2013.01); *G11C 11/4085* (2013.01); *G11C 11/16* (2013.01)

(58) Field of Classification Search
CPC ..................................................... G11C 11/16
See application file for complete search history.

(56) References Cited

U.S. PATENT DOCUMENTS

2012/0044736 A1*  2/2012  Chung ................... H10B 61/10
                                                            365/72

* cited by examiner

*Primary Examiner* — Jason Lappas
(74) *Attorney, Agent, or Firm* — Merchant & Gould P.C.

(57) ABSTRACT

A device includes a substrate, a first sense amplifier disposed on the substrate, a first word line driver disposed on the substrate and situated adjacent the first sense amplifier in the x-direction, and a first memory array disposed above the first sense amplifier and above the first word line driver in the z-direction. A plurality of first conductive segments extend alternately in the x-direction and the y-direction, and are disposed between the first memory array and the first sense amplifier and configured to electrically connect the first sense amplifier to a first bit line of the first memory array. A plurality of second conductive segments extend alternately in the x-direction and the y-direction, and are disposed between the first memory array and the first word line driver and configured to electrically connect the first word line driver to a first word line of the first memory array.

20 Claims, 32 Drawing Sheets

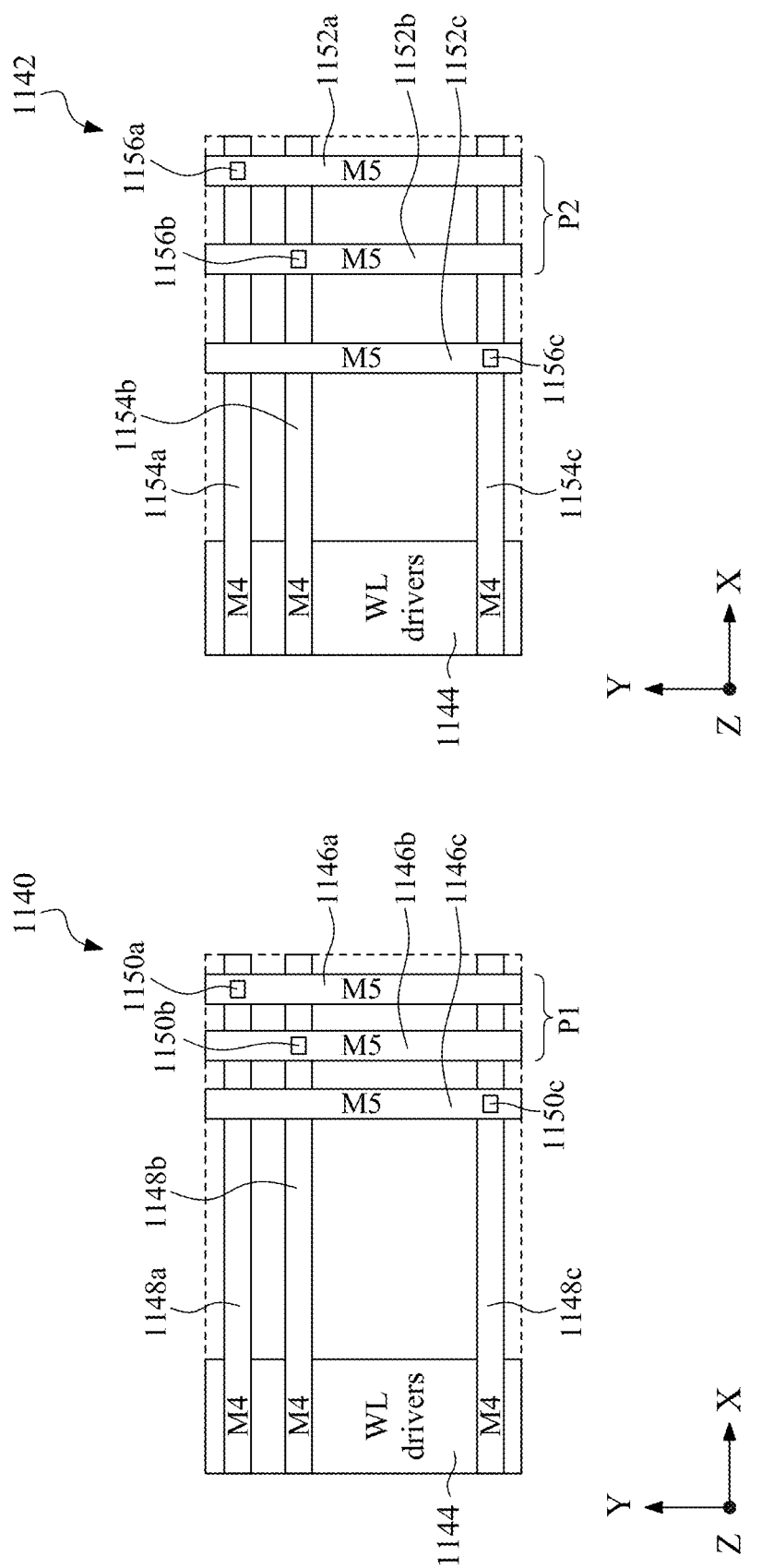

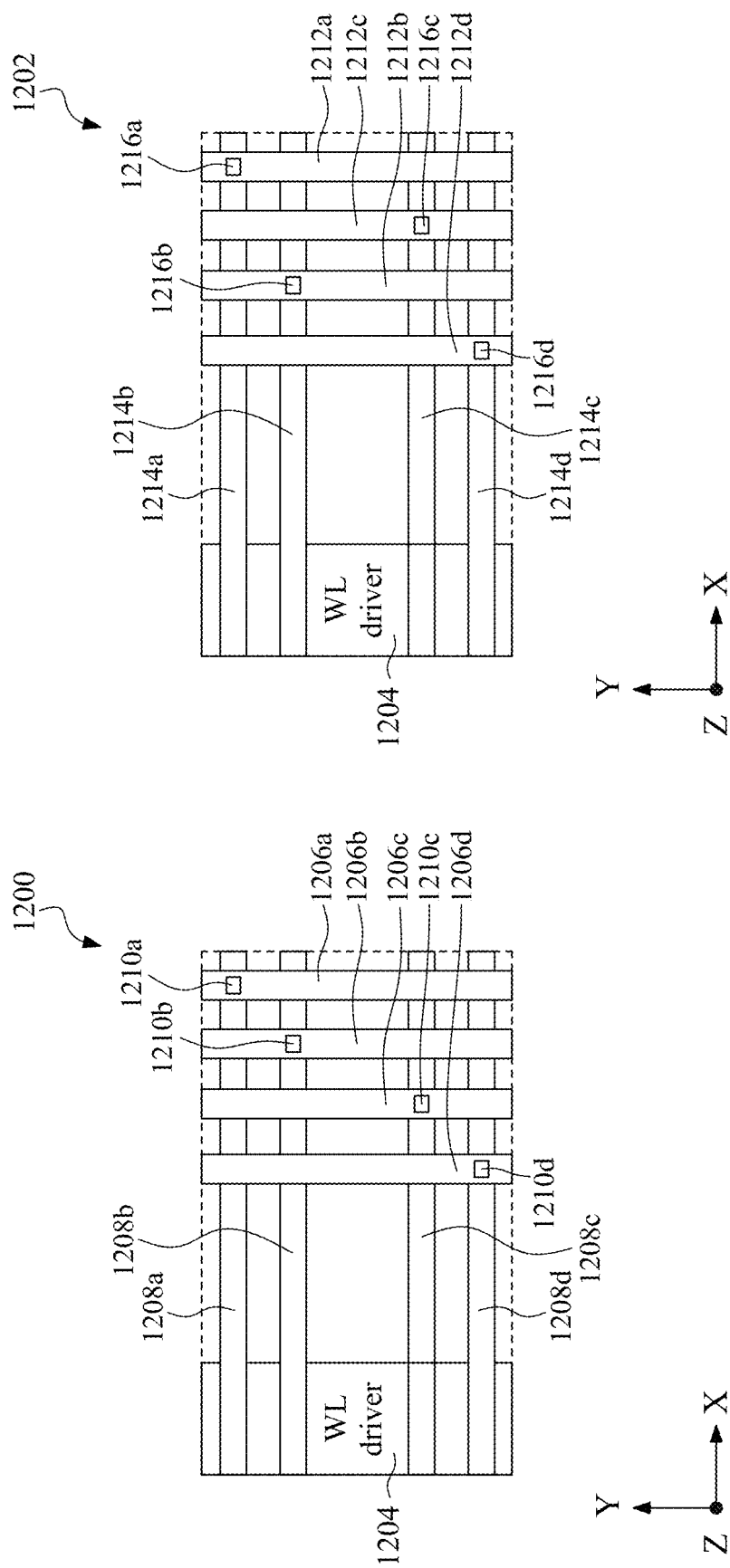

of the various 60
features may be arbitrarily increased or reduced for clarity of
MEMORY ARRAY CONNECTIONS

CROSS-REFERENCE TO RELATED APPLICATIONS

This application claims the benefit of U.S. Provisional Application No. 63/422,646, filed Nov. 4, 2022, and titled "MEMORY ARRAY CONNECTIONS," and claims the benefit of U.S. Provisional Application No. 63/354,068, filed Jun. 21, 2022, and titled "BEOL MEMORY CONNECTION," the disclosure of which is hereby incorporated herein by reference.

BACKGROUND

Typically, a memory device includes one or more memory arrays that include memory cells, and peripheral circuits for performing functions, such as addressing the memory cells, storing data in the memory cells, and retrieving data from the memory cells. The memory arrays can be any suitable type of memory, such as dynamic random-access memory (DRAM) or static random-access memory (SRAM).

A DRAM is a random-access memory that stores each bit of data in a memory cell, also referred to as a bit cell. The memory cell often consists of one transistor and one capacitor. The capacitor is charged to a high voltage level or discharged to a low voltage level through the transistor to store a bit of data. The high and low voltage levels of the capacitor represent the binary values of 1 and 0. Usually, the memory cells in a memory array are arranged in rows and columns, where each memory cell is coupled to a word line WL and a bit line BL/BLB in its corresponding row and column of the memory array. For example, each of the memory cells has a transistor gate terminal connected to a corresponding word line WL and one source/drain (S/D) terminal connected to a corresponding bit line BL/BLB. The other S/D terminal is connected to the capacitor of the memory cell. In general, as used herein a S/D terminal may refer to a source or a drain, individually or collectively depending upon the context.

Sense amplifiers (SAs) are connected to the bit lines BL/BLB of the memory arrays, where each of the SAs may include a pair of cross-connected inverters between the bit lines BL/BLB. In this configuration, a first inverter of the cross-connected inverters has an input connected to the bit line BL and an output connected to the bit line bar BLB, and the second inverter of the cross-connected inverters has an input connected to the bit line bar BLB and an output connected to the bit line BL. This results in a feedback loop that stabilizes with one of the bit lines BL/BLB at a high voltage level and the other bit line BL/BLB at a low voltage level.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

FIG. 26 is a diagram schematically illustrating a first memory device that includes word line drivers electrically connected to first word lines that have a smaller word line pitch P1, in accordance with some embodiments.

FIG. 27 is a diagram schematically illustrating a second memory device that includes word line drivers electrically connected to second word lines that have a larger word line pitch P2, in accordance with some embodiments.

FIG. 28 is a diagram schematically illustrating a memory device that includes word line drivers electrically connected to word lines through metal layer lines, in accordance with some embodiments.

FIG. 29 is a diagram schematically illustrating a memory device that includes word lines electrically connected to metal layer lines in a staggered connection arrangement, in accordance with some embodiments.

DETAILED DESCRIPTION

Figure 1:
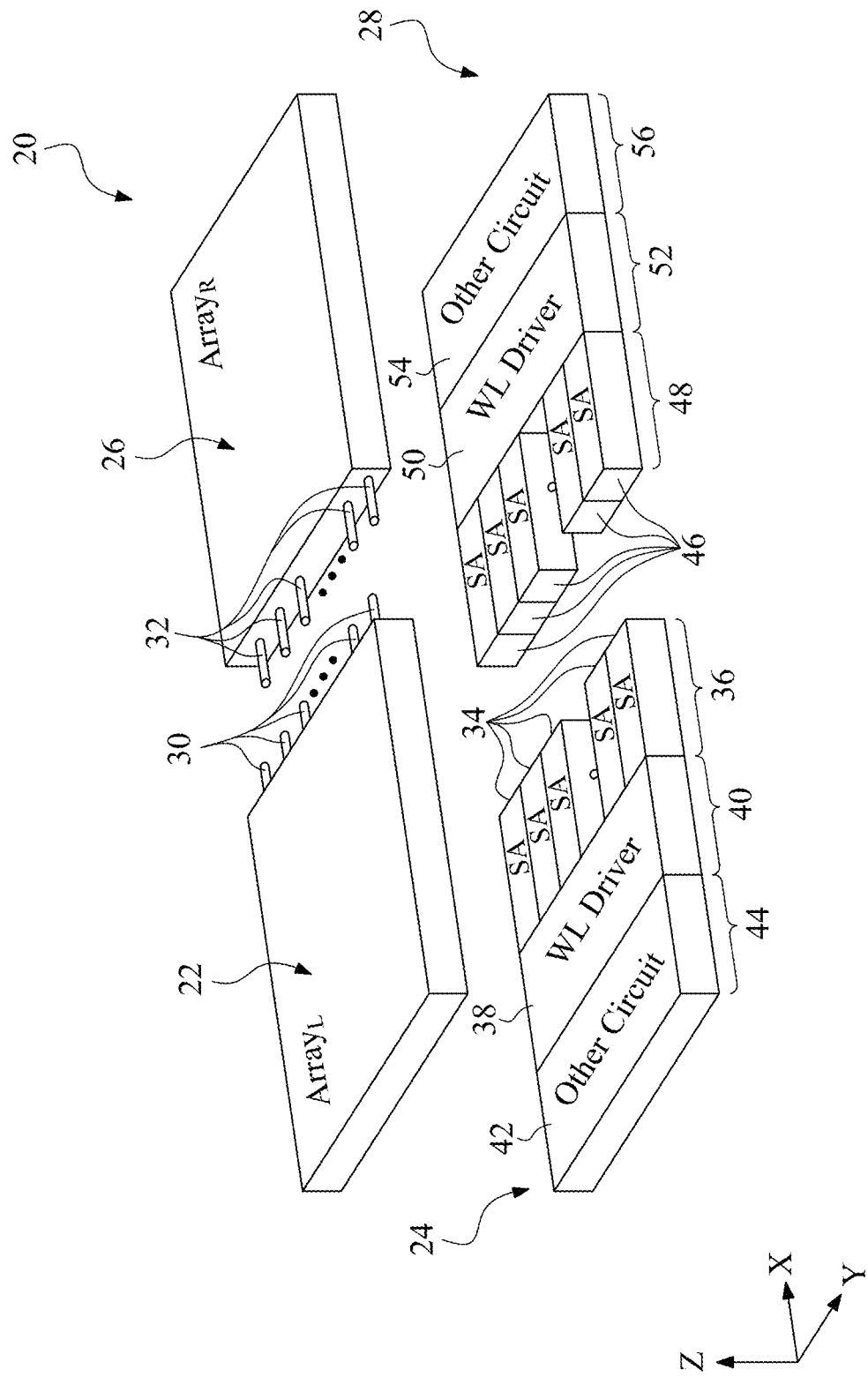
FIG. 1 is a diagram schematically illustrating a semiconductor memory device that includes a first memory array situated above first peripheral circuits and a second memory array situated above second peripheral circuits, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices include peripheral circuits, such as SAs and word line drivers, situated adjacent the memory arrays and on the same plane as the memory arrays. In these memory devices, shrinking the layout size of the memory cells limits the metal routing channels for connecting the memory arrays to the peripheral circuits on the same plane of the memory device. Also, in at least some open bit line DRAM architectures, each SA is connected to two bit lines in a row of memory cells, one bit line on one side of the SA and another bit line on the other side of the SA, and each SA is laid out to occupy at least two rows, in a double-pitch SA layout. In these devices, in memory arrays situated along the edges of the memory device (edge arrays), alternate rows of memory cells are not connected to a SA, such that half of the memory cells in the edge arrays are not used, which reduces the efficiency of the memory device. In addition, for different memory cell array dimensions, such as different bit line pitches and different word line pitches, the connections to the peripheral circuits and/or the layouts of the peripheral circuits will be different. This impacts yield learning, which cannot be easily determined by the different pitches and the different peripheral circuits. However, using the same peripheral circuit can mitigate the impact on yield learning.

Disclosed embodiments provide front-end-of-line (FEOL) peripheral circuits, such as SAs and word line drivers, connected to back-end-of-line (BEOL) memory arrays through middle-end-of-line (MEOL) and BEOL conductive layers, such as metal layers and vias. The FEOL peripheral circuits are situated under the BEOL memory arrays, such that the MEOL and BEOL conductive layers provide conductive paths, along a z-axis, between the FEOL peripheral circuits and the BEOL memory arrays. In the disclosed embodiments, all memory cells in the memory device including all memory cells in the edge arrays of the memory device are used to store data. Thus, as compared to devices that have peripheral circuits situated adjacent the memory arrays and on a same plane of the memory device as the memory arrays and that have the peripheral circuits connected to the memory arrays through metal routing channels that generally extend along an x-axis and/or a y-axis, the memory devices that have memory arrays above peripheral circuits and z-axis metal routing lines between the peripheral circuits and the memory arrays have an increased area efficiency and a higher memory cell density.

Disclosed embodiments provide a device that includes a sense amplifier and a word line driver disposed under a memory array. First conductive segments connect the sense amplifier to a bit line of the memory array and second conductive segments connect the word line driver to a word line of the memory array. In some embodiments, the memory array has an array footprint where the word line driver is situated in a middle portion of the array footprint and the sense amplifier is situated near a boundary of the array footprint and, in some embodiments, the bit line is situated along an x-axis of the memory array and the word line is situated along a y-axis of the memory array. In some embodiments, the memory array has an array footprint where the sense amplifier is situated in a middle portion of the array footprint and the word line driver is situated near a boundary of the array footprint and, in some embodiments, the word line is situated along an x-axis of the memory array and the bit line is situated along a y-axis of the memory array.

Disclosed embodiments further provide a device that includes a first memory array and a second memory array that is spaced apart from the first memory array. A first sense amplifier is situated under the first memory array and a second sense amplifier is situated under the second memory array. First conductive segments connect the first sense amplifier and the second sense amplifier to the first memory array, and second conductive segments connect the first sense amplifier and the second sense amplifier to the second memory array.

Other disclosed embodiments provide a method of manufacturing a memory device. The method includes forming FEOL peripheral circuits in a substrate; forming MEOL conductive layers that are electrically connected to the FEOL peripheral circuits; forming BEOL conductive layers that are electrically connected to the MEOL conductive layers; and forming BEOL memory arrays above the FEOL peripheral circuits with the BEOL memory arrays electrically connected to the BEOL conductive layers.

Advantages of the disclosed embodiments include reducing the size of the memory device by reducing the area occupied by the memory arrays and peripheral circuits on the semiconductor device, which is part of reducing the cost of the memory device. Also, using all memory cells in the edge arrays of the memory device eliminates waste in the memory device, increasing area efficiency and providing a higher memory cell density. Further, advantages of the disclosed embodiments include varying memory cell dimensions and/or changing technology nodes without changing placement of the peripheral circuits and without changing the FEOL masks, which results in improved product yields and performance, and further advantages include reducing the duration of yield learning and meeting performance, power, area, cost, and time to market criteria.

FIG. 1 is a diagram schematically illustrating a semiconductor memory device 20 that includes a first memory array 22 situated above first peripheral circuits 24 and a second memory array 26 situated above second peripheral circuits 28, in accordance with some embodiments. The first memory array 22 is situated in the z-direction, along the z-axis, above the first peripheral circuits 24, and the second memory array 26 is situated in the z-direction, along the z-axis, above the second peripheral circuits 28. In some embodiments, the first memory array 22 is a BEOL memory array. In some embodiment, the second memory array 26 is a BEOL memory array. Also, in some embodiments, the first peripheral circuits 24 are FEOL peripheral circuits and, in some embodiments, the second peripheral circuits 28 are FEOL peripheral circuits.

The first memory array 22 is a DRAM memory array, and the second memory array 26 is a DRAM memory array. The first memory array 22 includes bit lines 30 that extend in the x-direction, along the x-axis, and word lines (not shown in FIG. 1) that extend in the y-direction, along the y-axis. The second memory array 26 includes bit lines 32 that extend in the x-direction, along the x-axis, and word lines (not shown in FIG. 1) that extend in the y-direction, along the y-axis. In other embodiments, the first and second memory arrays 22 and 26 can be another type of memory, such as an SRAM.

The first peripheral circuits 24 include SAs 34 in a first end portion 36, word line drivers 38 in a middle portion 40, and other circuits 42 in a second end portion 44. The first memory array 22 has an array footprint on the first peripheral circuits 24, such that the word line drivers 38 in the middle portion 40 are situated in a middle portion of the array footprint and the SAs 34 in the first end portion 36 are situated near a boundary of the array footprint. The SAs 34 are electrically connected to the bit lines 30 of the first memory array 22 and/or to the bit lines 32 of the second memory array 26 through first conductive layers or segments (not shown in FIG. 1) that extend in the z-direction, along the z-axis. In some embodiments, the first conductive layers that extend in the z-direction are MEOL layers and BEOL layers, such as metal layers and vias.

The second peripheral circuits 28 include SAs 46 in a first end portion 48, word line drivers 50 in a middle portion 52, and other circuits 54 in a second end portion 56. The second memory array 26 has an array footprint on the second peripheral circuits 28, such that the word line drivers 50 in the middle portion 52 are situated in a middle portion of the array footprint and the SAs 46 in the first end portion 48 are situated near a boundary of the array footprint. The SAs 46 are electrically connected to the bit lines 30 of the first memory array 22 and/or to the bit lines 32 of the second memory array 26 through second conductive layers or segments (not shown in FIG. 1) that extend in the z-direction, along the z-axis. In some embodiments, the second conductive layers that extend in the z-direction are MEOL layers and BEOL layers, such as metal layers and vias.

Figure 2:
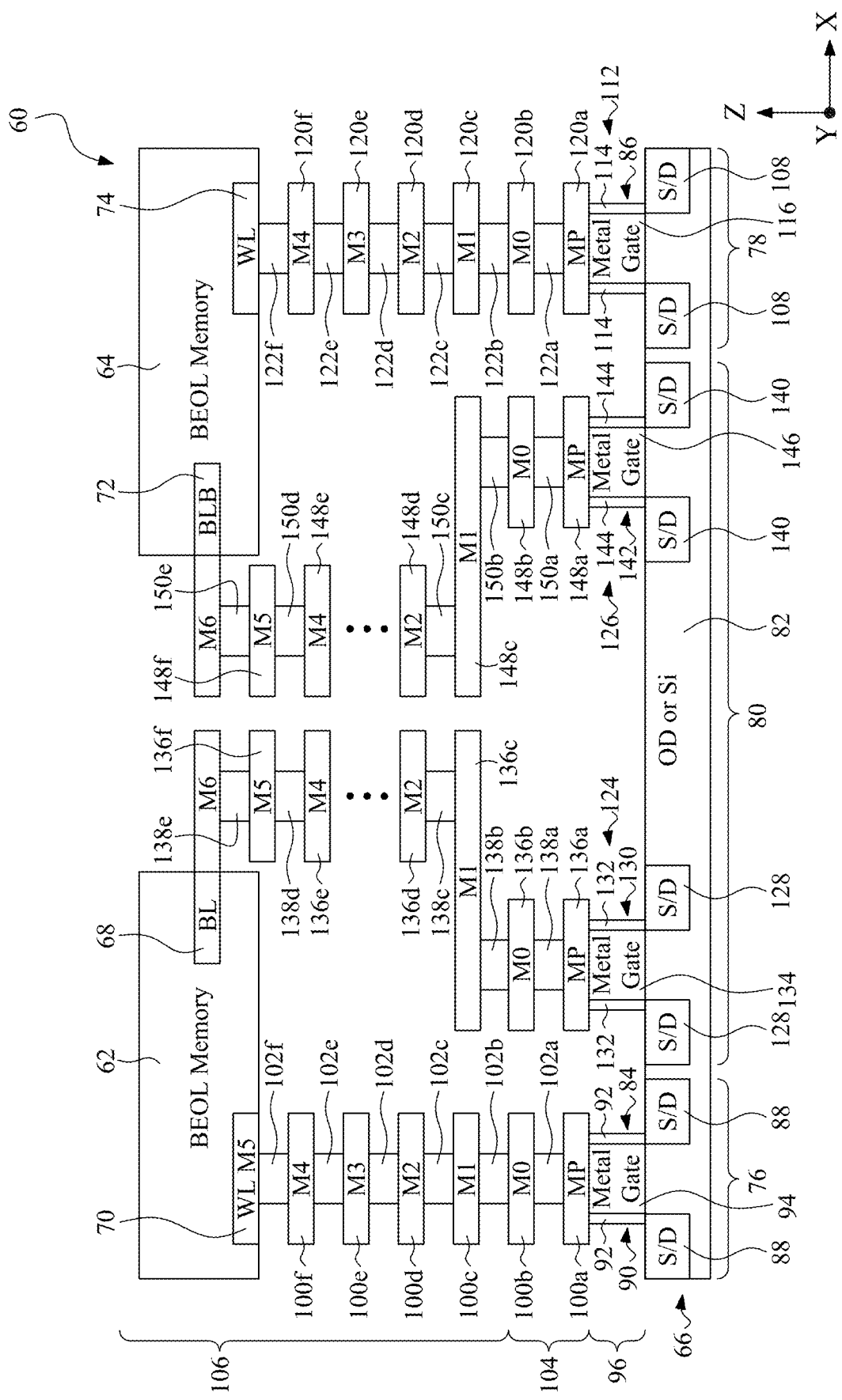
FIG. 2 is a diagram schematically illustrating a semiconductor memory device that includes a first back-end-of-line (BEOL) memory array and a second BEOL memory array electrically connected to front-end-of-line (FEOL) peripheral circuits, in accordance with some embodiments.

FIG. 2 is a diagram schematically illustrating a semiconductor memory device 60 that includes a first BEOL memory array 62 and a second BEOL memory array 64 electrically connected to FEOL peripheral circuits 66, in accordance with some embodiments. In some embodiments, the memory device 60 is like the memory device 20 of FIG. 1. In some embodiments, the first BEOL memory array 62 is like the first memory array 22 (shown in FIG. 1) and, in some embodiments, the second BEOL memory array 64 is like the second memory array 26 (shown in FIG. 1).

The first BEOL memory array 62 is situated in the z-direction, along the z-axis, above the FEOL peripheral circuits 66, and the second BEOL memory array 64 is situated in the z-direction, along the z-axis, above the FEOL peripheral circuits 66. The first BEOL memory array 62 is a DRAM memory array, and the second BEOL memory array 64 is a DRAM memory array. The first BEOL memory array 62 includes bit lines, such as first bit line BL 68, that extend in the x-direction, along the x-axis, and word lines, such as first word line WL 70, that extend in the y-direction, along the y-axis. The second BEOL memory array 64 includes bit lines, such as second bit line BLB 72, that extend in the x-direction, along the x-axis, and word lines, such as second word line WL 74, that extend in the y-direction, along the y-axis. In other embodiments, the first and second BEOL memory arrays 62 and 64 can be another type of memory, such as an SRAM.

The FEOL peripheral circuits 66 include a first word line driver region 76 situated at one end of the peripheral circuits 66, a second word line driver region 78 situated at another end of the peripheral circuits 66, and a SA region 80 that is situated between the first word line driver region 76 and the second word line driver region 78. The peripheral circuits 66 include components, such as transistors, disposed in a substrate/well region 82. The substrate/well region 82 can include active areas, such as oxide diffusion (OD) areas or silicon substrate/well areas. In some embodiments, the first word line driver region 76 is part of the word line drivers 38 (shown in FIG. 1) and the second word line driver region 78 is part of the word line drivers 50 (shown in FIG. 1). In some embodiments, the SA region 80 is part of the SAs 34 and 46 (shown in FIG. 1).

The first word line driver region 76 includes a first transistor 84 that is part of a word line driver situated below the first BEOL memory array 62 and the second word line driver region 78 includes a second transistor 86 that is part of a word line driver situated below the second BEOL memory array 64. The first transistor 84 is electrically connected to the first word line WL 70 of the first BEOL memory array 62 and the second transistor 86 is electrically connected to the second word line WL 74 of the second BEOL memory array 64.

The first transistor 84 includes S/D regions 88 situated in the substrate/well region 82 and a first gate structure 90 situated above the channel of the first transistor 84. The first gate structure 90 includes isolation regions 92 and a metal gate portion 94 where, in some embodiments, the first gate structure 90 includes a polysilicon layer disposed over the metal gate portion 94. The first gate structure 90, including the isolation regions 92 and the metal gate portion 94, is manufactured in a FEOL process 96 that, in some embodiments, includes disposing the S/D regions 88 in the substrate/well region 82. S/D regions may refer to a source or a drain, individually or collectively dependent upon the context.

The first gate structure 90 is electrically connected to the first word line WL 70 of the first memory array 62 through a conductive path that extends in the z-direction, along the z-axis. The conductive path includes a plurality of conductive segments 100a-100f and 102a-102f that are manufactured during a MEOL process 104 and a BEOL process 106. Also, the first and second BEOL memory arrays 62 and 64 are manufactured during the BEOL process 106. In the MEOL process 104, a metal over poly (MP) layer 100a is disposed on the first gate structure 90, a first via 102a is disposed on the MP layer 100a, and a first metal layer M0 100b is disposed on the first via 102a. In the BEOL process 106, a second via 102b is disposed on the first metal layer M0 100b, a second metal layer M1 100c is disposed on the second via 102b, a third via 102c is disposed on the second metal layer M1 100c, a third metal layer M2 100d is disposed on the third via 102c, a fourth via 102d is disposed on the third metal layer M2 100d, a fourth metal layer M3 100e is disposed on the fourth via 102d, a fifth via 102e is disposed on the fourth metal layer M3 100e, a fifth metal layer M4 100f is disposed on the fifth via 102e, and a sixth via 102f is disposed on the fifth metal layer M4 100f and electrically connected to the first word line WL 70, which is a sixth metal layer M5. In some embodiments, the MP layer 100a, the second metal layer M1 100c, the fourth metal layer M3 100e, and the first word line WL 70 extend in the y-direction, along the y-axis. In some embodiments, the first metal layer M0 100b, the third metal layer M2 100d, and the fifth metal layer M4 100f extend in the x-direction, along the x-axis.

The second transistor 86 includes S/D regions 108 situated in the substrate/well region 82 and a second gate structure 112 situated above the channel of the second transistor 86. The second gate structure 112 includes isolation regions 114 and a metal gate portion 116 where, in some embodiments, the second gate structure 112 includes a polysilicon layer disposed over the metal gate portion 116. The second gate structure 112, including the isolation regions 114 and the metal gate portion 116, is manufactured in the FEOL process 96 that, in some embodiments, includes disposing the S/D regions 108 in the substrate/well region 82.

The second gate structure 112 is electrically connected to the second word line WL 74 of the second memory array 64 through a conductive path that extends in the z-direction, along the z-axis. The conductive path includes a plurality of conductive segments 120a-120f and 122a-122f that are manufactured during the MEOL process 104 and the BEOL process 106. In the MEOL process 104, an MP layer 120a is disposed on the second gate structure 112, a first via 122a is disposed on the MP layer 120a, and a first metal layer M0 120b is disposed on the first via 122a. In the BEOL process 106, a second via 122b is disposed on the first metal layer M0 120b, a second metal layer M1 120c is disposed on the second via 122b, a third via 122c is disposed on the second metal layer M1 120c, a third metal layer M2 120d is disposed on the third via 122c, a fourth via 122d is disposed on the third metal layer M2 120d, a fourth metal layer M3 120e is disposed on the fourth via 122d, a fifth via 122e is disposed on the fourth metal layer M3 120e, a fifth metal layer M4 120f is disposed on the fifth via 122e, and a sixth via 122f is disposed on the fifth metal layer M4 120f and electrically connected to the second word line WL 74, which is a sixth metal layer M5. In some embodiments, the MP layer 120*a*, the second metal layer M1 120*c*, the fourth metal layer M3 120*e*, and the second word line WL 74 extend in the y-direction, along the y-axis. In some embodiments, the first metal layer M0 120*b*, the third metal layer M2 120*d*, and the fifth metal layer M4 120*f* extend in the x-direction, along the x-axis.

The SA region 80 includes a third transistor 124 that is part of a SA situated below the first BEOL memory array 62 and a fourth transistor 126 that is part of a SA situated below the second BEOL memory array 64. The third transistor 124 is electrically connected to the first bit line BL 68 of the first BEOL memory array 62 and the fourth transistor 126 is electrically connected to the second bit line BLB 72 of the second BEOL memory array 64.

The third transistor 124 includes S/D regions 128 that are situated in the substrate/well region 82 and a third gate structure 130 that is situated above the channel of the third transistor 124. The third gate structure 130 includes isolation regions 132 and a metal gate portion 134 where, in some embodiments, the third gate structure 130 includes a polysilicon layer disposed over the metal gate portion 134. The third gate structure 130, including the isolation regions 132 and the metal gate portion 134, is manufactured in the FEOL process 96 that, in some embodiments, includes disposing the S/D regions 128 in the substrate/well region 82.

The third gate structure 130 is electrically connected to the first bit line BL 68 of the first memory array 62 through a conductive path that generally extends in the z-direction, along the z-axis. The conductive path includes a plurality of conductive segments 136*a*-136*f* and 138*a*-138*e* that are manufactured during the MEOL process 104 and the BEOL process 106. In the MEOL process 104, an MP layer 136*a* is disposed on the third gate structure 130, a first via 138*a* is disposed on the MP layer 136*a*, and a first metal layer M0 136*b* is disposed on the first via 138*a*. In the BEOL process 106, a second via 138*b* is disposed on the first metal layer M0 136*b*, a second metal layer M1 136*c* is disposed on the second via 138*b*, a third via 138*c* is disposed on the second metal layer M1 136*c*, and a third metal layer M2 136*d* is disposed on the third via 138*c*. This continues up to a fourth via 138*d* disposed on a fifth metal layer M4 136*e*, a sixth metal layer M5 136*f* disposed on the fourth via 138*d*, and a fifth via 138*e* disposed on the sixth metal layer M5 136*f* and electrically connected to the first bit line BL 68, which is a seventh metal layer M6. In some embodiments, the MP layer 136*a*, the second metal layer M1 136*c*, the fourth metal layer M3 (not shown), and the sixth metal layer M5 136*f* extend in the y-direction, along the y-axis. In some embodiments, the first metal layer M0 136*b*, the third metal layer M2 136*d*, the fifth metal layer M4 136*e*, and the first bit line BL 68 extend in the x-direction, along the x-axis.

The fourth transistor 126 includes S/D regions 140 situated in the substrate/well region 82 and a fourth gate structure 142 that is situated above the channel of the fourth transistor 126. The fourth gate structure 142 includes isolation regions 144 and a metal gate portion 146 where, in some embodiments, the fourth gate structure 142 includes a polysilicon layer disposed over the metal gate portion 146. The fourth gate structure 142, including the isolation regions 144 and the metal gate portion 146, is manufactured in the FEOL process 96 that, in some embodiments, includes disposing the S/D regions 140 in the substrate/well region 82.

The fourth gate structure 142 is electrically connected to the second bit line BLB 72 of the second memory array 64 through a conductive path that extends generally in the z-direction, along the z-axis. The conductive path includes a plurality of conductive segments 148*a*-148*f* and 150*a*-150*e* that are manufactured during the MEOL process 104 and the BEOL process 106. In the MEOL process 104, an MP layer 148*a* is disposed on the fourth gate structure 142, a first via 150*a* is disposed on the MP layer 148*a*, and a first metal layer M0 148*b* is disposed on the first via 150*a*. In the BEOL process 106, a second via 150*b* is disposed on the first metal layer M0 148*b*, a second metal layer M1 148*c* is disposed on the second via 150*b*, a third via 150*c* is disposed on the second metal layer M1 148*c*, and a third metal layer M2 148*d* is disposed on the third via 150*c*. This continues up to a fourth via 150*d* disposed on a fifth metal layer M4 148*e*, a sixth metal layer M5 148*f* disposed on the fourth via 150*d*, and a fifth via 150*e* disposed on the sixth metal layer M5 148*f* and electrically connected to the second bit line BLB 72, which is a seventh metal layer M6. In some embodiments, the MP layer 148*a*, the second metal layer M1 148*c*, the fourth metal layer M3 (not shown), and the sixth metal layer M5 148*f* extend in the y-direction, along the y-axis. In some embodiments, the first metal layer M0 148*b*, the third metal layer M2 148*d*, the fifth metal layer M4 148*e*, and the second bit line BLB 72 extend in the x-direction, along the x-axis.

The memory device 60 includes the first BEOL memory array 62 and the second BEOL memory array 64 situated above the FEOL peripheral circuits 66 and conductive paths that extend in the z-direction, along the z-axis, between the peripheral circuits 66 and the BEOL memory arrays 62 and 64. This architecture reduces the area occupied by the BEOL memory arrays 62 and 64 and the FEOL peripheral circuits 66 in the memory device 60, as compared to devices that have peripheral circuits situated adjacent the memory arrays and on a same plane of the memory device as the memory arrays and that have the peripheral circuits connected to the adjacent memory arrays through metal routing channels that generally extend in the same plane, along the x-axis and/or the y-axis. Advantages of the memory device 60 include reducing the size of the memory device 60 by reducing the area occupied by the BEOL memory arrays 62 and 64 and peripheral circuits 66 on the semiconductor device, which is also part of reducing the cost of the memory device 60. Further advantages include increasing area efficiency and providing a higher memory cell density.

Figure 3:
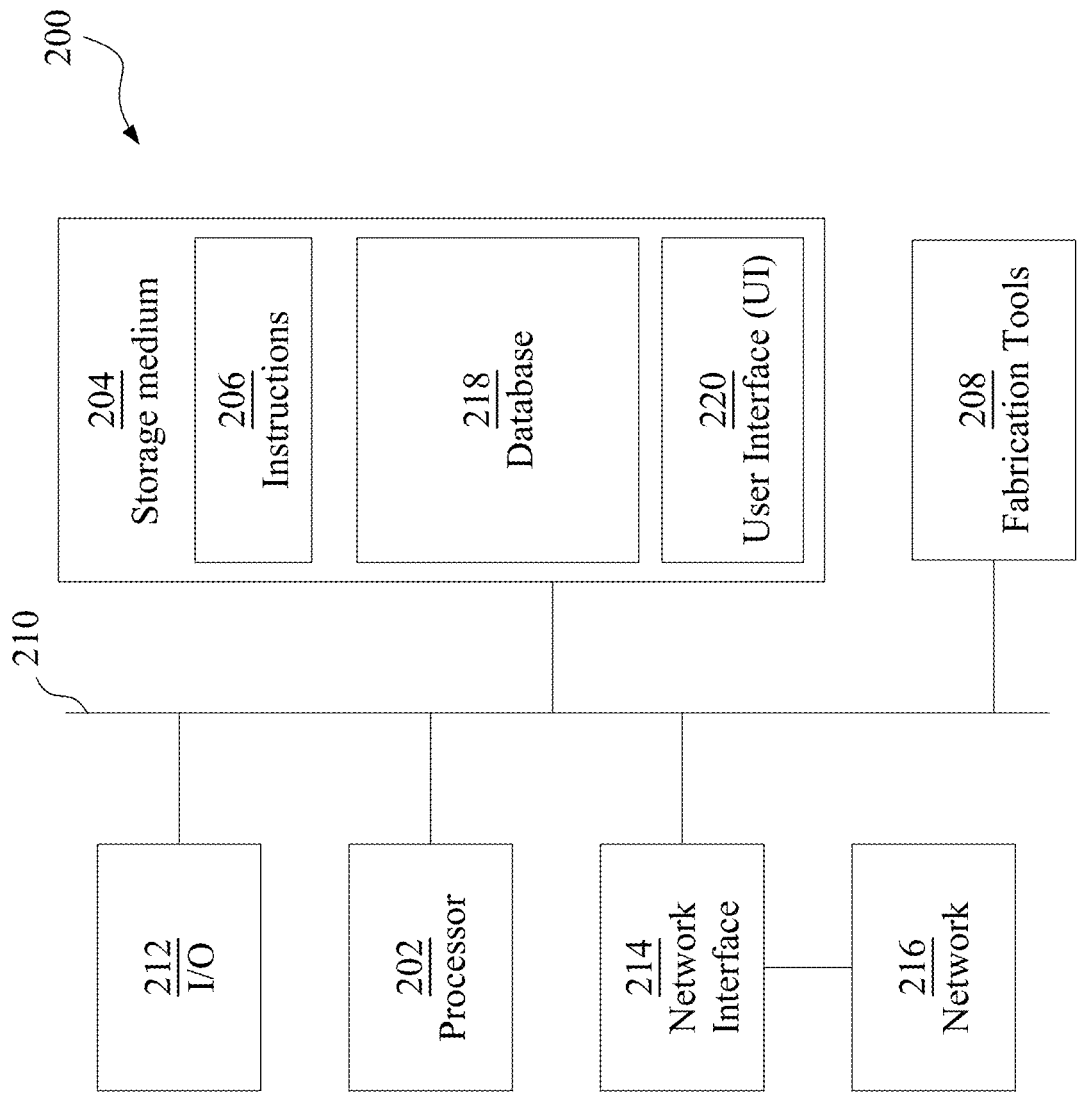
FIG. 3 is a block diagram schematically illustrating an example of a computer system that is configured to provide the devices and methods of the current disclosure, in accordance with some embodiments.

FIG. 3 is a block diagram schematically illustrating an example of a computer system 200 that is configured to provide the devices and methods of the current disclosure, including the semiconductor memory device 20 of FIG. 1 and the semiconductor memory device 60 of FIG. 2, in accordance with some embodiments. Some or all the design and manufacture of the devices can be performed by or with the computer system 200. In some embodiments, the computer system 200 includes an electronic design automation (EDA) system. In some embodiments, the devices are integrated circuits.

In some embodiments, the system 200 is a general-purpose computing device including a processor 202 and a non-transitory, computer-readable storage medium 204. The computer-readable storage medium 204 may be encoded with, e.g., store, computer program code such as executable instructions 206. Execution of the instructions 206 by the processor 202 provides (at least in part) a design tool that implements a portion or all the functions of the system 200, such as pre-layout simulations, post-layout simulations, routing, rerouting, and final layout for manufacturing. Further, fabrication tools 208 are included to further layout and physically implement the design and manufacture of the devices. In some embodiments, the system 200 includes a commercial router. In some embodiments, the system 200 includes an automatic place and route (APR) system.

The processor 202 is electrically coupled to the computer-readable storage medium 204 by a bus 210 and to an input/output (I/O) interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all the functions of the system 200, such as providing the devices and methods of the current disclosure and other functions of the system 200. In some embodiments, the processor 202 is a central processing unit (CPU), a multi-processor, a distributed processing system, an application specific integrated circuit (ASIC), and/or a suitable processing unit.

In some embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 204 can include a compact disk read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all the functions of the system 200. In some embodiments, the computer-readable storage medium 204 also stores information which facilitates performing a portion or all the functions of the system 200. In some embodiments, the computer-readable storage medium 204 stores a database 218 that includes one or more of component libraries, digital circuit cell libraries, and databases.

The system 200 includes the I/O interface 212, which is coupled to external circuitry. In some embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of components and cells, and/or other parameters for processing by the processor 202. The information is transferred to the processor 202 by the bus 210. Also, the system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the system 200. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 200 include fabrication tools 208 for implementing the manufacturing processes of the system 200. For example, based on the final layout, photolithographic masks may be generated, which are used to fabricate semiconductor devices by the fabrication tools 208.

Figure 4:
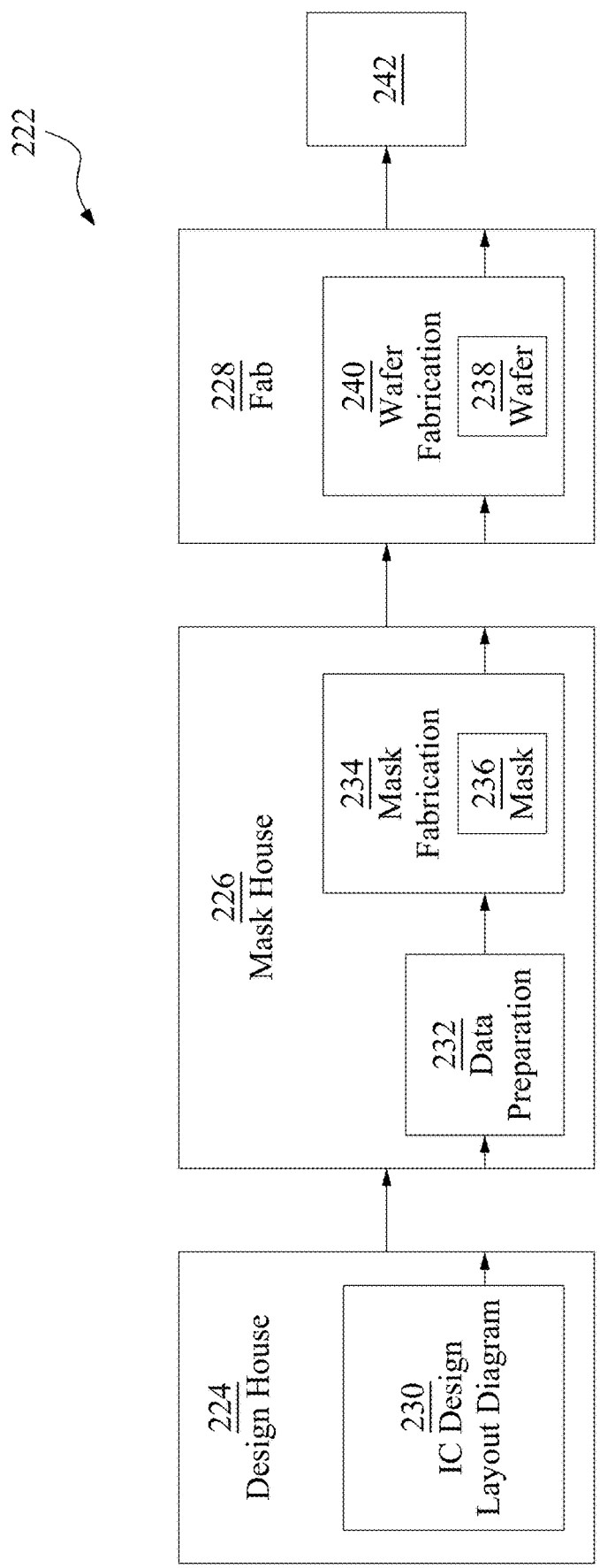
FIG. 4 is a block diagram of a semiconductor device manufacturing system and a semiconductor device manufacturing flow associated therewith, in accordance with some embodiments.

Further aspects of device fabrication are disclosed in conjunction with FIG. 4, which is a block diagram of a semiconductor device manufacturing system 222 that may employ the computer system 200 of FIG. 3, and a semiconductor device manufacturing flow associated therewith, in accordance with some embodiments. In some embodiments, semiconductor devices such as those disclosed herein may be fabricated using the manufacturing system 222.

In FIG. 4, the semiconductor device manufacturing system 222 includes entities, such as a design house 224, a mask house 226, and a semiconductor device manufacturer/fabricator (a fab) 228, that interact with one another in the design, development, and manufacturing cycles and/or services related to manufacturing a semiconductor device, such as the devices described herein. The entities in the system 222 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 224, the mask house 226, and the semiconductor device fab 228 are owned by a single larger company. In some embodiments, two or more of the design house 224, the mask house 226, and the semiconductor device fab 228 coexist in a common facility and use common resources.

The design house (or design team) 224 generates a semiconductor device design layout diagram 230. The semiconductor device design layout diagram 230 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 230 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form a semiconductor device design layout diagram 230. The semiconductor device design layout diagram 230 is presented in one or more data files having information of the geometrical patterns. For example, semiconductor device design layout diagram 230 can be expressed in a GDSII file format or DFII file format. In some embodiments, the design procedure includes one or more of analog circuit design, digital circuit design, logic circuit design, standard cell circuit design, power distribution network (PDN) design, supply voltage track design, reference voltage track design, place and route routines, and physical layout designs.

The mask house 226 includes data preparation 232 and mask fabrication 234. The mask house 226 uses the semiconductor device design layout diagram 230 to manufacture one or more masks 236 to be used for fabricating the various layers of the semiconductor device or semiconductor structure. The mask house 226 performs mask data preparation 232, where the semiconductor device design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the semiconductor device fab 228. In FIG. 4, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the semiconductor device design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the semiconductor device design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the semiconductor device fab 228. LPC simulates this processing based on the semiconductor device design layout diagram 230 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC can be repeated to further refine the semiconductor device design layout diagram 230.

The above description of mask data preparation 232 has been simplified for the purposes of clarity. In some embodiments, data preparation 232 includes additional features such as a logic operation (LOP) to modify the semiconductor device design layout diagram 230 according to manufacturing rules. Additionally, the processes applied to the semiconductor device design layout diagram 230 during data preparation 232 may be executed in a variety of different orders.

After the mask data preparation 232 and during the mask fabrication 234, a mask 236 or a group of masks 236 are fabricated based on the modified semiconductor device design layout diagram 230. In some embodiments, the mask fabrication 234 includes performing one or more lithographic exposures based on the semiconductor device design layout diagram 230. In some embodiments, an electron-beam (e-beam) or a mechanism of multiple e-beams is used to form a pattern on a mask (photomask or reticle) 236 based on the modified semiconductor device design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The semiconductor device fab 228 includes wafer fabrication 240. The semiconductor device fab 228 is a semiconductor device fabrication business that includes one or more manufacturing facilities for the fabrication of a variety of different semiconductor device products. In some embodiments, the semiconductor device fab 228 is a semiconductor foundry. For example, there may be a manufacturing facility for the FEOL fabrication of a plurality of semiconductor device products, while a second manufacturing facility may provide the MEOL and the BEOL fabrication for the interconnection and packaging of the semiconductor device products, and a third manufacturing facility may provide other services for the foundry business.

The semiconductor device fab 228 uses the mask(s) 236 fabricated by the mask house 226 to fabricate the semiconductor structures or semiconductor devices 242 of the current disclosure. Thus, the semiconductor device fab 228 at least indirectly uses the semiconductor device design layout diagram 230 to fabricate the semiconductor structures or semiconductor devices 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the semiconductor device fab 228 using the mask(s) 236 to form the semiconductor structures or semiconductor devices 242 of the current disclosure. In some embodiments, the semiconductor device fabrication includes performing one or more lithographic exposures based at least indirectly on the semiconductor device design layout diagram 230.

As disclosed above, the memory device 20 of FIG. 1 includes the first memory array 22 situated above the first peripheral circuits 24 and the second memory array 26 situated above the second peripheral circuits 28. The first peripheral circuits 24 include the SAs 34 in the first end portion 36, the word line drivers 38 in the middle portion 40, and the other circuits 42 in the second end portion 44, such that the word line drivers 38 are situated in a middle portion of the first memory array footprint and the SAs 34 are situated near a boundary of the first memory array footprint. Also, the second peripheral circuits 28 include the SAs 46 in the first end portion 48, the word line drivers 50 in the middle portion 52, and the other circuits 54 in the second end portion 56, such that the word line drivers 50 are situated in a middle portion of the second memory array footprint and the SAs 46 are situated near a boundary of the second array footprint.

Figure 5:
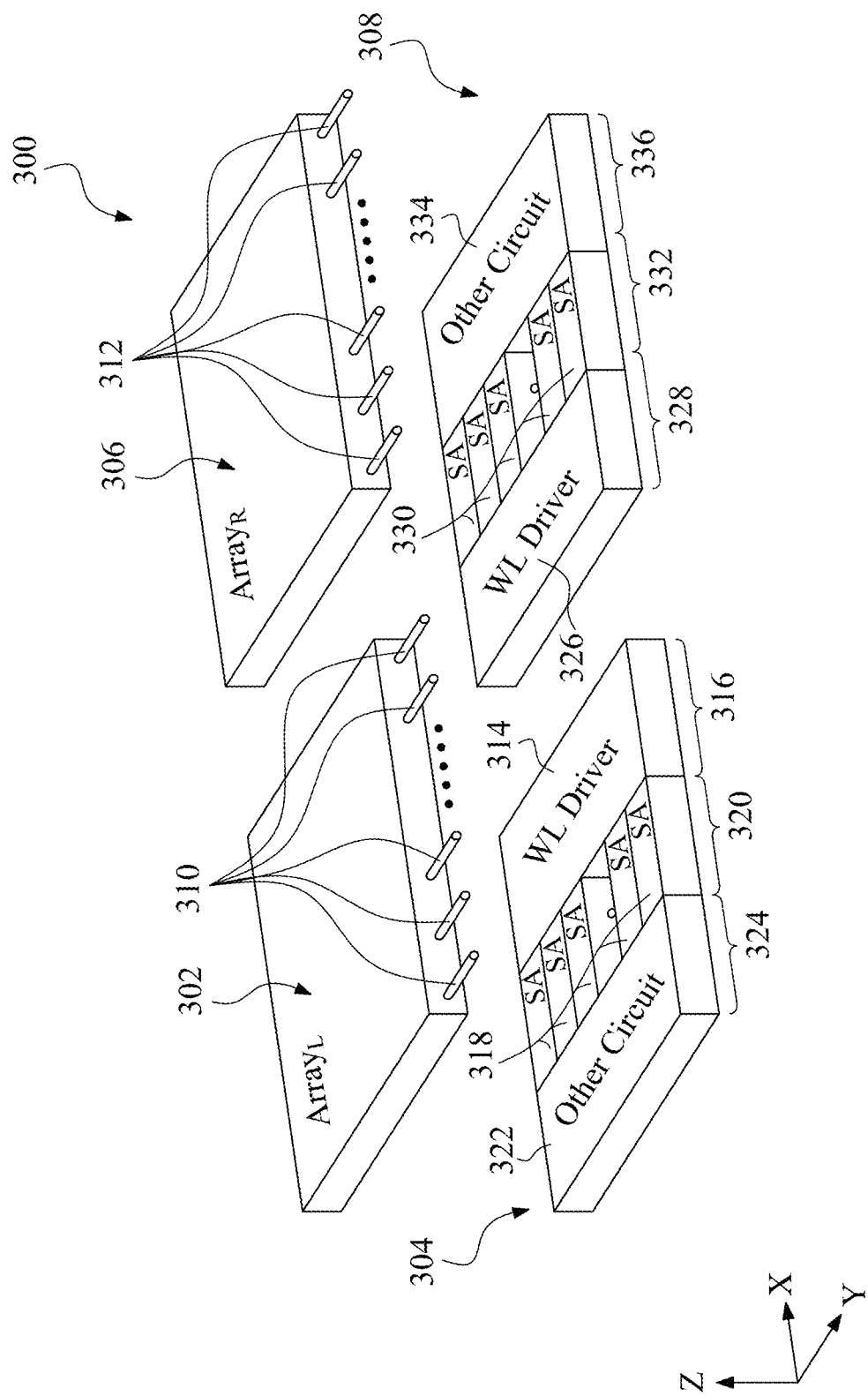
FIG. 5 is a diagram schematically illustrating a semiconductor memory device that includes a first memory array situated above first peripheral circuits and a second memory array situated above second peripheral circuits, with SAs situated in middle portions of each of the first and second memory array footprints and word line drivers situated near boundaries of each of the first and second memory array footprints, in accordance with some embodiments.

FIG. 5 is a diagram schematically illustrating a semiconductor memory device 300 that includes a first memory array 302 situated above first peripheral circuits 304 and a second memory array 306 situated above second peripheral circuits 308, with SAs situated in middle portions of each of the first and second memory array footprints and word line drivers situated near boundaries of each of the first and second memory array footprints, in accordance with some embodiments. In this respect, the memory device 300 differs from the memory device 20 of FIG. 1 where the word line drivers are situated in the middle portions of each of the first and second memory array footprints and the SAs are situated near the boundaries of each of the first and second memory array footprints.

The first memory array 302 is situated in the z-direction, along the z-axis, above the first peripheral circuits 304, and the second memory array 306 is situated in the z-direction, along the z-axis, above the second peripheral circuits 308. In some embodiments, the first memory array 302 is a BEOL memory array. In some embodiment, the second memory array 306 is a BEOL memory array. Also, in some embodiments, the first peripheral circuits 304 are FEOL peripheral circuits and, in some embodiments, the second peripheral circuits 308 are FEOL peripheral circuits.

The first memory array 302 is a DRAM memory array, and the second memory array 306 is a DRAM memory array. The first memory array 302 includes bit lines 310 that extend in the y-direction, along the y-axis, and word lines (not shown in FIG. 5) that extend in the x-direction, along the x-axis. The second memory array 306 includes bit lines 312 that extend in the y-direction, along the y-axis, and word lines (not shown in FIG. 5) that extend in the x-direction, along the x-axis. In other embodiments, the first and second memory arrays 302 and 306 can be another type of memory, such as an SRAM.

The first peripheral circuits 304 include word line drivers 314 in a first end portion 316, SAs 318 in a middle portion 320, and other circuits 322 in a second end portion 324. The first memory array 302 has an array footprint on the first peripheral circuits 304, such that the SAs 318 in the middle portion 320 are situated in a middle portion of the array footprint and the word line drivers 314 in the first end portion 316 are situated near a boundary of the array footprint. The SAs 318 are electrically connected to the bit lines 310 of the first memory array 302 and/or to the bit lines 312 of the second memory array 306 through first conductive layers or segments (not shown in FIG. 5) that extend in the z-direction, along the z-axis. In some embodiments, the first conductive layers that extend in the z-direction are MEOL layers and BEOL layers, such as metal layers and vias.

The second peripheral circuits 308 include word line drivers 326 in a first end portion 328, SAs 330 in a middle portion 332, and other circuits 334 in a second end portion 336. The second memory array 306 has an array footprint on the second peripheral circuits 308, such that the SAs 330 in the middle portion 332 are situated in a middle portion of the array footprint and the word line drivers 326 in the first end portion 328 are situated near a boundary of the array footprint. The SAs 330 are electrically connected to the bit lines 310 of the first memory array 302 and/or to the bit lines 312 of the second memory array 306 through second conductive layers or segments (not shown in FIG. 5) that extend in the z-direction, along the z-axis. In some embodiments, the second conductive layers that extend in the z-direction are MEOL layers and BEOL layers, such as metal layers and vias.

Figure 6:
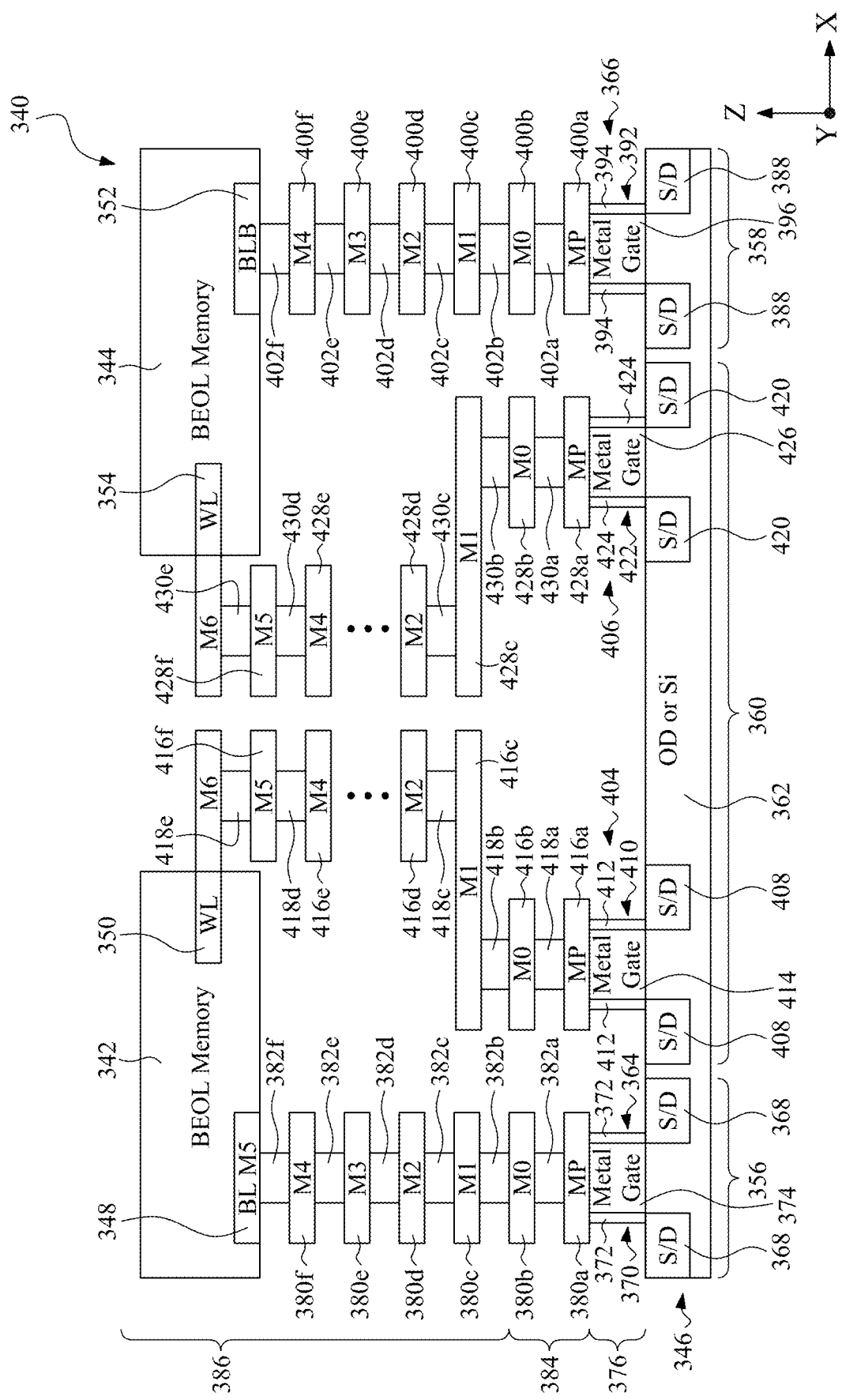
FIG. 6 is a diagram schematically illustrating a semiconductor memory device that includes a first BEOL memory array and a second BEOL memory array electrically connected to FEOL peripheral circuits that include SAs situated in or near middle portions of each of the first and second memory array footprints and word line drivers situated near boundaries of each of the first and second memory array footprints, in accordance with some embodiments.

FIG. 6 is a diagram schematically illustrating a semiconductor memory device 340 that includes a first BEOL memory array 342 and a second BEOL memory array 344 electrically connected to FEOL peripheral circuits 346 that include SAs situated in or near middle portions of each of the first and second memory array footprints and word line drivers situated near boundaries of each of the first and second memory array footprints, in accordance with some embodiments. In some embodiments, the memory device 340 is like the memory device 300 of FIG. 5. In some embodiments, the first BEOL memory array 342 is like the first memory array 302 (shown in FIG. 5) and, in some embodiments, the second BEOL memory array 344 is like the second memory array 306 (shown in FIG. 5).

The first BEOL memory array 342 is situated in the z-direction, along the z-axis, above the FEOL peripheral circuits 346, and the second BEOL memory array 344 is situated in the z-direction, along the z-axis, above the FEOL peripheral circuits 346. The first BEOL memory array 342 is a DRAM memory array, and the second BEOL memory array 344 is a DRAM memory array. The first BEOL memory array 342 includes bit lines, such as first bit line BL 348, that extend in the y-direction, along the y-axis, and word lines, such as first word line WL 350, that extend in the x-direction, along the x-axis. The second BEOL memory array 344 includes bit lines, such as second bit line BLB 352, that extend in the y-direction, along the y-axis, and word lines, such as second word line WL 354, that extend in the x-direction, along the x-axis. In other embodiments, the first and second BEOL memory arrays 342 and 344 can be another type of memory, such as an SRAM.

The FEOL peripheral circuits 346 include a first SA region 356 situated at one end of the peripheral circuits 346, a second SA region 358 situated at another end of the peripheral circuits 346, and a word line driver region 360 that is situated between the first SA region 356 and the second SA region 358. The peripheral circuits 346 include components, such as transistors, disposed in a substrate/well region 362. The substrate/well region 362 can include active areas, such as oxide diffusion (OD) areas or silicon substrate/well areas. In some embodiments, the first SA region 356 is part of the SAs 318 (shown in FIG. 5) and the second SA region 358 is part of the SAs 330 (shown in FIG. 5). In some embodiments, the word line driver region 360 is part of the word line drivers 314 and 326 (shown in FIG. 5).

The first SA region 356 includes a first transistor 364 that is part of a SA situated below the first BEOL memory array 342 and the second SA region 358 includes a second transistor 366 that is part of a SA situated below the second BEOL memory array 344. The first transistor 364 is electrically connected to the first bit line BL 348 of the first BEOL memory array 342 and the second transistor 366 is electrically connected to the second bit line BLB 352 of the second BEOL memory array 344.

The first transistor 364 includes S/D regions 368 situated in the substrate/well region 362 and a first gate structure 370 situated above the channel of the first transistor 364. The first gate structure 370 includes isolation regions 372 and a metal gate portion 374 where, in some embodiments, the first gate structure 370 includes a polysilicon layer disposed over the metal gate portion 374. The first gate structure 370, including the isolation regions 372 and the metal gate portion 374, is manufactured in a FEOL process 376 that, in some embodiments, includes disposing the S/D regions 368 in the substrate/well region 362.

The first gate structure 370 is electrically connected to the first bit line BL 348 of the first memory array 342 through a conductive path that extends in the z-direction, along the z-axis. The conductive path includes a plurality of conductive segments 380a-380f and 382a-382f that are manufactured during a MEOL process 384 and a BEOL process 386. Also, the first and second BEOL memory arrays 342 and 344 are manufactured during the BEOL process 386. In the MEOL process 384, an MP layer 380a is disposed on the first gate structure 370, a first via 382a is disposed on the MP layer 380a, and a first metal layer M0 380b is disposed on the first via 382a. In the BEOL process 386, a second via 382b is disposed on the first metal layer M0 380b, a second metal layer M1 380c is disposed on the second via 382b, a third via 382c is disposed on the second metal layer M1 380c, a third metal layer M2 380d is disposed on the third via 382c, a fourth via 382d is disposed on the third metal layer M2 380d, a fourth metal layer M3 380e is disposed on the fourth via 382d, a fifth via 382e is disposed on the fourth metal layer M3 380e, a fifth metal layer M4 380f is disposed on the fifth via 382e, and a sixth via 382f is disposed on the fifth metal layer M4 380f and electrically connected to the first bit line BL 348, which is a sixth metal layer M5. In some embodiments, the MP layer 380a, the second metal layer M1 380c, the fourth metal layer M3 380e, and the first bit line BL 348 extend in the y-direction, along the y-axis. In some embodiments, the first metal layer M0 380b, the third metal layer M2 380d, and the fifth metal layer M4 380f extend in the x-direction, along the x-axis.

The second transistor 366 includes S/D regions 388 situated in the substrate/well region 362 and a second gate structure 392 situated above the channel of the second transistor 366. The second gate structure 392 includes isolation regions 394 and a metal gate portion 396 where, in some embodiments, the second gate structure 392 includes a polysilicon layer disposed over the metal gate portion 396. The second gate structure 392, including the isolation regions 394 and the metal gate portion 396, is manufactured in the FEOL process 376 that, in some embodiments, includes disposing the S/D regions 388 in the substrate/well region 362.

The second gate structure 392 is electrically connected to the second bit line BLB 352 of the second memory array 344 through a conductive path that extends in the z-direction, along the z-axis. The conductive path includes a plurality of conductive segments 400a-400f and 402a-402f that are manufactured during the MEOL process 384 and the BEOL process 386. In the MEOL process 384, an MP layer 400a is disposed on the second gate structure 392, a first via 402a is disposed on the MP layer 400a, and a first metal layer M0 400b is disposed on the first via 402a. In the BEOL process 386, a second via 402b is disposed on the first metal layer M0 400b, a second metal layer M1 400c is disposed on the second via 402b, a third via 402c is disposed on the second metal layer M1 400c, a third metal layer M2 400d is disposed on the third via 402c, a fourth via 402d is disposed on the third metal layer M2 400d, a fourth metal layer M3 400e is disposed on the fourth via 402d, a fifth via 402e is disposed on the fourth metal layer M3 400e, a fifth metal layer M4 400f is disposed on the fifth via 402e, and a sixth via 402f is disposed on the fifth metal layer M4 400f and electrically connected to the second bit line BLB 352, which is a sixth metal layer M5. In some embodiments, the MP layer 400a, the second metal layer M1 400c, the fourth metal layer M3 400e, and the second bit line BLB 352 extend in the y-direction, along the y-axis. In some embodiments, the first metal layer M0 400b, the third metal layer M2 400d, and the fifth metal layer M4 400f extend in the x-direction, along the x-axis.

The word line driver region 360 includes a third transistor 404 that is part of a word line driver situated below the first BEOL memory array 342 and a fourth transistor 406 that is part of a word line driver situated below the second BEOL memory array 344. The third transistor 404 is electrically connected to the first word line WL 350 of the first BEOL memory array 342 and the fourth transistor 406 is electrically connected to the second word line WL 354 of the second BEOL memory array 344.

The third transistor 404 includes S/D regions 408 that are situated in the substrate/well region 362 and a third gate structure 410 that is situated above the channel of the third transistor 404. The third gate structure 410 includes isolation regions 412 and a metal gate portion 414 where, in some embodiments, the third gate structure 410 includes a polysilicon layer disposed over the metal gate portion 414. The third gate structure 410, including the isolation regions 412 and the metal gate portion 414, is manufactured in the FEOL process 376 that, in some embodiments, includes disposing the S/D regions 408 in the substrate/well region 362.

The third gate structure 410 is electrically connected to the first word line WL 350 of the first memory array 342 through a conductive path that generally extends in the z-direction, along the z-axis. The conductive path includes a plurality of conductive segments 416a-416f and 418a-418e that are manufactured during the MEOL process 384 and the BEOL process 386. In the MEOL process 384, an MP layer 416a is disposed on the third gate structure 410, a first via 418a is disposed on the MP layer 416a, and a first metal layer M0 416b is disposed on the first via 418a. In the BEOL process 386, a second via 418b is disposed on the first metal layer M0 416b, a second metal layer M1 416c is disposed on the second via 418b, a third via 418c is disposed on the second metal layer M1 416c, and a third metal layer M2 416d is disposed on the third via 418c. This continues up to a fourth via 418d disposed on a fifth metal layer M4 416e, a sixth metal layer M5 416f disposed on the fourth via 418d, and a fifth via 418e disposed on the sixth metal layer M5 416f and electrically connected to the first word line WL 350, which is a seventh metal layer M6. In some embodiments, the MP layer 416a, the second metal layer M1 416c, the fourth metal layer M3 (not shown), and the sixth metal layer M5 416f extend in the y-direction, along the y-axis. In some embodiments, the first metal layer M0 416b, the third metal layer M2 416d, the fifth metal layer M4 416e, and the first word line WL 350 extend in the x-direction, along the x-axis.

The fourth transistor 406 includes S/D regions 420 situated in the substrate/well region 362 and a fourth gate structure 422 that is situated above the channel of the fourth transistor 406. The fourth gate structure 422 includes isolation regions 424 and a metal gate portion 426 where, in some embodiments, the fourth gate structure 422 includes a polysilicon layer disposed over the metal gate portion 426. The fourth gate structure 422, including the isolation regions 424 and the metal gate portion 426, is manufactured in the FEOL process 376 that, in some embodiments, includes disposing the S/D regions 420 in the substrate/well region 362.

The fourth gate structure 422 is electrically connected to the second word line WL 354 of the second memory array 344 through a conductive path that extends generally in the z-direction, along the z-axis. The conductive path includes a plurality of conductive segments 428a-428f and 430a-430e that are manufactured during the MEOL process 384 and the BEOL process 386. In the MEOL process 384, an MP layer 428a is disposed on the fourth gate structure 422, a first via 430a is disposed on the MP layer 428a, and a first metal layer M0 428b is disposed on the first via 430a. In the BEOL process 386, a second via 430b is disposed on the first metal layer M0 428b, a second metal layer M1 428c is disposed on the second via 430b, a third via 430c is disposed on the second metal layer M1 428c, and a third metal layer M2 428d is disposed on the third via 430c. This continues up to a fourth via 430d disposed on a fifth metal layer M4 428e, a sixth metal layer M5 428f disposed on the fourth via 430d, and a fifth via 430e disposed on the sixth metal layer M5 428f and electrically connected to the second word line WL 354, which is a seventh metal layer M6. In some embodiments, the MP layer 428a, the second metal layer M1 428c, the fourth metal layer M3 (not shown), and the sixth metal layer M5 428f extend in the y-direction, along the y-axis. In some embodiments, the first metal layer M0 428b, the third metal layer M2 428d, the fifth metal layer M4 428e, and the second word line WL 354 extend in the x-direction, along the x-axis.

The memory device 340 includes the first BEOL memory array 342 and the second BEOL memory array 344 situated above the FEOL peripheral circuits 346 and conductive paths that extend in the z-direction, along the z-axis, between the peripheral circuits 346 and the BEOL memory arrays 342 and 344. This architecture reduces the area occupied by the BEOL memory arrays 342 and 344 and the FEOL peripheral circuits 346 in the memory device 340, as compared to devices that have peripheral circuits situated adjacent the memory arrays and on a same plane of the memory device as the memory arrays and that have the peripheral circuits connected to the adjacent memory arrays through metal routing channels that generally extend in the same plane, along the x-axis and/or the y-axis. Advantages of the memory device 340 include reducing the size of the memory device 340 by reducing the area occupied by the BEOL memory arrays 342 and 344 and peripheral circuits 346 on the semiconductor device, which is also part of reducing the cost of the memory device 340. Further advantages include increasing area efficiency and providing a higher memory cell density.

Figure 7:
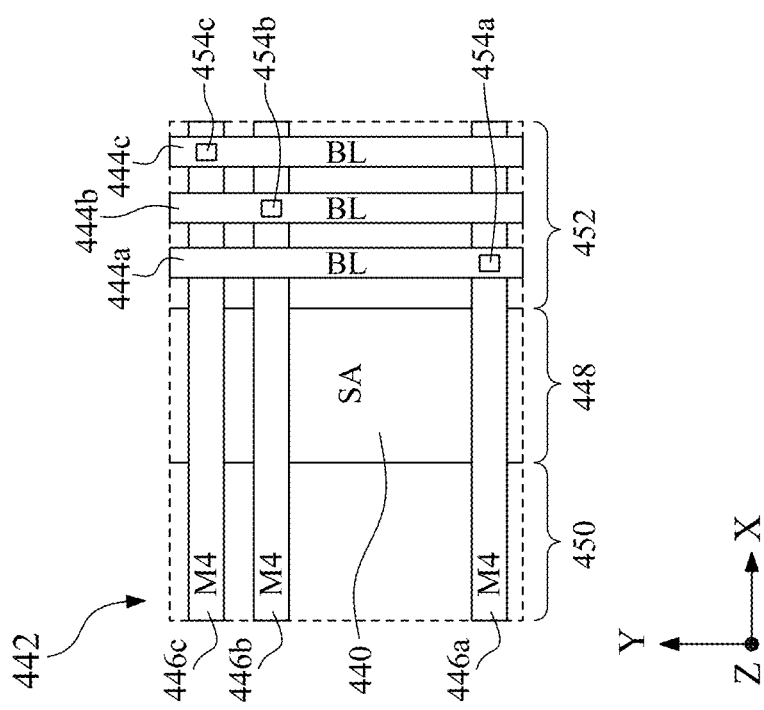
FIG. 7 is a diagram schematically illustrating SAs in a footprint of a memory array, in accordance with some embodiments.

FIG. 7 is a diagram schematically illustrating SAs 440 in a footprint 442 of a memory array that is situated above the footprint 442, in accordance with some embodiments. The SAs 440 are electrically connected to bit lines BL 444a-444c of the memory array through fifth metal layer M4 lines 446a-446c. In some embodiments, the memory array is like the first memory array 302 (shown in FIG. 5). In some embodiments, the SAs 440 are like the SAs 318 (shown in FIG. 5). In some embodiments, the memory array is like the second memory array 306 (shown in FIG. 5). In some embodiments, the SAs 440 are like the SAs 330 (shown in FIG. 5). In some embodiments, the memory array is like the first BEOL memory array 342 (shown in FIG. 6). In some embodiments, the memory array is like the second BEOL memory array 344 (shown in FIG. 6).

The footprint 442 includes a middle portion 448 situated between two end portions 450 and 452 of the footprint 442. The SAs 440 are in the middle portion 448 of the footprint 442. In some embodiments, peripheral circuits such as word line drivers and/or other circuits are in the end portions 450 and 452, on each side of the middle portion 448.

The bit lines BL 444a-444c are sixth metal layer M5 lines that extend in the y-direction, along the y-axis. The bit lines BL 444a-444c are electrically connected to the fifth metal layer M4 lines 446a-446c that extend in the x-direction, along the x-axis, through vias 454a-454c, respectively. In some embodiments, the bit lines BL 444a-444c are like the bit lines 310 and/or 312 (shown in FIG. 5). In some embodiments, each of the bit lines BL 444a-444c is like the first bit line BL 348 and/or the second bit line BLB 352 (shown in FIG. 6). In some embodiments, each of the fifth metal layer M4 lines 446a-446c is like the fifth metal layer M4 380f and/or the fifth metal layer M4 400f (shown in FIG. 6) and each of the vias 454a-454c is like the sixth via 382f and/or the sixth via 402f (shown in FIG. 6).

Figure 8:
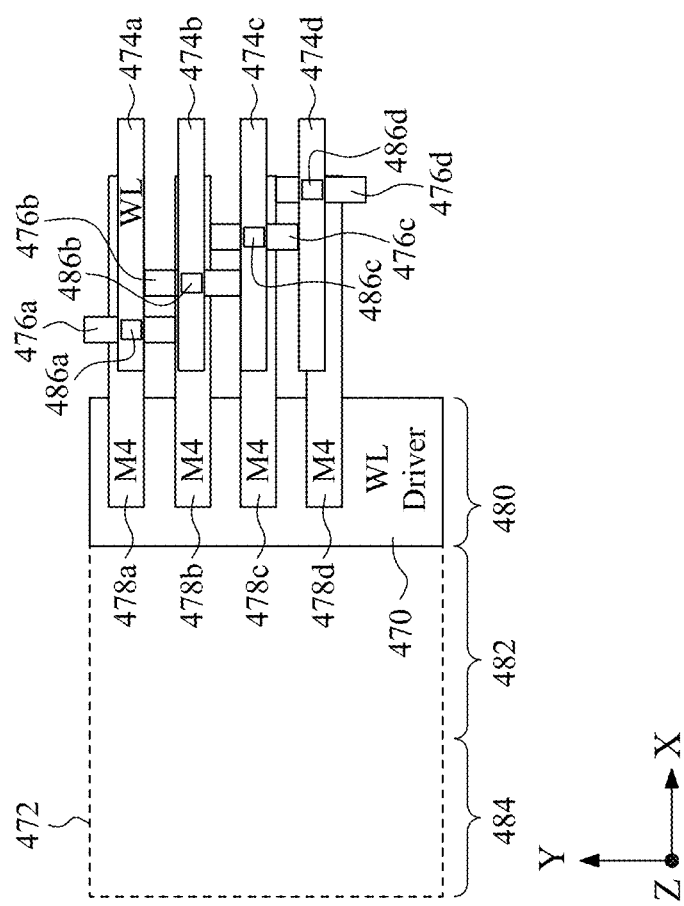
FIG. 8 is a diagram schematically illustrating word line drivers in a footprint of a memory array, in accordance with some embodiments.

FIG. 8 is a diagram schematically illustrating word line drivers 470 in a footprint 472 of a memory array that is situated above the footprint 472, in accordance with some embodiments. The word line drivers 470 are electrically connected to word lines WL 474a-474d of the memory array through sixth metal layer M5 lines 476a-476d and fifth metal layer M4 lines 478a-478d. In some embodiments, the memory array is like the first memory array 302 (shown in FIG. 5). In some embodiments, the word line drivers 470 are like the word line drivers 314 (shown in FIG. 5). In some embodiments, the memory array is like the second memory array 306 (shown in FIG. 5). In some embodiments, the word line drivers 470 are like the word line drivers 326 (shown in FIG. 5). In some embodiments, the memory array is like the first BEOL memory array 342 (shown in FIG. 6). In some embodiments, the memory array is like the second BEOL memory array 344 (shown in FIG. 6).

The footprint 472 includes a first end portion 480, a middle portion 482, and a second end portion 484. The word line drivers 470 are in the first end portion 480 of the footprint 472. In some embodiments, peripheral circuits such as SAs and/or other circuits are in the middle portion 482 and the second end portion 484.

The word lines WL 474a-474d are seventh metal layer M6 lines that extend in the x-direction, along the x-axis. The word lines WL 474a-474d are electrically connected to the sixth metal layer M5 lines 476a-476d that extend in the y-direction, along the y-axis, and to the fifth metal layer M4 lines 478a-478d that extend in the x-direction, along the x-axis, through vias 486a-486d, respectively. In some embodiments, each of the word lines WL 474a-474d is like the first word line WL 350 and/or the second word line WL 354 (shown in FIG. 6). In some embodiments, each of the sixth metal layer M5 lines 476a-476d is like the sixth metal layer M5 416f and/or the sixth metal layer M5 428f. In some embodiments, each of the fifth metal layer M4 lines 478a-478d is like the fifth metal layer M4 416e and/or the fifth metal layer M4 428e (shown in FIG. 6) and each of the vias 486a-486d is like the vias 418d and 418e and/or the vias 430d and 430e (shown in FIG. 6).

Figure 9:
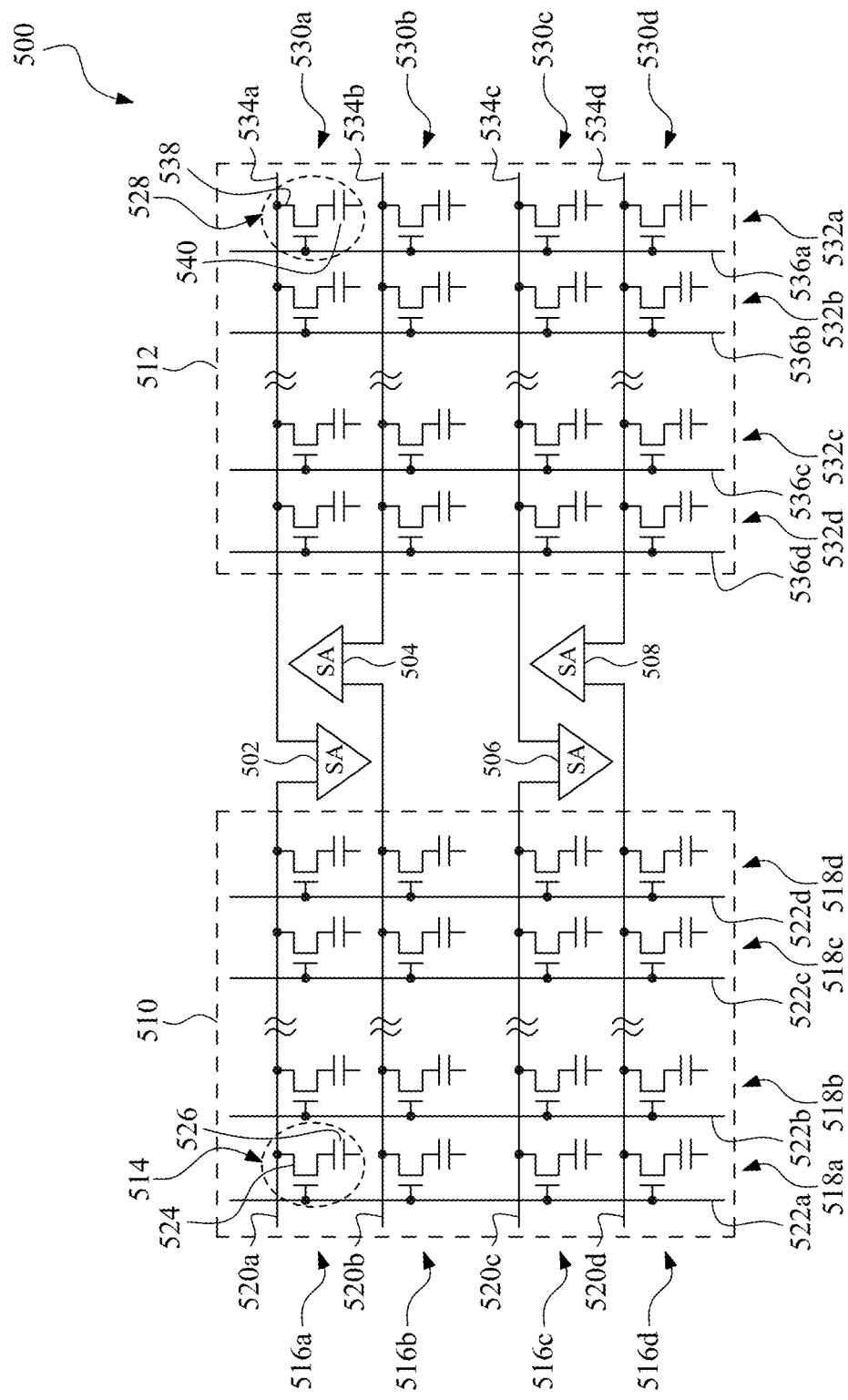
FIG. 9 is a diagram schematically illustrating a memory device that includes SAs, a first memory array, and a second memory array, in accordance with some embodiments.

FIG. 9 is a diagram schematically illustrating a memory device 500 that includes SAs 502, 504, 506, and 508, a first memory array 510, and a second memory array 512, in accordance with some embodiments. Each of the SAs 502, 504, 506, and 508 is electrically connected to the first memory array 510 and to the second memory array 512. In some embodiments, the memory device 500 is like the memory device 20 of FIG. 1. In some embodiments, the memory device 500 is like the memory device 300 of FIG. 5.

The first memory array 510 is a DRAM array that includes memory cells 514 in rows 516a-516d and columns 518a-518d. In some embodiments, the memory array 510 is like one of the memory arrays 22 and 26 of FIG. 1. In some embodiments, the memory array 510 is like one of the memory arrays 302 and 306 of FIG. 5. The rows 516a-516d include bit lines 520a-520d, respectively, and the columns 518a-518d include word lines 522a-522d, respectively. Also, each of the memory cells 514 is a one transistor one capacitor (1T1C) memory cell that includes one transistor 524 and a corresponding capacitor 526.

Each of the bit lines 520a-520d is electrically connected to an S/D region of each transistor 524 of the 1T1C memory cells in its row. The other S/D region of the transistor 524 is electrically connected to one side of the corresponding capacitor 526 of the 1T1C memory cells, and the other side of the capacitor 526 is electrically coupled to a reference voltage. Also, each of the word lines 522a-522d is electrically connected to a gate of each transistor 524 in its column of the columns 518a-518d.

The second memory array 512 is a DRAM array that includes memory cells 528 in rows 530a-530d and columns 532a-532d. In some embodiments, the memory array 512 is like one of the memory arrays 22 and 26 of FIG. 1. In some embodiments, the memory array 512 is like one of the memory arrays 302 and 306 of FIG. 5. The rows 530a-530d include bit lines 534a-534d, respectively, and the columns 532a-532d include word lines 536a-536d, respectively. Also, each of the memory cells 528 is a one transistor one capacitor (1T1C) memory cell that includes one transistor 538 and a corresponding capacitor 540.

Each of the bit lines 534a-534d is electrically connected to an S/D region of each transistor 538 of the 1T1C memory cells in its row. The other S/D region of the transistor 538 is electrically connected to one side of the corresponding capacitor 540 of the 1T1C memory cells, and the other side of the capacitor 540 is electrically coupled to a reference voltage. Also, each of the word lines 536a-536d is electrically connected to a gate of each transistor 538 in its column of the columns 532a-532d.

The SA 502 includes one input electrically coupled to the bit line 520a of the first memory array 510 and another input electrically coupled to the bit line 534a of the second memory array 512. The SA 502 is electrically coupled to the bit lines 520a and 534a through conductive paths that extend generally in the z-direction, along the z-axis, between the SA 502 and the first and second memory arrays 510 and 512. In some embodiments, the sense amplifier 502 is like a sense amplifier of the sense amplifiers 34 and 46 of FIG. 1. In some embodiments, the sense amplifier 502 is like a sense amplifier of the sense amplifiers 318 and 330 of FIG. 5. In some embodiments, the SA 502 is electrically connected to the bit lines like the SA region 80 (shown in FIG. 2) is electrically connected to bit lines. In some embodiments, the SA 502 is electrically connected to the bit lines like the SA regions 356 and 358 (shown in FIG. 6) are electrically connected to bit lines.

The SA 504 includes one input electrically coupled to the bit line 520b of the first memory array 510 and another input electrically coupled to the bit line 534b of the second memory array 512. The SA 504 is electrically coupled to the bit lines 520b and 534b through conductive paths that extend generally in the z-direction, along the z-axis, between the SA 504 and the first and second memory arrays 510 and 512. In some embodiments, the sense amplifier 504 is like a sense amplifier of the sense amplifiers 34 and 46 of FIG. 1. In some embodiments, the sense amplifier 504 is like a sense amplifier of the sense amplifiers 318 and 330 of FIG. 5. In some embodiments, the SA 504 is electrically connected to the bit lines like the SA region 80 (shown in FIG. 2) is electrically connected to bit lines. In some embodiments, the SA 504 is electrically connected to the bit lines like the SA regions 356 and 358 (shown in FIG. 6) are electrically connected to bit lines.

The SA 506 includes one input electrically coupled to the bit line 520c of the first memory array 510 and another input electrically coupled to the bit line 534c of the second memory array 512. The SA 506 is electrically coupled to the bit lines 520c and 534c through conductive paths that extend generally in the z-direction, along the z-axis, between the SA 506 and the first and second memory arrays 510 and 512. In some embodiments, the sense amplifier 506 is like a sense amplifier of the sense amplifiers 34 and 46 of FIG. 1. In some embodiments, the sense amplifier 506 is like a sense amplifier of the sense amplifiers 318 and 330 of FIG. 5. In some embodiments, the SA 506 is electrically connected to the bit lines like the SA region 80 (shown in FIG. 2) is electrically connected to bit lines. In some embodiments, the SA 506 is electrically connected to the bit lines like the SA regions 356 and 358 (shown in FIG. 6) are electrically connected to bit lines.

The SA 508 includes one input electrically coupled to the bit line 520d of the first memory array 510 and another input electrically coupled to the bit line 534d of the second memory array 512. The SA 508 is electrically coupled to the bit lines 520d and 534d through conductive paths that extend generally in the z-direction, along the z-axis, between the SA 508 and the first and second memory arrays 510 and 512. In some embodiments, the sense amplifier 508 is like a sense amplifier of the sense amplifiers 34 and 46 of FIG. 1. In some embodiments, the sense amplifier 508 is like a sense amplifier of the sense amplifiers 318 and 330 of FIG. 5. In some embodiments, the SA 508 is electrically connected to the bit lines like the SA region 80 (shown in FIG. 2) is electrically connected to bit lines. In some embodiments, the SA 508 is electrically connected to the bit lines like the SA regions 356 and 358 (shown in FIG. 6) are electrically connected to bit lines.

In operation, to read data from the memory device 500, one of the word lines 522a-522d is activated in the first memory array 510 and one of the word lines 536a-536d is activated in the second memory array 512. The SAs 502, 504, 506, and 508 receive data from the selected memory cells 514 and 528 and provide corresponding outputs. In some embodiments, the data from the first memory array 510 is bit line BL data and the data from the second memory array 512 is opposing bit line bar BLB data.

To write data into the memory device 500, one of the word lines 522a-522d is activated in the first memory array 510 and/or one of the word lines 536a-536d is activated in the second memory array 512. Write voltages are applied to the bit lines 520a-520d and/or 534a-534d to charge or discharge the selected capacitors 526 and/or 540.

By positioning the SAs 502, 504, 506, and 508 below the first and second memory arrays 510 and 512 as disclosed in FIGS. 1 and 5 and as disclosed throughout the application and by providing conductive paths in the z-direction between the SAs 502, 504, 506, and 508 and the first and second memory arrays 510 and 512 as disclosed in FIGS. 2 and 6 and as disclosed throughout the application, more SAs can be connected to the first and second memory arrays 510 and 512 without increasing the area of the memory device 500. This is as compared to having the SAs, the memory arrays, and the conductive paths on the same plane of the semiconductor device.

Figure 10:
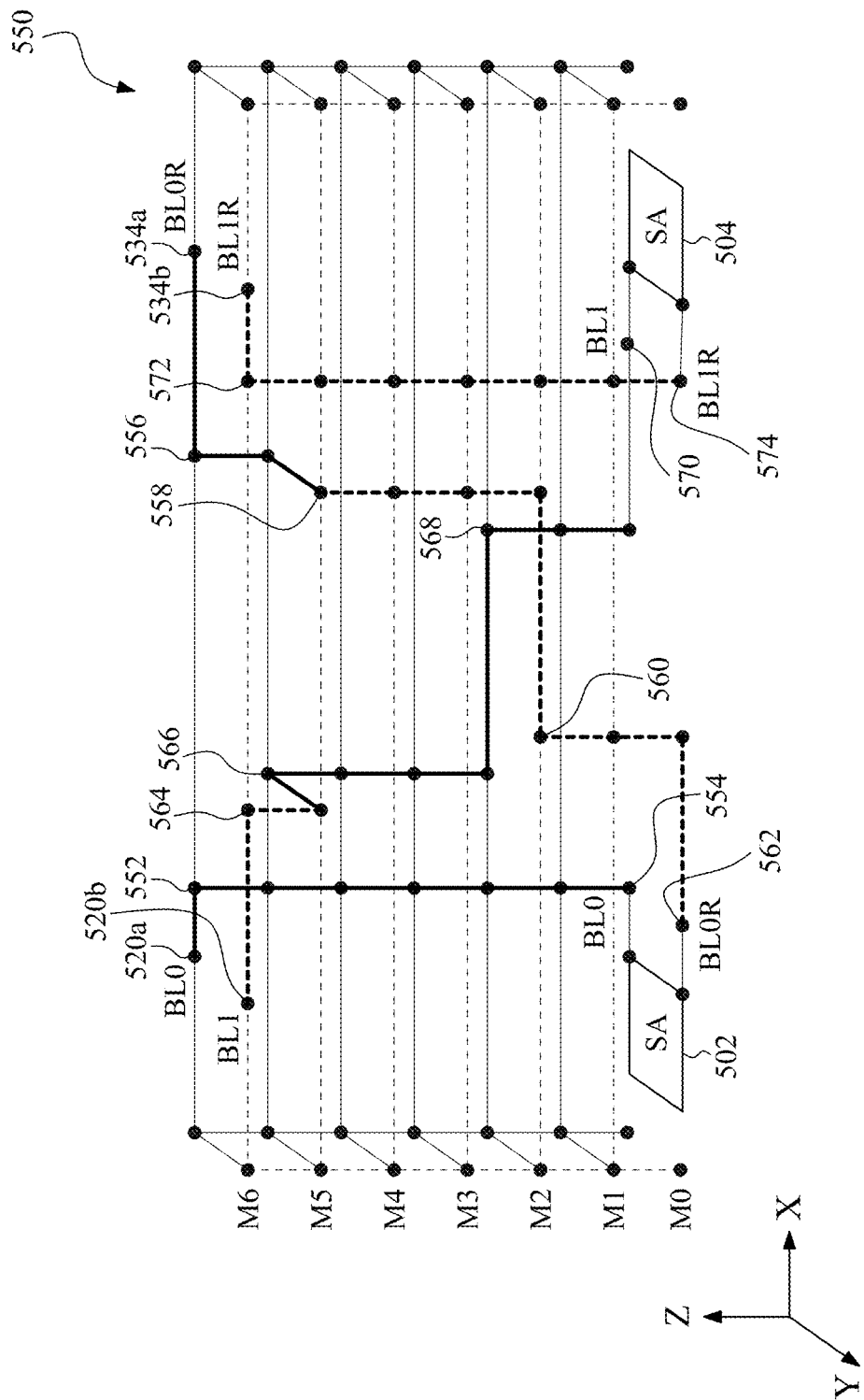
FIG. 10 is a diagram schematically illustrating conductive paths that extend in the z-direction from the bit lines of the first memory array and from the bit lines of the second memory array to the SAs, in accordance with some embodiments.

FIG. 10 is a diagram schematically illustrating conductive paths 550 in a layer layout diagram of the memory device 500 of FIG. 9, which extend in the z-direction from the bit lines 520a and 520b of the first memory array 510 and from the bit lines 534a and 534b of the second memory array 512 to the SAs 502 and 504 (shown in FIG. 9), in accordance with some embodiments. The bit line 520a of the first memory array 510 is bit line BL0 and the bit line 520b of the first memory array 510 is bit line BL1. Also, the bit line 534a of the second memory array 512 is bit line BL0R and the bit line 534b of the second memory array 512 is bit line BL1R.

The SA 502 is situated under the first memory array 510 and electrically connected to the bit line BL0 520a of the first memory array 510 and to the bit line BL0R 534a of the second memory array 512. The bit line BL0 520a is a seventh metal layer M6 that extends in the x-direction to a via 552. The conductive path extends down through the via 552 to the sixth metal layer M5 and through other vias to the fifth metal layer M4, the fourth metal layer M3, the third metal layer M2, the second metal layer M1, and the first metal layer M0 to an input 554 of the SA 502. The bit line BL0R 534a is a seventh metal layer M6 that extends in the x-direction to a via 556. The conductive path extends through the via 556 to the sixth metal layer M5 that extends in the y-direction to another via 558. The conductive path extends through the via 558 to the fifth metal layer M4 and through other vias to the fourth metal layer M3 and the third metal layer M2 that extends in the x-direction to another via 560. The conductive path continues through the via 560 down to the second metal layer M1 and through another via down to the first metal layer M0 that extends in the x-direction to be connected to another input 562 of the SA 502.

The SA 504 is situated under the second memory array 512 and electrically connected to the bit line BL1 520b of the first memory array 510 and to the bit line BL1R 534b of the second memory array 512. The bit line BL1 520b is a seventh metal layer M6 that extends in the x-direction to a via 564. The conductive path extends through the via 564 to the sixth metal layer M5 that extends in the y-direction to another via 566. The conductive path extends through the via 566 to the fifth metal layer M4 and through other vias to the fourth metal layer M3 and the third metal layer M2 that extends in the x-direction to another via 568. The conductive path continues through the via 568 down to the second metal layer M1 and through another via down to the first metal layer M0 that extends in the x-direction to be connected to an input 570 of the SA 504. The bit line BL1R 534b is a seventh metal layer M6 that extends in the x-direction to a via 572. The conductive path extends down through the via 572 to the sixth metal layer M5 and through other vias to the fifth metal layer M4, the fourth metal layer M3, the third metal layer M2, the second metal layer M1, and the first metal layer M0 to another input 574 of the SA 504.

By positioning the SAs 502 and 504 below the first memory array 510 and the second memory array 512, respectively, and by providing conductive paths 550 in the z-direction between the SAs 502 and 504 and the first and second memory arrays 510 and 512, more SAs can be connected to the first and second memory arrays 510 and 512 without increasing the area of the memory device 500. This is as compared to having the SAs, the memory arrays, and the conductive paths on the same plane of the semiconductor device.

Figure 11:
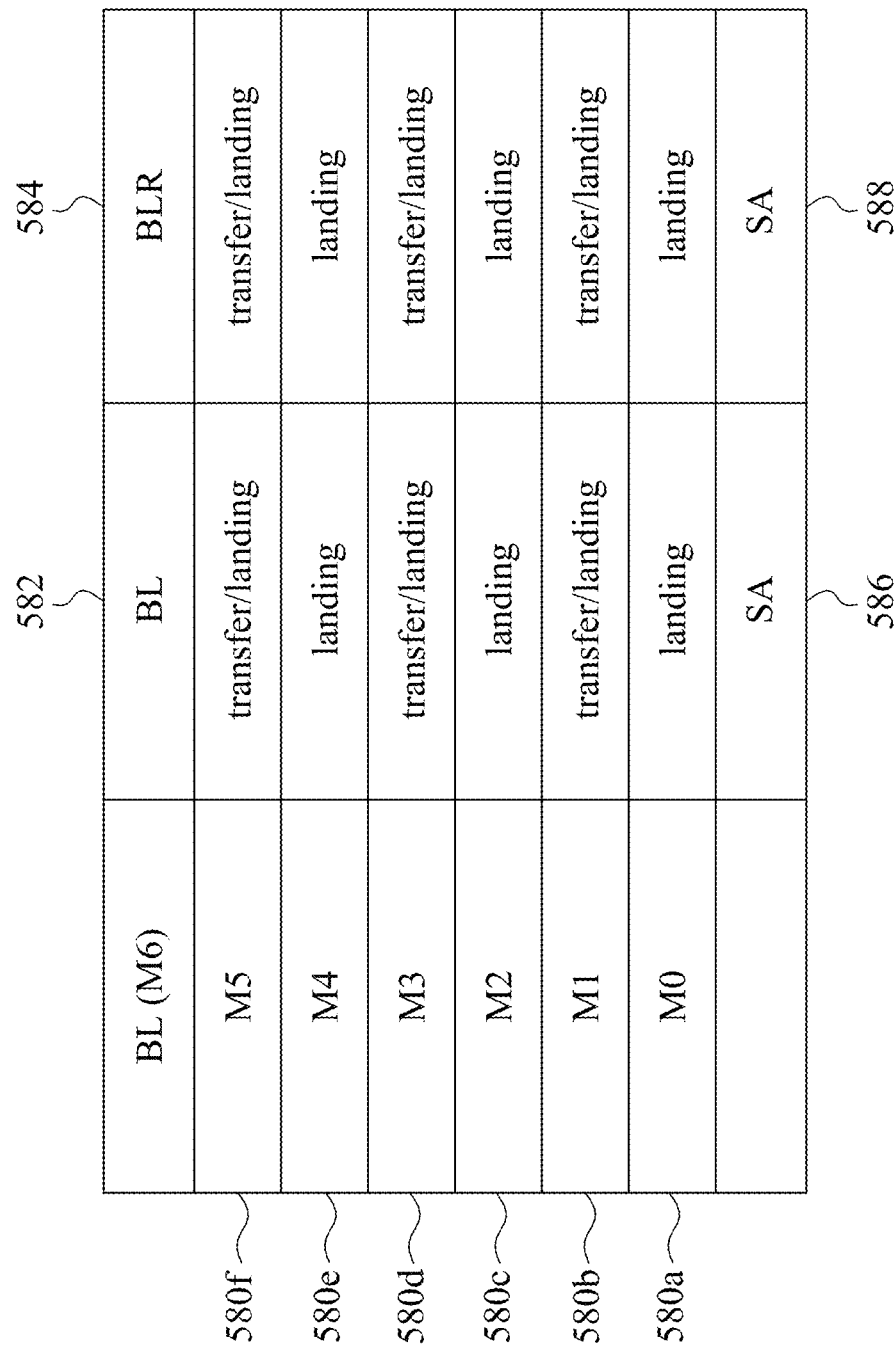
FIG. 11 is a diagram schematically illustrating transfer and landing characteristics for metal layers in conductive paths that extend in the z-direction from bit lines to SAs, in accordance with some embodiments.

FIG. 11 is a diagram schematically illustrating transfer and landing characteristics for metal layers M0-M5 580a-580f, such as the metal layers M0-M5 (shown in FIG. 10), in conductive paths that extend in the z-direction from the bit lines BL 582 and BLR 584 to SAs 586 and 588, in accordance with some embodiments. In this example, the bit line BL 582 and the bit line BLR 584 are at the seventh metal layer M6 that can be extended in the x-direction. In some embodiments, the bit lines BL 582 and BLR 584 are like the bit lines 520a-520d of the first memory array 510 and the bit lines 534a-534d of the second memory array 512 that extend to the SAs 502, 504, 506, and 508 (shown in FIG. 9).

The fifth metal layer M4 580e, the third metal layer M2 580c, and the first metal layer M0 580a can be extended in the x-direction and are used as landings, where the landings are used to continue the conductive path from one layer to another layer without transferring the conductive path in the y-direction. The sixth metal layer M5 580f, the fourth metal layer M3 580d, and the second metal layer M1 580b can be extended in the y-direction, such that these can be used as a landing and/or to transfer the conductive path in the y-direction. Thus, the bit line BL 582 and the bit line BLR 584 can be transferred in the y-direction through one or more of the sixth metal layer M5 580f, the fourth metal layer M3 580d, and the second metal layer M1 580b. Also, two different bit lines BL 582 and BLR 584 can be transferred in the y-direction through the same metal layer or through different metal layers of the sixth metal layer M5 580f, the fourth metal layer M3 580d, and the second metal layer M1 580b.

Figure 12:
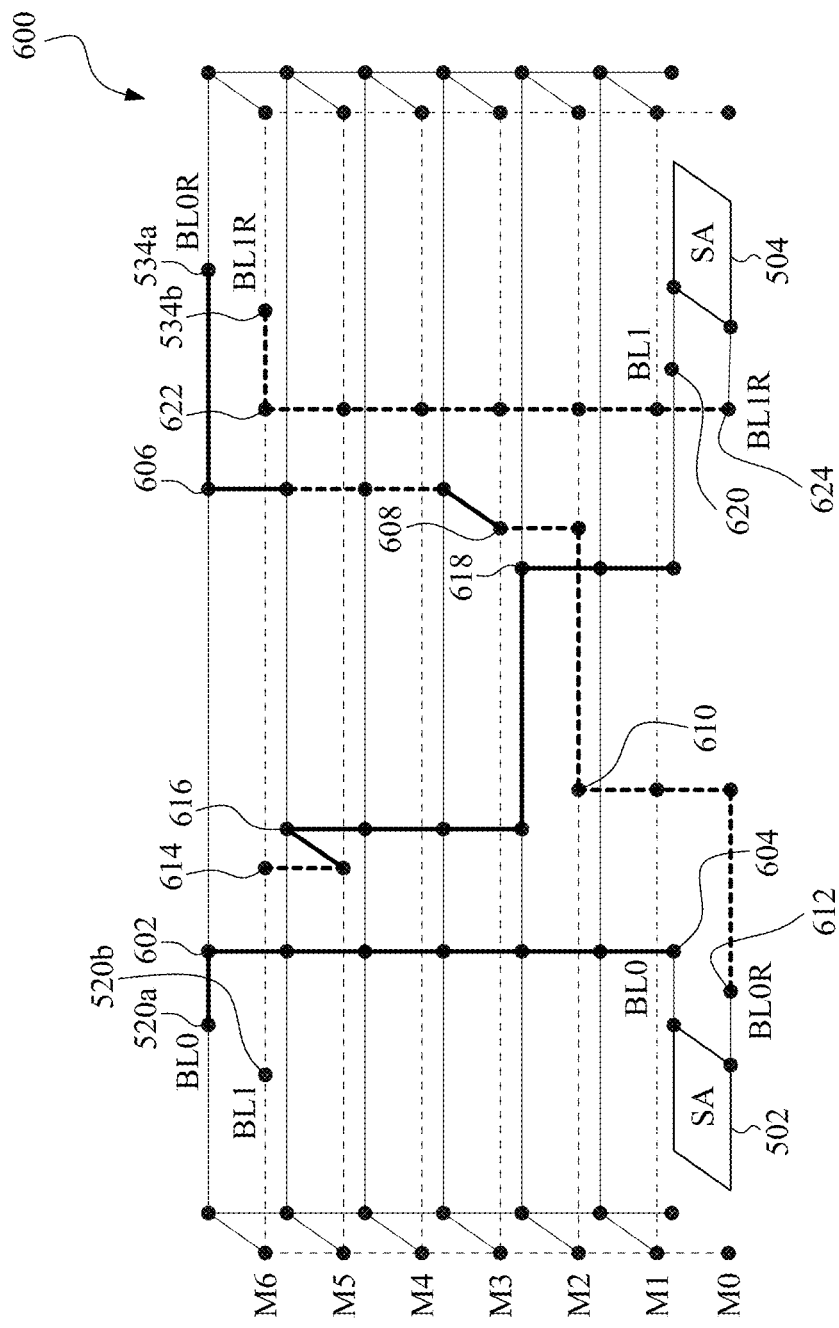
FIG. 12 is a diagram schematically illustrating another example of conductive paths that extend in the z-direction from bit lines of the first memory array and from bit lines of the second memory array to the SAs, in accordance with some embodiments.

FIG. 12 is a diagram schematically illustrating another example of conductive paths 600 in a layer layout diagram of the memory device 500 of FIG. 9, which extend in the z-direction from the bit lines 520a and 520b of the first memory array 510 and from the bit lines 534a and 534b of the second memory array 512 to the SAs 502 and 504

(shown in FIG. 9), in accordance with some embodiments. The bit line 520a of the first memory array 510 is bit line BL0 and the bit line 520b of the first memory array 510 is bit line BL1. Also, the bit line 534a of the second memory array 512 is bit line BL0R and the bit line 534b of the second memory array 512 is bit line BL1R.

The SA 502 is situated under the first memory array 510 and electrically connected to the bit line BL0 520a of the first memory array 510 and to the bit line BL0R 534a of the second memory array 512. The bit line BL0 520a is a seventh metal layer M6 that extends in the x-direction to a via 602. The conductive path extends down through the via 602 to the sixth metal layer M5 and through other vias to the fifth metal layer M4, the fourth metal layer M3, the third metal layer M2, the second metal layer M1, and the first metal layer M0 to an input 604 of the SA 502. The bit line BL0R 534a is a seventh metal layer M6 that extends in the x-direction to a via 606. The conductive path extends through the via 606 to the sixth metal layer M5 and through other vias to the fifth metal layer M4 and the fourth metal layer M3 that extends in the y-direction to a via 608. The conductive path extends through the via 608 to the third metal layer M2 that extends in the x-direction to another via 610. The conductive path continues through the via 610 down to the second metal layer M1 and through another via down to the first metal layer M0 that extends in the x-direction to be connected to another input 612 of the SA 502.

The SA 504 is situated under the second memory array 512 and electrically connected to the bit line BL1 520b of the first memory array 510 and to the bit line BL1R 534b of the second memory array 512. The bit line BL1 520b is a seventh metal layer M6 that extends in the x-direction to a via 614. The conductive path extends through the via 614 to the sixth metal layer M5 that extends in the y-direction to another via 616. The conductive path extends through the via 616 to the fifth metal layer M4 and through other vias to the fourth metal layer M3 and the third metal layer M2 that extends in the x-direction to another via 618. The conductive path continues through the via 618 down to the second metal layer M1 and through another via down to the first metal layer M0 that extends in the x-direction to be connected to an input 620 of the SA 504. The bit line BL1R 534b is a seventh metal layer M6 that extends in the x-direction to a via 622. The conductive path extends down through the via 622 to the sixth metal layer M5 and through other vias to the fifth metal layer M4, the fourth metal layer M3, the third metal layer M2, the second metal layer M1, and the first metal layer M0 to another input 624 of the SA 504.

By positioning the SAs 502 and 504 below the first memory array 510 and the second memory array 512, respectively, and by providing conductive paths 600 in the z-direction between the SAs 502 and 504 and the first and second memory arrays 510 and 512, more SAs can be connected to the first and second memory arrays 510 and 512 without increasing the area of the memory device, such as memory device 500. This is as compared to having the SAs, the memory arrays, and the conductive paths on the same plane of the semiconductor device.

Figure 13:
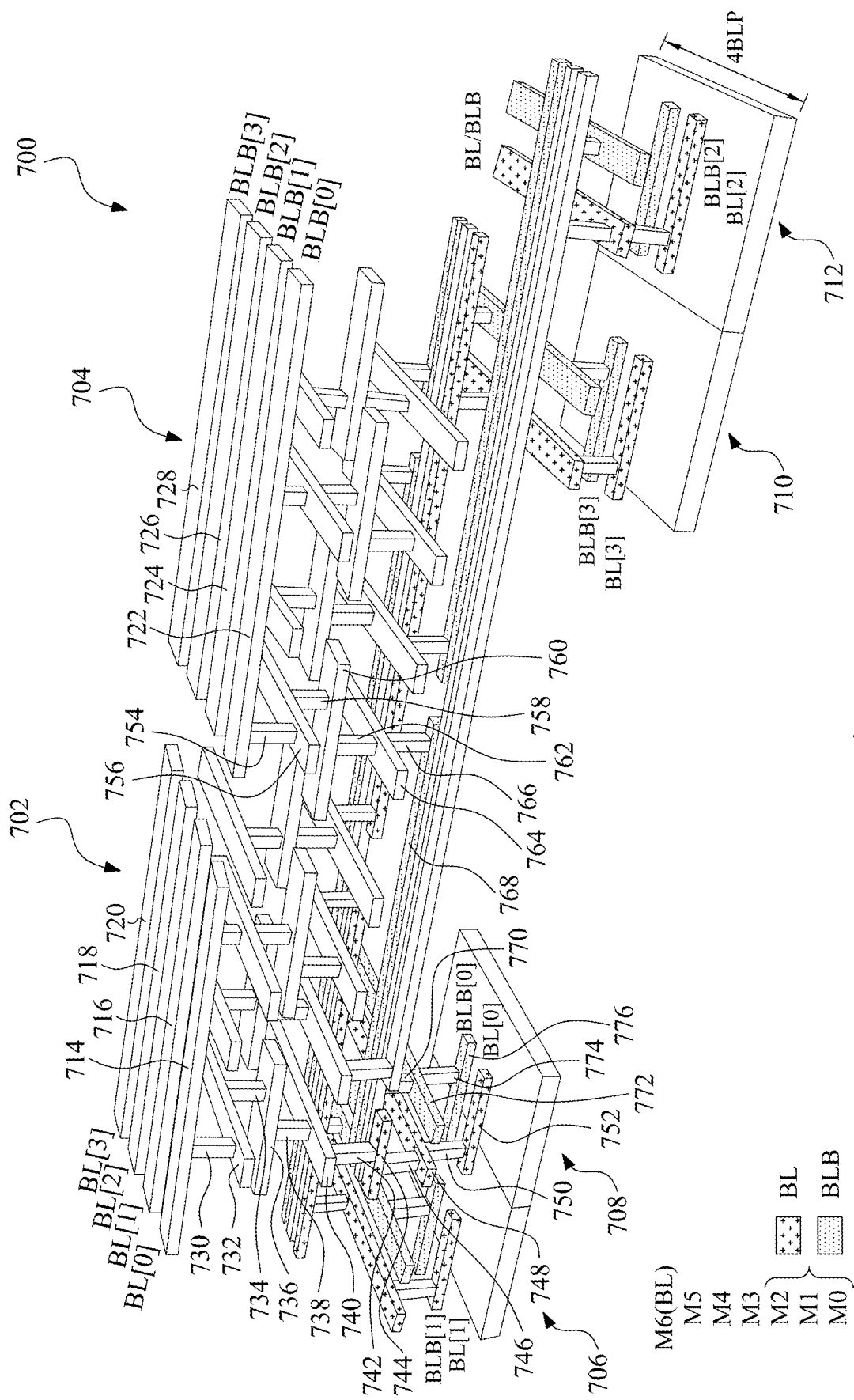
FIG. 13 is a diagram schematically illustrating a memory device that includes a first memory array, a second memory array, and four SAs, in accordance with some embodiments.

FIG. 13 is a diagram schematically illustrating a memory device 700 that includes a first memory array 702, a second memory array 704, and four SAs 706, 708, 710, and 712, in accordance with some embodiments. FIG. 13 is a three-dimensional diagram of the memory device 700. In some embodiments, the memory device 700 is a layout of the memory device 500 of FIG. 9. In some embodiments, the first memory array 702 and the second memory array 704 are like the first memory array 510 and the second memory array 512 (shown in FIG. 9). In some embodiments, the four SAs 706, 708, 710, and 712 are like the four SAs 502, 504, 506, and 508 (shown in FIG. 9).

The SAs 706 and 708 are generally situated under the first memory array 702, and the SAs 710 and 712 are generally situated under the second memory array 704. The memory device 700 includes conductive paths that extend in the z-direction between the first and second memory arrays 702 and 704 and the four SAs 706, 708, 710, and 712. In some embodiments, each of the SAs 706, 708, 710, and 712 has a four bit line pitch BLP. In some embodiments, each of the SAs 706, 708, 710, and 712 has a four bit line pitch BLP of 0.42 micrometers (um).

The first memory array 702 includes bit line BL[0] 714, bit line BL[1] 716, bit line BL[2] 718, and bit line BL[3] 720, and the second memory array 704 includes bit line bar BLB[0] 722, bit line bar BLB[1] 724, bit line bar BLB[2] 726, and bit line bar BLB[3] 728. The SA 708 has one input electrically connected to bit line BL[0] 714 and another input electrically connected to bit line bar BLB[0] 722. The SA 706 has one input electrically connected to bit line BL[1] 716 and another input electrically connected to bit line bar BLB[1] 724. The SA 712 has one input electrically connected to bit line BL[2] 718 and another input electrically connected to bit line bar BLB[2] 726. The SA 710 has one input electrically connected to bit line BL[3] 720 and another input electrically connected to bit line bar BLB[3] 728.

The conductive path between the bit line BL[0] 714 of the first memory array 702 and one input of the SA 708 and the conductive path between the bit line bar BLB[0] 722 of the second memory array 704 and the other input of the SA 708 are described in detail below as an example of the conductive paths electrically connecting the first and second memory arrays 702 and 704 to the SAs 706, 708, 710, and 712.

The bit line BL[0] 714 is a seventh metal layer M6 that is electrically connected through via 730 to sixth metal layer M5 732, through via 734 to fifth metal layer M4 736, through via 738 to fourth metal layer M3 740, through via 742 to third metal layer M2 744, through via 746 to second metal layer M1 748, and through via 750 to first metal layer M0 752 and the one input of the SA 708.

The bit line bar BLB[0] 722 is a seventh metal layer M6 that is electrically connected through via 754 to sixth metal layer M5 756, through via 758 to fifth metal layer M4 760, through via 762 to fourth metal layer M3 764, through via 766 to third metal layer M2 768, through via 770 to second metal layer M1 772, and through via 774 to first metal layer M0 776 and the other input of the SA 708.

The other SAs 706, 710, and 712 are similarly electrically connected to the first and second memory arrays 702 and 704. However, to reduce clutter and repetition, the other conductive paths between the first and second memory arrays 702 and 704 and the SAs 706, 710, and 712, while shown in FIG. 13, will not be further described herein.

By positioning the SAs 706, 708, 710, and 712 below the first memory array 702 and the second memory array 704 and by providing conductive paths in the z-direction between the SAs 706, 708, 710, and 712 and the first and second memory arrays 702 and 704, more SAs can be connected to the first and second memory arrays 702 and 704 without increasing the area of the memory device 700.

Figure 14:
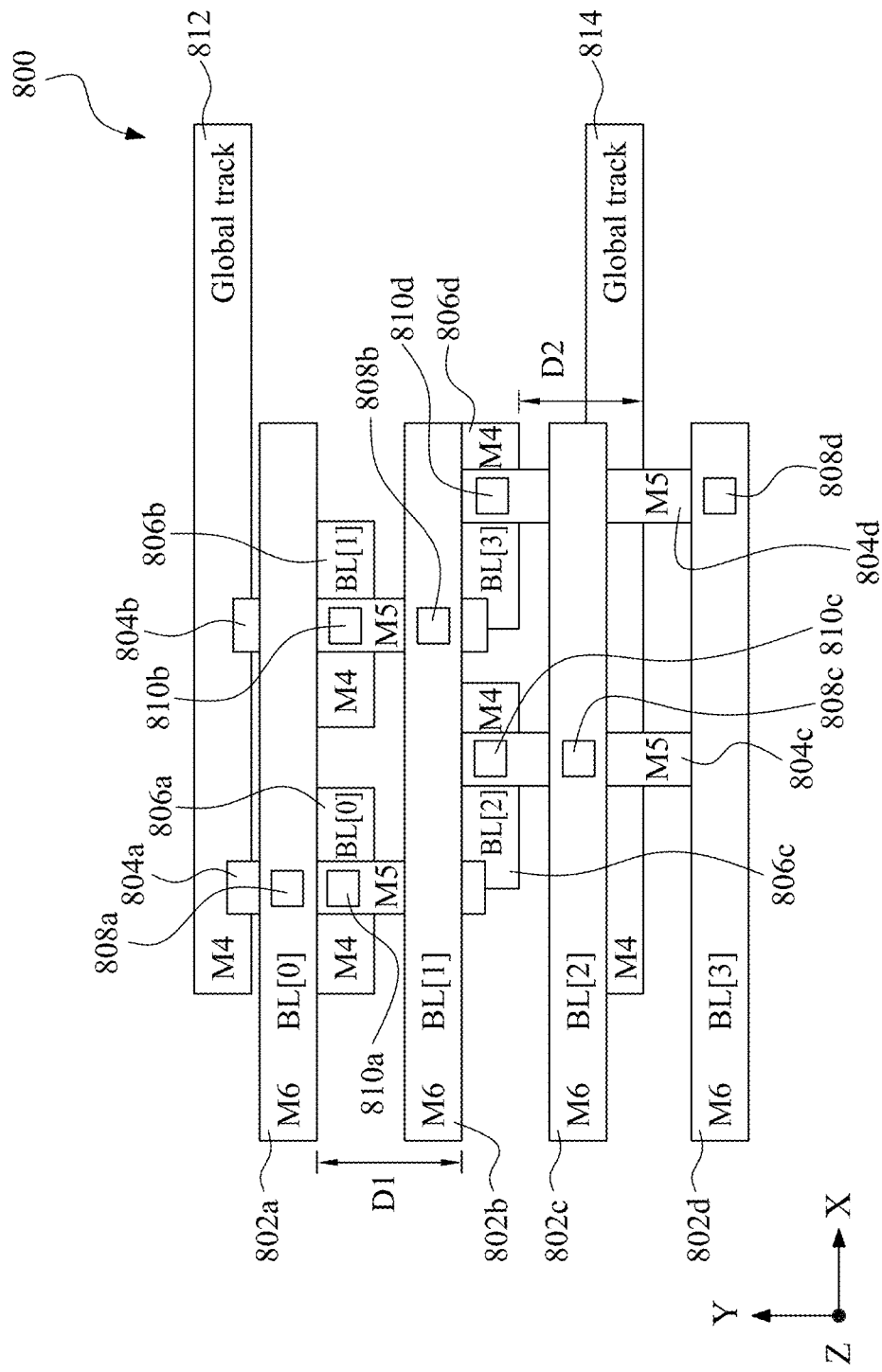
FIG. 14 is a diagram schematically illustrating a memory device that includes bit lines electrically connected to sixth metal layer M5 lines and fifth metal layer M4 lines, in accordance with some embodiments.

FIG. 14 is a diagram schematically illustrating a memory device 800 that includes bit lines 802a-802d electrically connected to sixth metal layer M5 lines 804a-804d and fifth metal layer M4 lines 806a-806d, in accordance with some embodiments. In some embodiments, the memory device 800 is a layout of part of the memory device 500 of FIG. 9. In some embodiments, the bit lines 802*a*-802*d* are like the bit lines 520*a*-520*d* and/or the bit lines 534*a*-534*d* (shown in FIG. 9). In some embodiments, the bit lines 802*a*-802*d* are like the bit lines 520*a* and 520*b* and/or the bit lines 534*a* and 534*b* (shown in FIGS. 10 and 12).

The bit lines 802*a*-802*d* are seventh metal layer M6 lines that extend in the x-direction, along the x-axis. The sixth metal layer M5 lines 804*a*-804*d* extend in the y-direction, along the y-axis, and the fifth metal layer M4 lines 806*a*-806*d* extend in the x-direction, along the x-axis. In some embodiments, the bit lines 802*a*-802*d* are spaced apart a distance D1 of 105 nanometers (nm).

Conductive pathways extend in the z-direction to electrically connect the bit lines 802*a*-802*d* to SAs (not shown in FIG. 14). These conductive pathways can be jogged in the y-direction and/or the x-direction using the sixth metal layer M5 lines 804*a*-804*d* and the fifth metal layer M4 lines 806*a*-806*d*, respectively.

The bit line BL[0] 802*a* is electrically connected to sixth metal layer M5 line 804*a* through via 808*a* and the sixth metal layer M5 line 804*a* is electrically connected to the fifth metal layer M4 line 806*a* through via 810*a*. The bit line BL[1] 802*b* is electrically connected to sixth metal layer M5 line 804*b* through via 808*b* and the sixth metal layer M5 line 804*b* is electrically connected to the fifth metal layer M4 line 806*b* through via 810*b*. The bit line BL[2] 802*c* is electrically connected to sixth metal layer M5 line 804*c* through via 808*c* and the sixth metal layer M5 line 804*c* is electrically connected to the fifth metal layer M4 line 806*c* through via 810*c*. The bit line BL[3] 802*d* is electrically connected to sixth metal layer M5 line 804*d* through via 808*d* and the sixth metal layer M5 line 804*d* is electrically connected to the fifth metal layer M4 line 806*d* through via 810*d*. Also, the memory device 800 includes two fifth metal layer M4 global tracks 812 and 814 on opposing sides of the fifth metal layer M4 lines 806*a*-806*d*. In some embodiments, the fifth metal layer M4 lines 806*a*-806*d* and the fifth metal layer M4 global tracks 812 and 814 are spaced apart a distance D2 of 120 nm.

Figure 15:
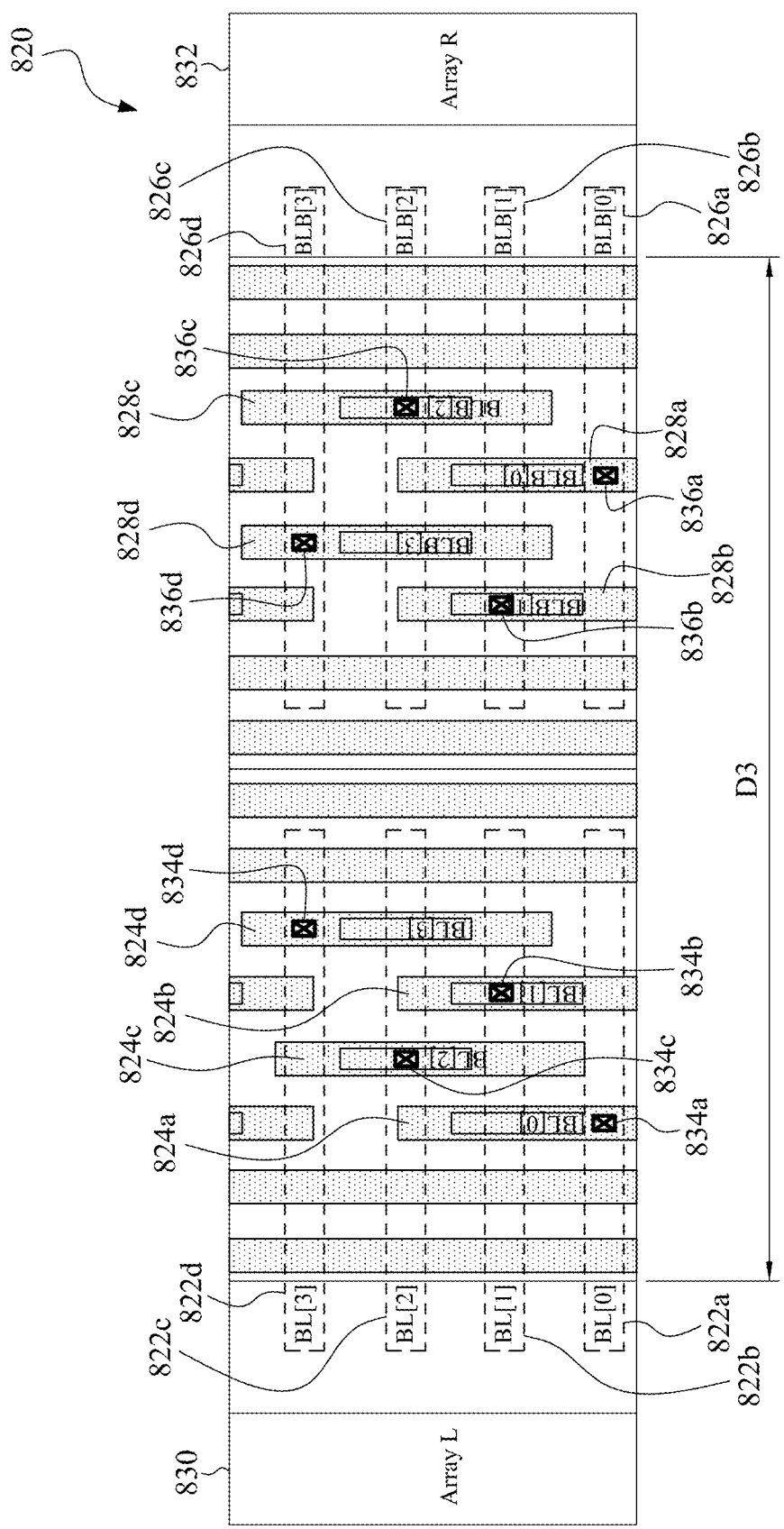
FIG. 15 is a diagram schematically illustrating a memory device that includes bit lines BL electrically connected to sixth metal layer M5 lines and bit line bars BLB electrically connected to sixth metal layer M5 lines, in accordance with some embodiments.

FIG. 15 is a diagram schematically illustrating a memory device 820 that includes bit lines BL 822*a*-822*d* that are seventh metal layer M6 lines electrically connected to sixth metal layer M5 lines 824*a*-824*d*, and bit line bars BLB 826*a*-826*d* that are seventh metal layer M6 lines electrically connected to sixth metal layer M5 lines 828*a*-828*d*, in accordance with some embodiments. The bit lines BL 822*a*-822*d* are part of or from the first memory array ARRAY_L 830 and the bit line bars BLB 826*a*-826*d* are part of or from the second memory array ARRAY_R 832. In some embodiments, the memory device 820 is a layout of part of the memory device 500 of FIG. 9. In some embodiments, the first memory array ARRAY_L 830 is like the first memory array 510 (shown in FIG. 9) and, in some embodiments, the second memory array ARRAY_R 832 is like the second memory array 512 (shown in FIG. 9). In some embodiments, the bit lines BL 822*a*-822*d* are like the bit lines 520*a*-520*d* and/or the bit lines 534*a*-534*d* (shown in FIG. 9 and in FIGS. 10 and 12). In some embodiments, the bit line bars BLB 826*a*-826*d* are like the bit lines 520*a*-520*d* and/or the bit lines 534*a*-534*d* (shown in FIG. 9 and in FIGS. 10 and 12). In some embodiments, the first memory array ARRAY_L 830 and the second memory array ARRAY_R 832 are spaced apart a distance D3 of 1.92 um.

The bit lines BL 822*a*-822*d* are seventh metal layer M6 lines that extend in the x-direction, along the x-axis, and the sixth metal layer M5 lines 824*a*-824*d* extend in the y-direction, along the y-axis. The bit line BL[0] 822*a* is electrically connected to sixth metal layer M5 line 824*a* through via 834*a*. The bit line BL[1] 822*b* is electrically connected to sixth metal layer M5 line 824*b* through via 834*b*. The bit line BL[2] 822*c* is electrically connected to sixth metal layer M5 line 824*c* through via 834*c*. The bit line BL[3] 822*d* is electrically connected to sixth metal layer M5 line 824*d* through via 834*d*.

The bit line bars BLB 826*a*-826*d* are seventh metal layer M6 lines that extend in the x-direction, along the x-axis, and the sixth metal layer M5 lines 828*a*-828*d* extend in the y-direction, along the y-axis. The bit line bar BLB[0] 826*a* is electrically connected to sixth metal layer M5 line 828*a* through via 836*a*. The bit line BLB[1] 826*b* is electrically connected to sixth metal layer M5 line 828*b* through via 836*b*. The bit line BLB[2] 826*c* is electrically connected to sixth metal layer M5 line 828*c* through via 836*c*. The bit line BLB[3] 826*d* is electrically connected to sixth metal layer M5 line 828*d* through via 836*d*.

Figure 16:
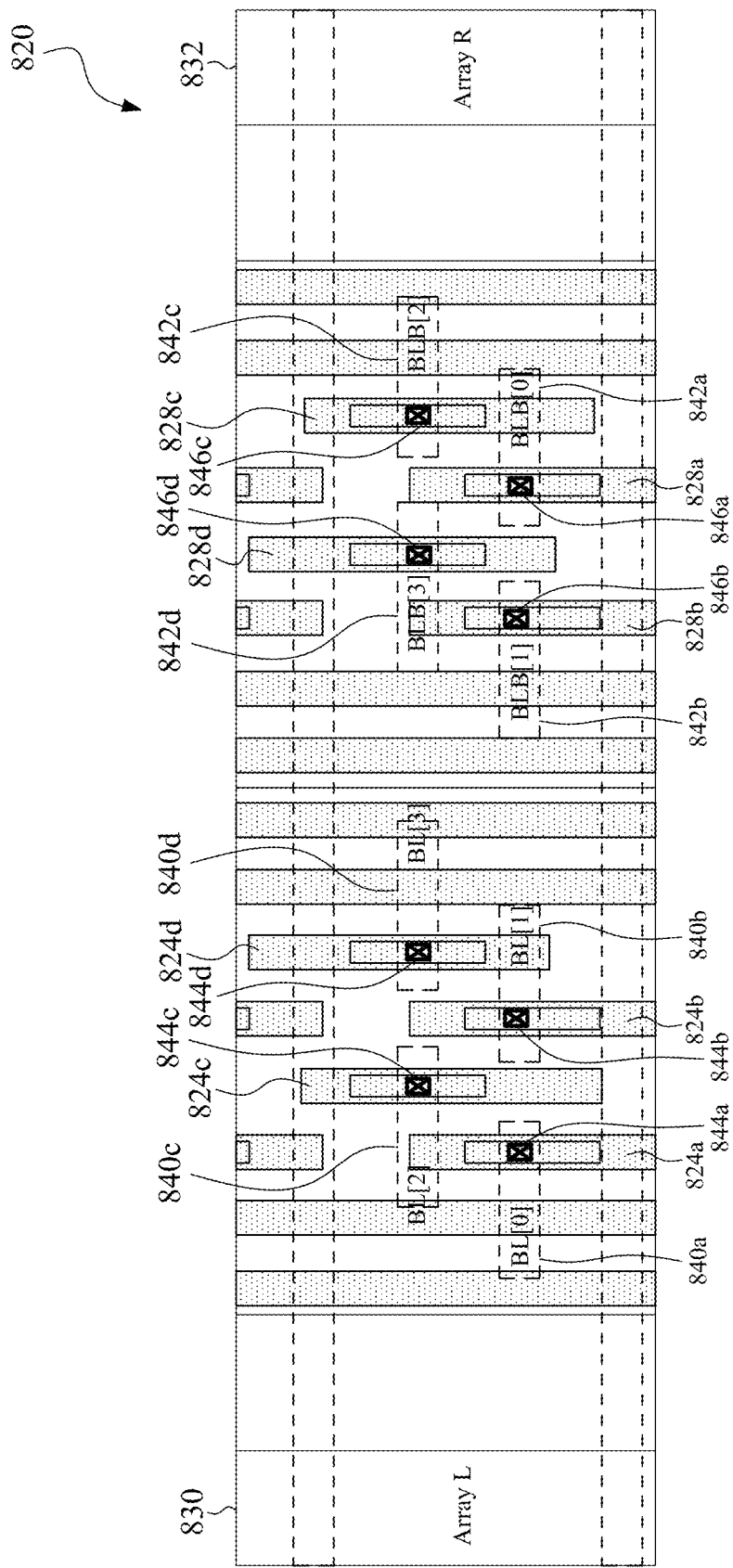
FIG. 16 is a diagram schematically illustrating a memory device that includes a set of sixth metal layer M5 lines electrically connected to a set of fifth metal layer M4 lines, and another set of sixth metal layer M5 lines electrically connected to another set of fifth metal layer M4 lines, in accordance with some embodiments.

FIG. 16 is a diagram schematically illustrating other portions of the memory device 820 including the sixth metal layer M5 lines 824*a*-824*d* electrically connected to fifth metal layer M4 lines 840*a*-840*d*, and the sixth metal layer M5 lines 828*a*-828*d* electrically connected to fifth metal layer M4 lines 842*a*-842*d*, in accordance with some embodiments. The memory device 820 includes the first memory array ARRAY_L 830 and the second memory array ARRAY_R 832. In some embodiments, the memory device 820 is a layout of part of the memory device 500 of FIG. 9. In some embodiments, the first memory array ARRAY_L 830 is like the first memory array 510 (shown in FIG. 9) and, in some embodiments, the second memory array ARRAY_R 832 is like the second memory array 512 (shown in FIG. 9).

The sixth metal layer M5 lines 824*a*-824*d* extend in the y-direction, along the y-axis and the fifth metal layer M4 lines 840*a*-840*d* extend in the x-direction, along the x-axis. The sixth metal layer M5 line 824*a* is electrically connected to the fifth metal layer M4 line 840*a* through via 844*a*. The sixth metal layer M5 line 824*b* is electrically connected to the fifth metal layer M4 line 840*b* through via 844*b*. The sixth metal layer M5 line 824*c* is electrically connected to the fifth metal layer M4 line 840*c* through via 844*c*. The sixth metal layer M5 line 824*d* is electrically connected to the fifth metal layer M4 line 840*d* through via 844*d*.

The sixth metal layer M5 lines 828*a*-828*d* extend in the y-direction, along the y-axis and the fifth metal layer M4 lines 842*a*-842*d* extend in the x-direction, along the x-axis. The sixth metal layer M5 line 828*a* is electrically connected to the fifth metal layer M4 line 842*a* through via 846*a*. The sixth metal layer M5 line 828*b* is electrically connected to the fifth metal layer M4 line 842*b* through via 846*b*. The sixth metal layer M5 line 828*c* is electrically connected to the fifth metal layer M4 line 842*c* through via 846*c*. The sixth metal layer M5 line 828*d* is electrically connected to the fifth metal layer M4 line 842*d* through via 846*d*.

Figure 17:
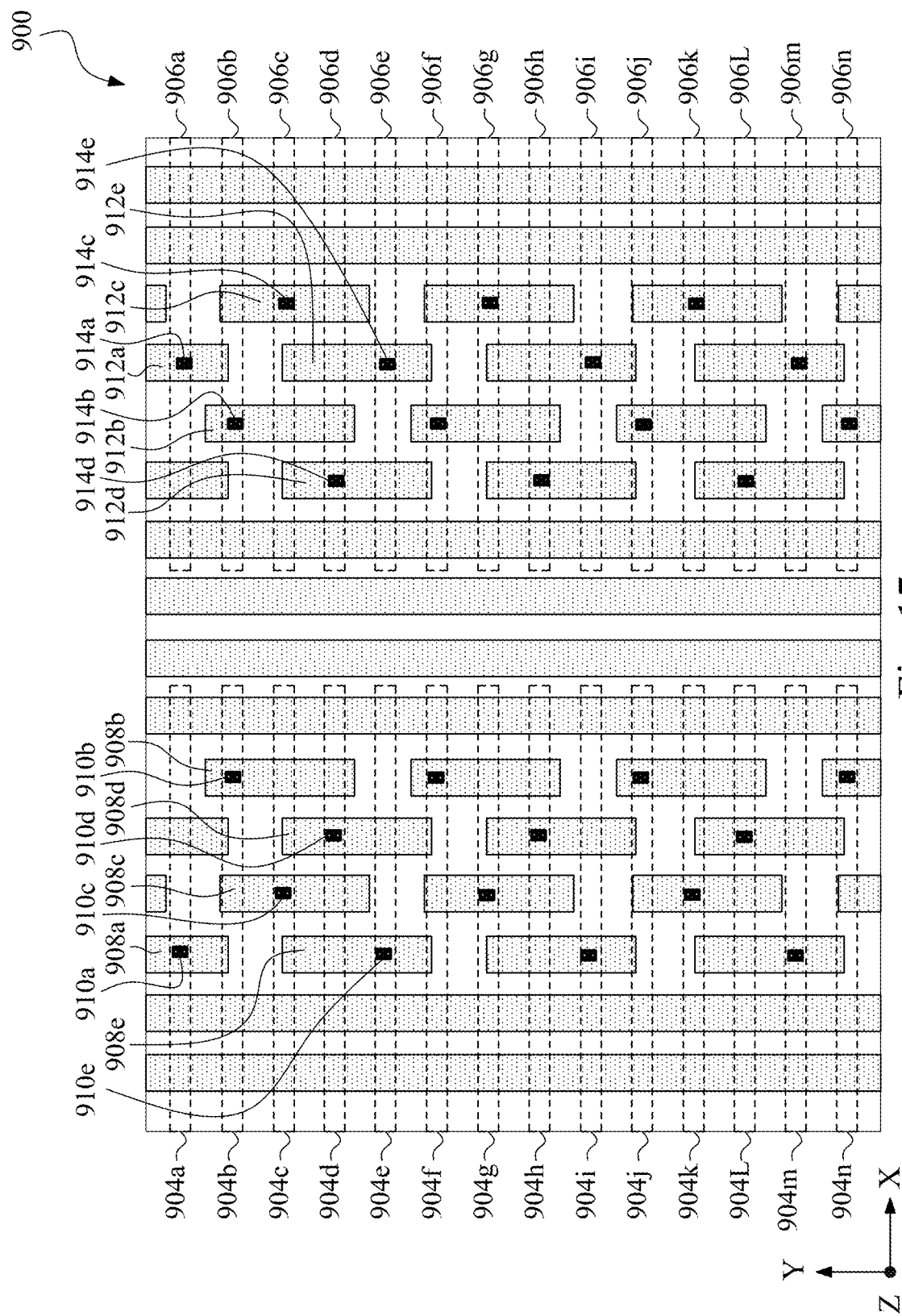
FIG. 17 is a diagram schematically illustrating a memory device that includes bit lines with a first bit line pitch, such as a normal bit line pitch, in accordance with some embodiments.
Figure 18:
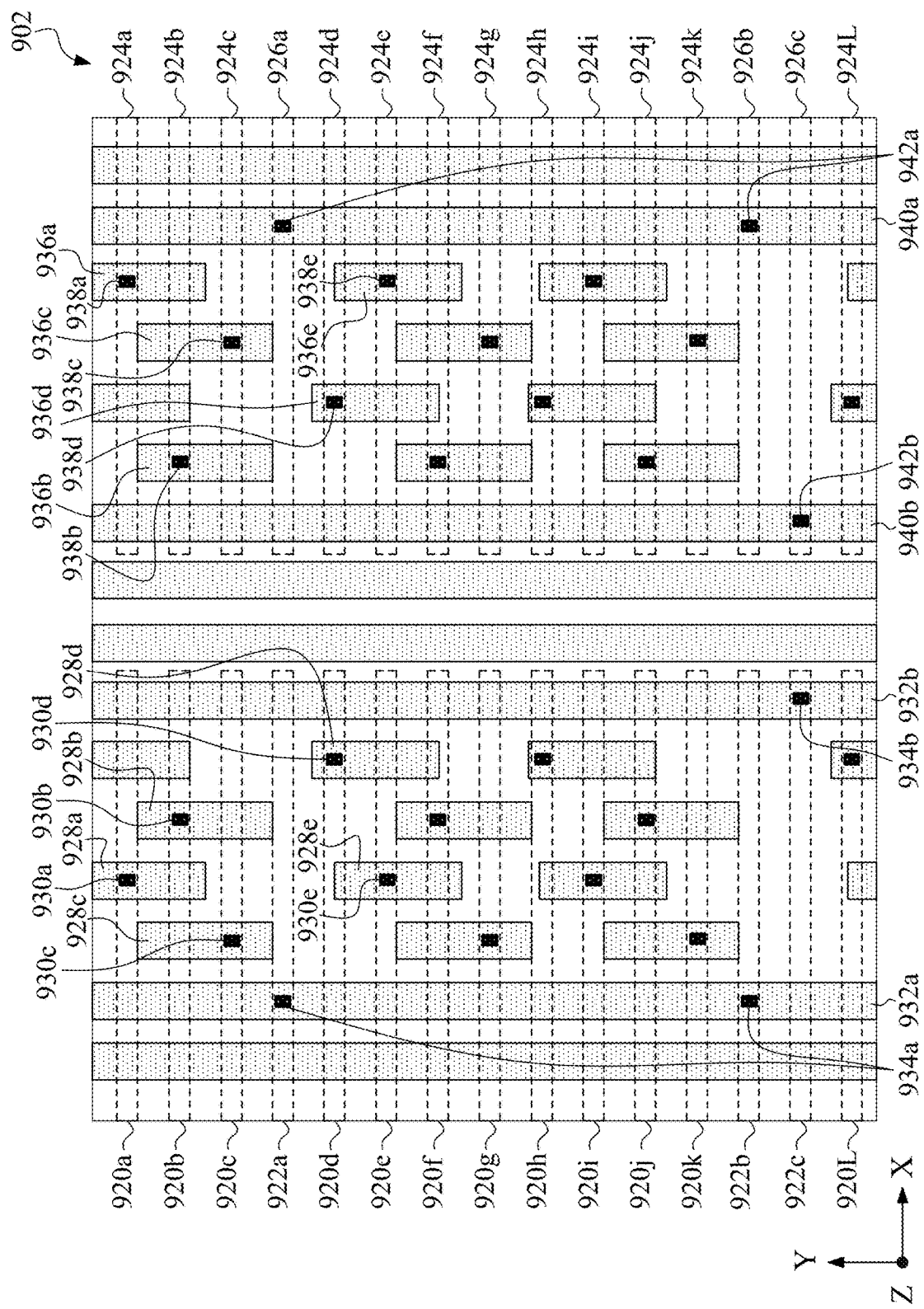
FIG. 18 is a diagram schematically illustrating a memory device that has a second bit line pitch that is smaller than the first bit line pitch of the memory device of FIG. 17, in accordance with some embodiments.

FIGS. 17 and 18 are diagrams schematically illustrating memory devices 900 and 902 that have memory arrays situated above peripheral circuits and connected to the peripheral circuits by conductive paths that extend in the z-direction, as disclosed herein. In some embodiments, the memory device 900 is like one or more of the memory devices disclosed herein including the memory device 20 of FIG. 1, the memory device 60 of FIG. 2, the memory device 300 of FIG. 5, the memory device 340 of FIG. 6, and the memory device 500 of FIG. 9 and FIGS. 10-16. In some embodiments, the memory device 902 is like one or more of the memory devices including the memory device 20 of FIG. 1, the memory device 60 of FIG. 2, the memory device 300 of FIG. 5, the memory device 340 of FIG. 6, and the memory device 500 of FIG. 9 and FIGS. 10-16.

The memory devices 900 and 902 have different bit line pitches, but by using the conductive paths described herein, the memory devices 900 and 902 can have the same circuit layout, such as the same SA circuit layout, in each of the memory devices 900 and 902. In some embodiments, the memory devices 900 and 902 include bit lines electrically connected to SAs, where the layouts of the SAs in the memory devices 900 and 902 are the same. In some embodiments, the memory devices 900 and 902 include bit lines electrically connected to SAs, where the placements of the SAs in the memory devices 900 and 902 are the same.

FIG. 17 is a diagram schematically illustrating the memory device 900 that includes a first bit line pitch, such as a normal bit line pitch, and bit lines 904a-904n and 906a-906n, in accordance with some embodiments. The bit lines 904a-904n and 906a-906n are all active bit lines electrically connected to memory cells in one or more of the memory arrays and to SAs situated below the memory arrays.

The bit lines 904a-904n extend in the x-direction, along the x-axis, and metal layer lines, such as metal layer lines 908a-908e, extend in the y-direction, along the y-axis. Each of the bit lines 904a-904n is electrically connected to one of the metal layer lines that extend in the y-direction, such as metal layer lines 908a-908e. For example, bit line 904a is electrically connected to metal layer line 908a through via 910a, bit line 904b is electrically connected to metal layer line 908b through via 910b, bit line 904c is electrically connected to metal layer line 908c through via 910c, bit line 904d is electrically connected to metal layer line 908d through via 910d, and bit line 904e is electrically connected to metal layer line 908e through via 910e, and so on. The metal layer lines that extend in the y-direction, such as metal layer lines 908a-908e, can be used to jog the conductivity paths, connected between the memory arrays and the SAs, in the y-direction.

The bit lines 906a-906n extend in the x-direction, along the x-axis, and metal layer lines, such as metal layer lines 912a-912e, extend in the y-direction, along the y-axis. Each of the bit lines 906a-906n is electrically connected to one of the metal layer lines that extend in the y-direction, such as metal layer lines 912a-912e. For example, bit line 906a is electrically connected to metal layer line 912a through via 914a, bit line 906b is electrically connected to metal layer line 912b through via 914b, bit line 906c is electrically connected to metal layer line 912c through via 914c, bit line 906d is electrically connected to metal layer line 912d through via 914d, and bit line 906e is electrically connected to metal layer line 912e through via 914e, and so on. The metal layer lines that extend in the y-direction, such as metal layer lines 912a-912e, can be used to jog the conductivity paths, connected between the memory arrays and the SAs, in the y-direction.

FIG. 18 is a diagram schematically illustrating the memory device 902 that has a second bit line pitch that is smaller than the first bit line pitch of the memory device 900 of FIG. 17, in accordance with some embodiments. The memory device 902 includes active bit lines 920a-9201, bypassed bit lines 922a-922c, active bit lines 924a-9241, and bypassed bit lines 926a-926c. The active bit lines 920a-9201 and 924a-9241 are all active bit lines electrically connected to memory cells in one or more of the memory arrays and to SAs situated below the memory arrays. The bypassed bit lines 922a-922c and 926a-926c are all electrically connected to a reference voltage Vref.

The active bit lines 920a-9201 extend in the x-direction, along the x-axis, and metal layer lines, such as metal layer lines 928a-928e, extend in the y-direction, along the y-axis. Each of the bit lines 920a-9201 is electrically connected to one of the metal layer lines that extend in the y-direction, such as metal layer lines 928a-928e. For example, bit line 920a is electrically connected to metal layer line 928a through via 930a, bit line 920b is electrically connected to metal layer line 928b through via 930b, bit line 920c is electrically connected to metal layer line 928c through via 930c, bit line 920d is electrically connected to metal layer line 928d through via 930d, and bit line 920e is electrically connected to metal layer line 928e through via 930e, and so on. The metal layer lines that extend in the y-direction, such as metal layer lines 928a-928e, can be used to jog the conductivity paths, connected between the memory arrays and the SAs, in the y-direction.

The bypassed bit lines 922a-922c extend in the x-direction, along the x-axis, and metal layer lines, such as metal layer lines 932a and 932b extend in the y-direction, along the y-axis. Each of the bypassed bit lines 922a-922c is electrically connected to one of the metal layer lines 932a and 932b that are connected to the reference voltage Vref. Bypassed bit lines 922a and 922b are electrically connected to metal layer line 932a through vias 934a, and bypassed bit line 922c is electrically connected to metal layer line 932b through via 934b. The bypassed bit lines 922a-922c are the extra bit lines provided by the smaller bit line pitch of the memory device 902.

The active bit lines 924a-9241 extend in the x-direction, along the x-axis, and metal layer lines, such as metal layer lines 936a-936e, extend in the y-direction, along the y-axis. Each of the bit lines 924a-9241 is electrically connected to one of the metal layer lines that extend in the y-direction, such as metal layer lines 936a-936e. For example, bit line 924a is electrically connected to metal layer line 936a through via 938a, bit line 924b is electrically connected to metal layer line 936b through via 938b, bit line 924c is electrically connected to metal layer line 936c through via 938c, bit line 924d is electrically connected to metal layer line 936d through via 938d, and bit line 924e is electrically connected to metal layer line 936e through via 938e, and so on. The metal layer lines that extend in the y-direction, such as metal layer lines 936a-936e, can be used to jog the conductivity paths, connected between the memory arrays and the SAs, in the y-direction.

The bypassed bit lines 926a-926c extend in the x-direction, along the x-axis, and metal layer lines, such as metal layer lines 940a and 940b extend in the y-direction, along the y-axis. Each of the bypassed bit lines 926a-926c is electrically connected to one of the metal layer lines 940a and 940b that are connected to the reference voltage Vref. Bypassed bit lines 926a and 926b are electrically connected to metal layer line 940a through vias 942a, and bypassed bit line 926c is electrically connected to metal layer line 940b through via 942b. The bypassed bit lines 926a-926c are the extra bit lines provided by the smaller bit line pitch of the memory device 902.

The memory devices 900 and 902 have different bit line pitches, but by using the conductive paths described herein, the memory devices 900 and 902 can have the same circuit layout, such as the same SA circuit layout, in each of the memory devices 900 and 902.

Figure 20:
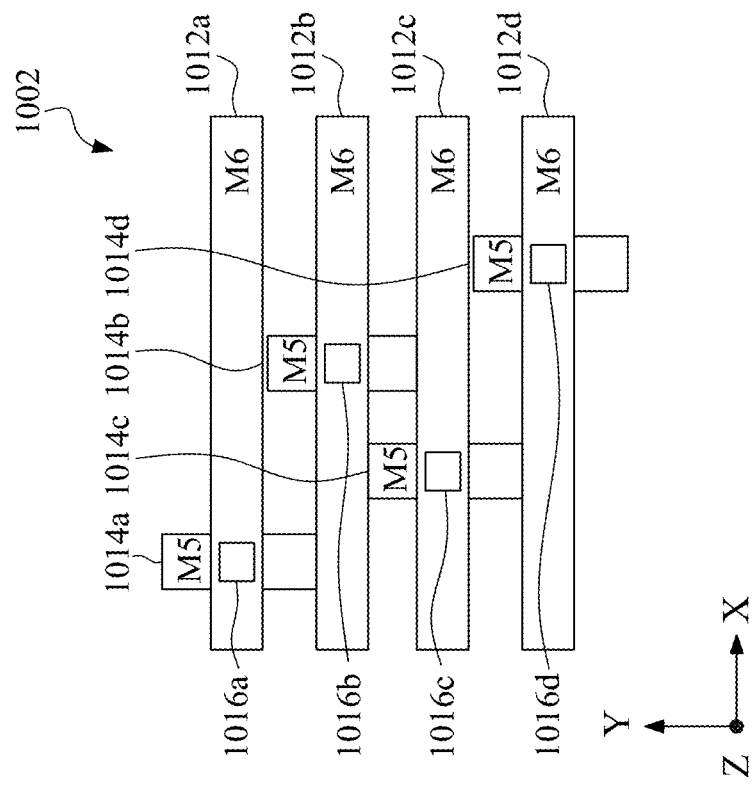
FIG. 20 is a diagram schematically illustrating a memory device that includes bit lines electrically connected to metal layer lines in a staggered connection arrangement, in accordance with some embodiments.
Figure 19:
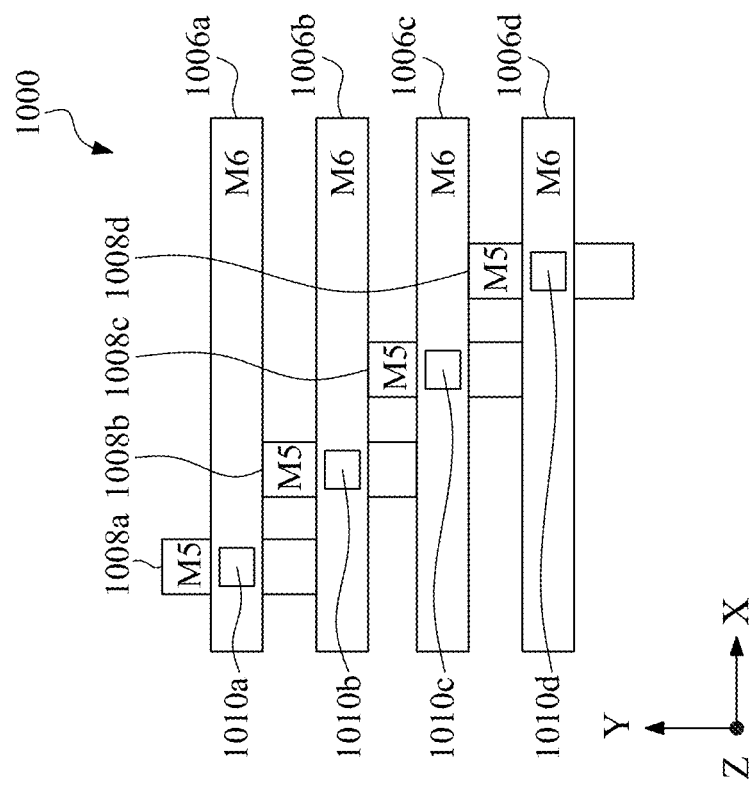
FIG. 19 is a diagram schematically illustrating a memory device that includes bit lines electrically connected to metal layer lines, in accordance with some embodiments.
Figure 21:
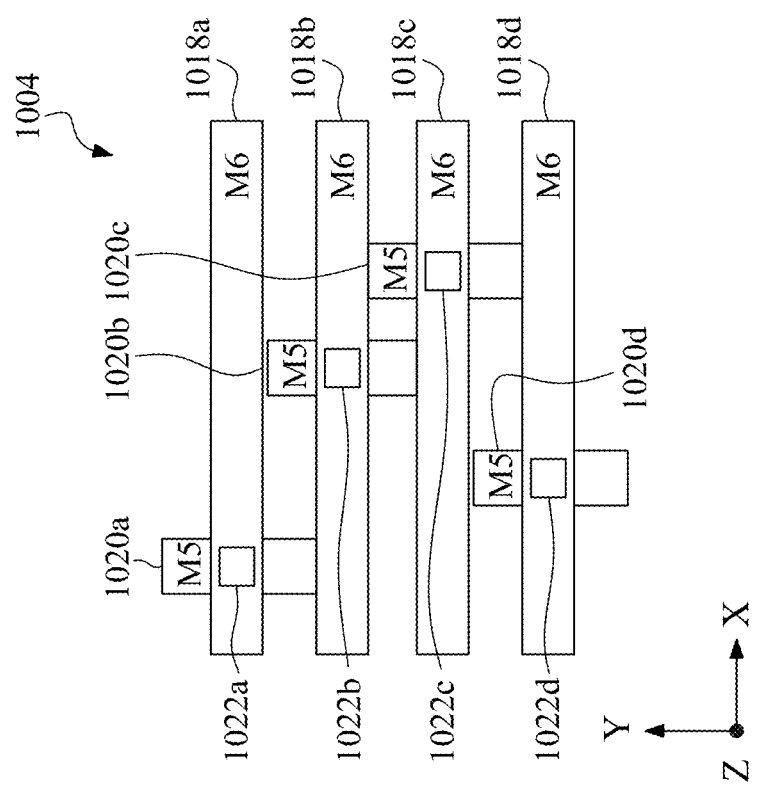
FIG. 21 is a diagram schematically illustrating a memory device that includes bit lines electrically connected to metal layer lines in a second staggered connection arrangement, in accordance with some embodiments.

FIGS. 19-21 are diagrams schematically illustrating memory devices 1000, 1002, and 1004 that have different bit line jog connections for active bit lines. In some embodiments, the different bit line jog connections of one or more of the memory devices 1000, 1002, and 1004 is used in one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

FIG. 19 is a diagram schematically illustrating the memory device 1000 that includes bit lines 1006a-1006d electrically connected to metal layer lines 1008a-1008d, in accordance with some embodiments. The bit lines 1006a-1006d are seventh metal layer M6 lines that extend in the x-direction, along the x-axis. The metal layer lines 1008a-1008d are sixth metal layer M5 lines that extend in the y-direction, along the y-axis, such that the metal layer lines 1008a-1008d can be used to jog conductive paths in the y-direction. In other embodiments, the bit lines 1006a-1006d can be different metal layer lines that extend in the x-direction or the y-direction. Also, in other embodiments, the metal layer lines 1008a-1008d can be different metal layer lines that extend in the x-direction or the y-direction.

The bit lines 1006a-1006d are electrically connected to the metal layer lines 1008a-1008d at connections that cascade in a stair-step arrangement from the left side to the right side of FIG. 19. The bit line 1006a is electrically connected to the metal layer line 1008a through a via 1010a, the bit line 1006b is electrically connected to the metal layer line 1008b through a via 1010b, the bit line 1006c is electrically connected to the metal layer line 1008c through a via 1010c, and the bit line 1006d is electrically connected to the metal layer line 1008d through a via 1010d.

FIG. 20 is a diagram schematically illustrating the memory device 1002 that includes bit lines 1012a-1012d electrically connected to metal layer lines 1014a-1014d in a staggered connection arrangement, in accordance with some embodiments. The bit lines 1012a-1012d are seventh metal layer M6 lines that extend in the x-direction, along the x-axis. The metal layer lines 1014a-1014d are sixth metal layer M5 lines that extend in the y-direction, along the y-axis, such that the metal layer lines 1014a-1014d can be used to jog conductive paths in the y-direction. In other embodiments, the bit lines 1012a-1012d can be different metal layer lines that extend in the x-direction or the y-direction. Also, in other embodiments, the metal layer lines 1014a-1014d can be different metal layer lines that extend in the x-direction or the y-direction.

The bit lines 1012a-1012d are electrically connected to the metal layer lines 1014a-1014d in an alternating, staggered connection arrangement from the left side to the right side of FIG. 20. The bit line 1012a is electrically connected to the metal layer line 1014a through a via 1016a, the bit line 1012c is electrically connected to the metal layer line 1014c through a via 1016c, the bit line 1012b is electrically connected to the metal layer line 1014b through a via 1016b, and the bit line 1012d is electrically connected to the metal layer line 1014d through a via 1016d.

FIG. 21 is a diagram schematically illustrating the memory device 1004 that includes bit lines 1018a-1018d electrically connected to metal layer lines 1020a-1020d in a second staggered connection arrangement, in accordance with some embodiments. The bit lines 1018a-1018d are seventh metal layer M6 lines that extend in the x-direction, along the x-axis. The metal layer lines 1020a-1020d are sixth metal layer M5 lines that extend in the y-direction, along the y-axis, such that the metal layer lines 1020a-1020d can be used to jog conductive paths in the y-direction. In other embodiments, the bit lines 1018a-1018d can be different metal layer lines that extend in the x-direction or the y-direction. Also, in other embodiments, the metal layer lines 1020a-1020d can be different metal layer lines that extend in the x-direction or the y-direction.

The bit lines 1018a-1018d are electrically connected to the metal layer lines 1020a-1020d in a second staggered connection arrangement from the left side to the right side of FIG. 21. The bit line 1018a is electrically connected to the metal layer line 1020a through a via 1022a, the bit line 1018d is electrically connected to the metal layer line 1020d through a via 1022d, the bit line 1018b is electrically connected to the metal layer line 1020b through a via 1022b, and the bit line 1018c is electrically connected to the metal layer line 1020c through a via 1022c.

Figure 22:
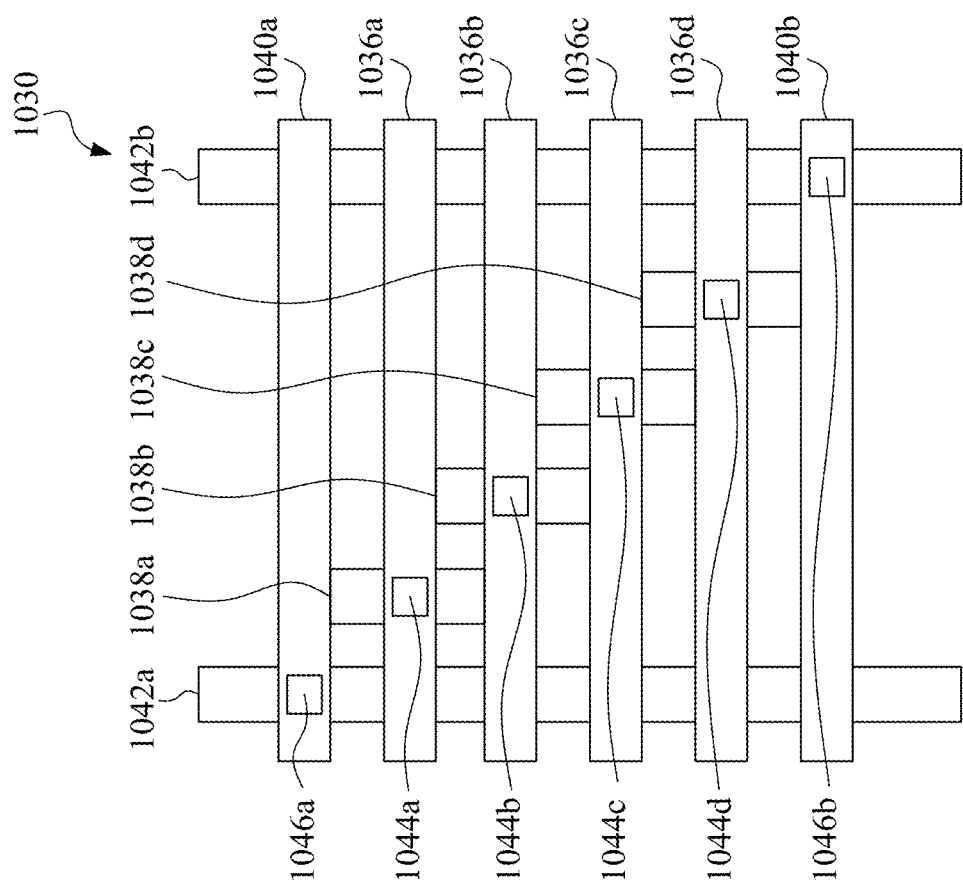
FIG. 22 is a diagram schematically illustrating a memory device that includes active bit lines electrically connected to metal layer lines, and bypassed bit lines electrically connected to metal layer lines, in accordance with some embodiments.
Figure 23:
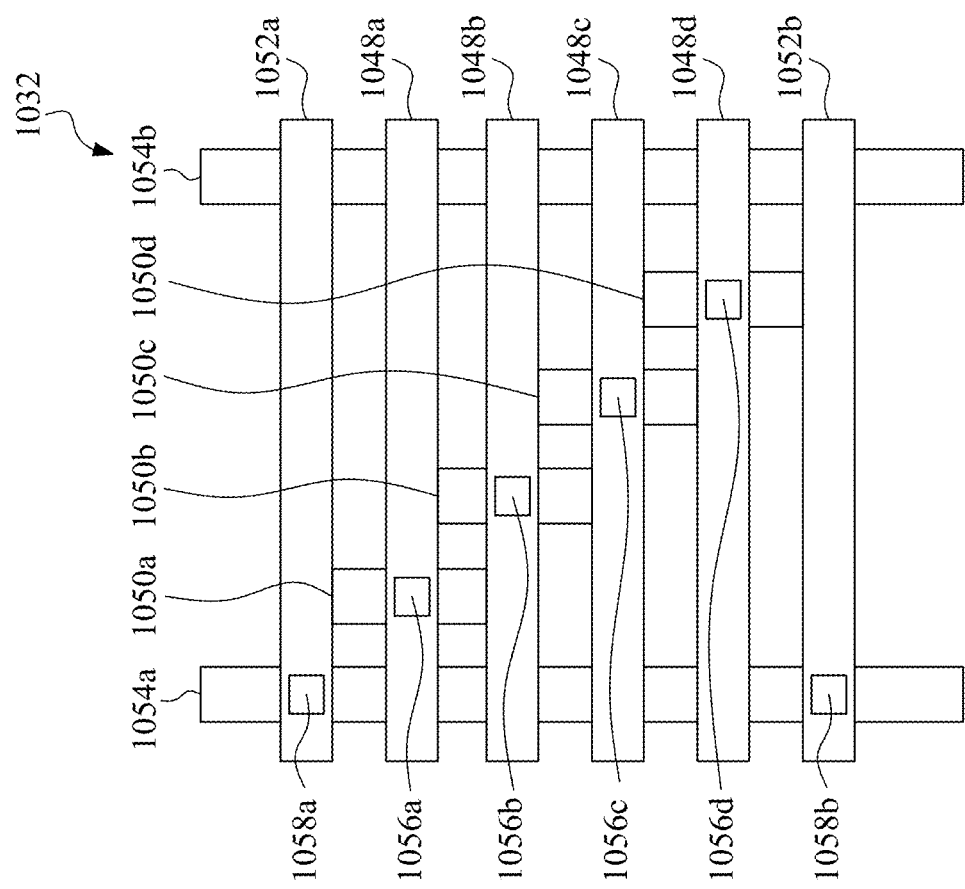
FIG. 23 is a diagram schematically illustrating a memory device that includes active bit lines electrically connected to metal layer lines, and bypassed bit lines electrically connected to a metal layer line, in accordance with some embodiments.
Figure 24:
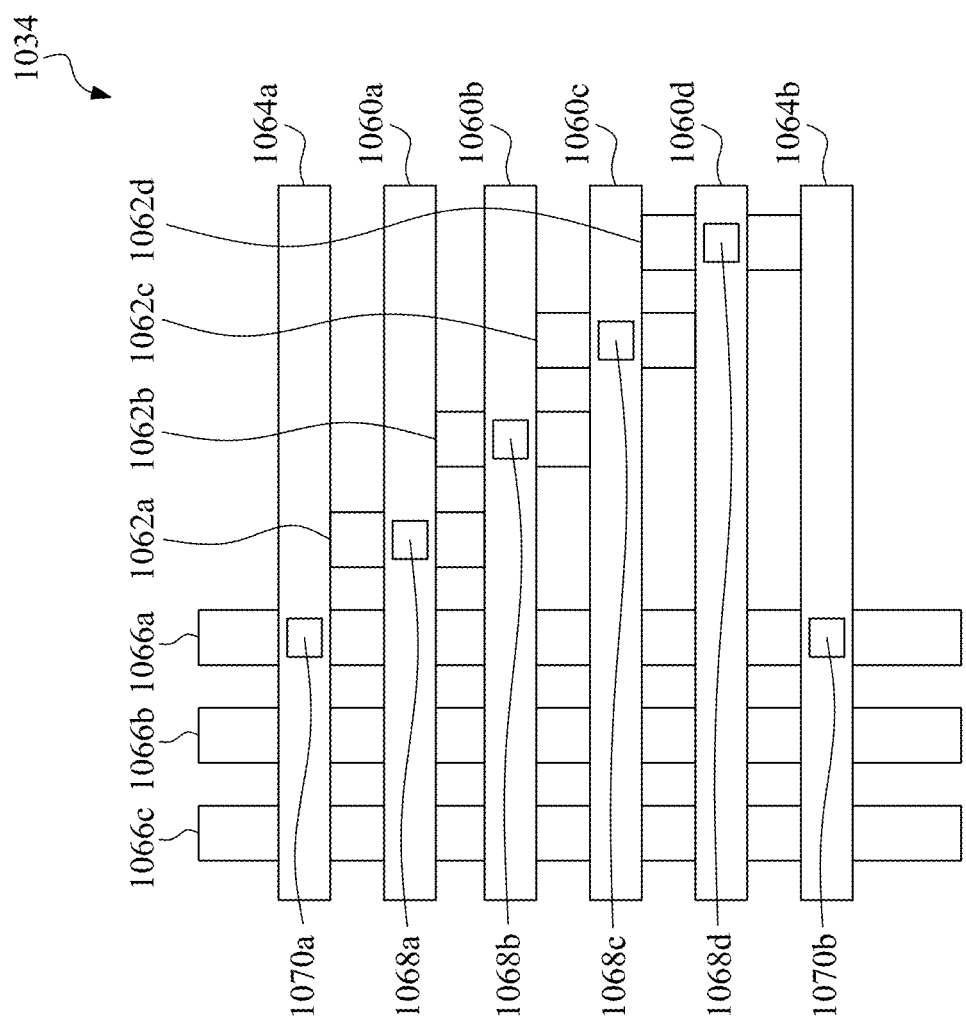
FIG. 24 is a diagram schematically illustrating a memory device that includes active bit lines electrically connected to metal layer lines, and bypassed bit lines electrically connected to a metal layer line, in accordance with some embodiments.

FIGS. 22-24 are diagrams schematically illustrating memory devices 1030, 1032, and 1034 that have different bit line connections for bypassed bit lines. In some embodiments, the different bit line connections of one or more of the memory devices 1030, 1032, and 1034 are used in one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

FIG. 22 is a diagram schematically illustrating the memory device 1030 that includes active bit lines 1036a-1036d electrically connected to metal layer lines 1038a-1038d, and bypassed bit lines 1040a and 1040b electrically connected to metal layer lines 1042a and 1042b, in accordance with some embodiments. The active bit lines 1036a-1036d and the bypassed bit lines 1040a and 1040b are seventh metal layer M6 lines that extend in the x-direction, along the x-axis. The metal layer lines 1038a-1038d and the metal layer lines 1042a and 1042b are sixth metal layer M5 lines that extend in the y-direction, along the y-axis. The metal layer lines 1038a-1038d can be used to jog conductive paths in the y-direction. In other embodiments, the active bit lines 1036a-1036d and the bypassed bit lines 1040a and 1040b can be different metal layer lines that extend in the x-direction or the y-direction. Also, in other embodiments, the metal layer lines 1038a-1038d and the metal layer lines 1042a and 1042b can be different metal layer lines that extend in the x-direction or the y-direction.

The active bit lines 1036a-1036d are electrically connected to the metal layer lines 1038a-1038d at connections that cascade in a stair-step arrangement from the left side to the right side of FIG. 22. The bit line 1036a is electrically connected to the metal layer line 1038a through a via 1044a, the bit line 1036b is electrically connected to the metal layer line 1038b through a via 1044b, the bit line 1036c is electrically connected to the metal layer line 1038c through a via 1044c, and the bit line 1036d is electrically connected to the metal layer line 1038d through a via 1044d.

The bypassed bit lines 1040a and 1040b are electrically connected to the metal layer lines 1042a and 1042b that are situated on each side of the metal layer lines 1038a-1038d electrically connected to the active bit lines 1036a-1036d. The bypassed bit line 1040a is electrically connected to the metal layer line 1042a through a via 1046a, and the bypassed bit line 1040b is electrically connected to the metal layer line 1042b through a via 1046b. In some embodiments, the metal layer lines 1042a and 1042b are electrically connected to a reference voltage Vref.

FIG. 23 is a diagram schematically illustrating the memory device 1032 that includes active bit lines 1048a-1048d electrically connected to metal layer lines 1050a-1050d, and bypassed bit lines 1052a and 1052b electrically connected to metal layer line 1054a, in accordance with some embodiments. The active bit lines 1048a-1048d and the bypassed bit lines 1052a and 1052b are seventh metal layer M6 lines that extend in the x-direction, along the x-axis. The metal layer lines 1050a-1050d and the metal layer lines 1054a and 1054b are sixth metal layer M5 lines that extend in the y-direction, along the y-axis. The metal layer lines 1050a-1050d can be used to jog conductive paths in the y-direction. In other embodiments, the active bit lines 1048a-1048d and the bypassed bit lines 1052a and 1052b can be different metal layer lines that extend in the x-direction or the y-direction. Also, in other embodiments, the metal layer lines 1050a-1050d and the metal layer lines 1054a and 1054b can be different metal layer lines that extend in the x-direction or the y-direction.

The active bit lines 1048a-1048d are electrically connected to the metal layer lines 1050a-1050d at connections that cascade in a stair-step arrangement from the left side to the right side of FIG. 23. The bit line 1048a is electrically connected to the metal layer line 1050a through a via 1056a, the bit line 1048b is electrically connected to the metal layer line 1050b through a via 1056b, the bit line 1048c is electrically connected to the metal layer line 1050c through a via 1056c, and the bit line 1048d is electrically connected to the metal layer line 1050d through a via 1056d.

The metal layer lines 1054a and 1054b are situated on each side of the metal layer lines 1050a-1050d that are electrically connected to the active bit lines 1048a-1048d. The bypassed bit line 1052a is electrically connected to the metal layer line 1054a through a via 1058a and the bypassed bit line 1052b is electrically connected to the metal layer line 1054a through a via 1058b. In some embodiments, the metal layer line 1054b is electrically connected to one or more of the bypassed bit lines 1052a and 1052b. In some embodiments, the metal layer line 1054a is electrically connected to a reference voltage Vref. In some embodiments, the metal layer line 1054b is electrically connected to a reference voltage Vref.

FIG. 24 is a diagram schematically illustrating the memory device 1034 that includes active bit lines 1060a-1060d electrically connected to metal layer lines 1062a-1062d, and bypassed bit lines 1064a and 1064b electrically connected to metal layer line 1066a, with metal layer lines 1066b and 1066c to the left side of the metal layer lines 1062a-1062d, in accordance with some embodiments. The active bit lines 1060a-1060d and the bypassed bit lines 1064a and 1064b are seventh metal layer M6 lines that extend in the x-direction, along the x-axis. The metal layer lines 1062a-1062d and the metal layer lines 1066a-1066c are sixth metal layer M5 lines that extend in the y-direction, along the y-axis. The metal layer lines 1062a-1062d can be used to jog conductive paths in the y-direction. In other embodiments, the active bit lines 1060a-1060d and the bypassed bit lines 1064a and 1064b can be different metal layer lines that extend in the x-direction or the y-direction. Also, in other embodiments, the metal layer lines 1062a-1062d and the metal layer lines 1066a-1066c can be different metal layer lines that extend in the x-direction or the y-direction.

The active bit lines 1060a-1060d are electrically connected to the metal layer lines 1062a-1062d at connections that cascade in a stair-step arrangement from the left side to the right side of FIG. 24. The bit line 1060a is electrically connected to the metal layer line 1062a through a via 1068a, the bit line 1060b is electrically connected to the metal layer line 1062b through a via 1068b, the bit line 1060c is electrically connected to the metal layer line 1062c through a via 1068c, and the bit line 1060d is electrically connected to the metal layer line 1062d through a via 1068d.

The metal layer lines 1066a-1066c are situated on the left side of the metal layer lines 1062a-1062d that are electrically connected to the active bit lines 1060a-1060d. The bypassed bit line 1064a is electrically connected to the metal layer line 1066a through a via 1070a and the bypassed bit line 1064b is electrically connected to the metal layer line 1066a through a via 1070b. In some embodiments, one or more of the metal layer lines 1066b and 1066c is electrically connected to one or more of the bypassed bit lines 1064a and 1064b. In some embodiments, the metal layer line 1066a is electrically connected to a reference voltage Vref. In some embodiments, one or more of the metal layer lines 1066b and 1066c are electrically connected to a reference voltage Vref.

Figure 25:
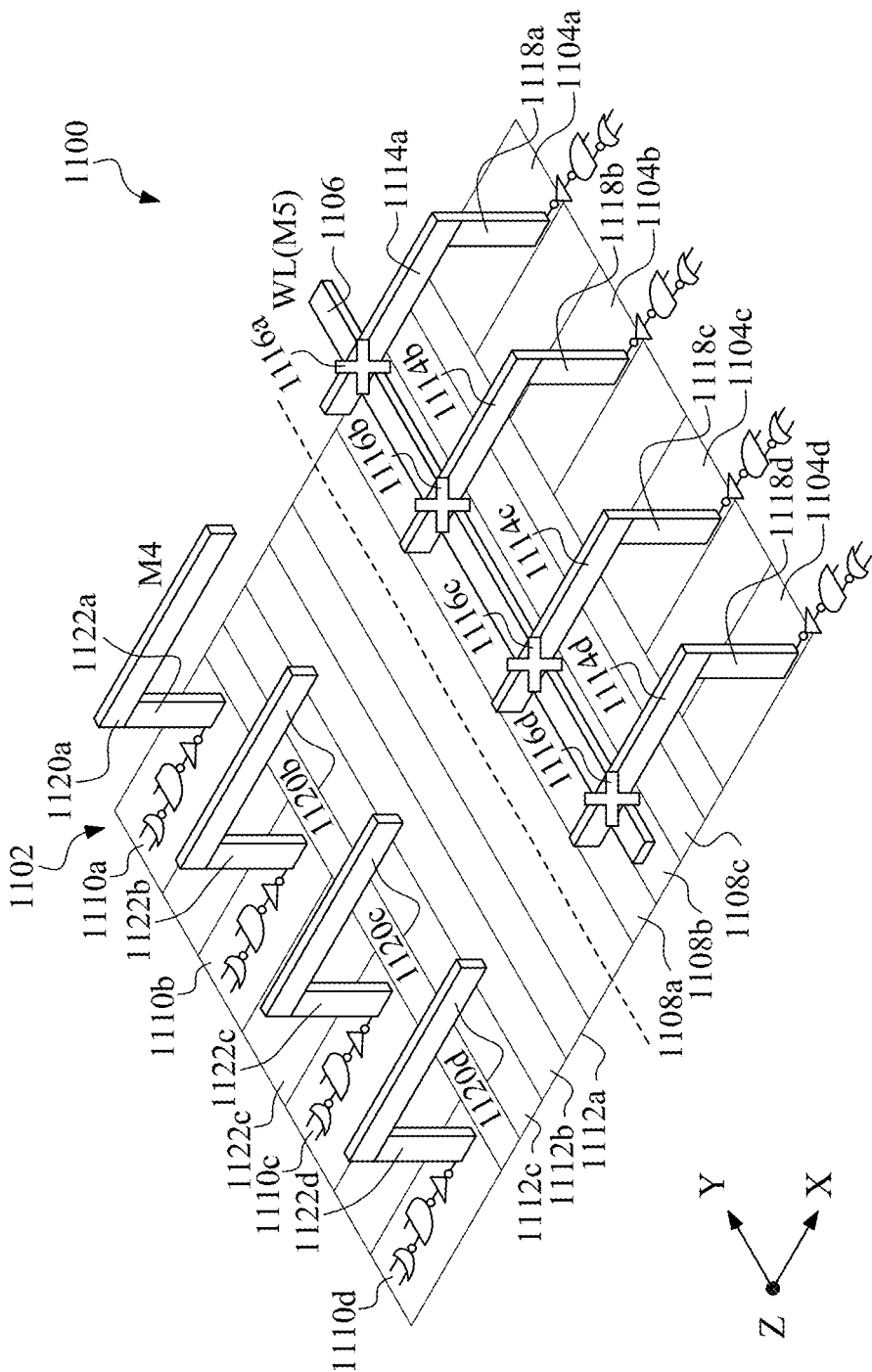
FIG. 25 is a diagram schematically illustrating a memory device that includes peripheral circuits that include first word line drivers electrically connected to a word line, in accordance with some embodiments.

FIG. 25 is a diagram schematically illustrating a memory device 1100 that includes peripheral circuits 1102 that include first word line drivers 1104a-1104d electrically connected to a word line 1106, in accordance with some embodiments. In some embodiments, the memory device 1100 is like one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

The peripheral circuits 1102 include the first word line drivers 1104a-1104d and first SAs 1108a-1108c situated under a first memory array (not shown in FIG. 25), and second word line drivers 1110a-1110d and second SAs 1112a-1112c situated under a second memory array (not shown in FIG. 25). In the memory device 1100, word lines of the first and second memory arrays, such as the word line 1106, extend in the y-direction, along the y-axis, and bit lines of the first and second memory arrays extend in the x-direction, along the x-axis. In some embodiments, the peripheral circuits 1102 are like the peripheral circuits 24 and/or the peripheral circuits 28 (shown in FIG. 1). In some embodiments, the peripheral circuits 1102 are like the peripheral circuits 66 (shown in FIG. 2). In some embodiments, the peripheral circuits 1102 are like the peripheral circuits 304 and/or the peripheral circuits 308 (shown in FIG. 5). In some embodiments, the peripheral circuits 1102 are like the peripheral circuits 346 (shown in FIG. 6).

The word line 1106 is a sixth metal layer M5 line that is electrically connected to first fifth metal layer M4 lines 1114a-1114d by vias 1116a-1116d, respectively. The first fifth metal layer M4 lines 1114a-1114d are electrically connected to the first word line drivers 1104a-1104d through first conductive paths 1118a-1118d. That is, the first fifth metal layer M4 line 1114a is electrically connected to the first word line driver 1104a through first conductive path 1118a, the first fifth metal layer M4 line 1114b is electrically connected to the first word line driver 1104b through first conductive path 1118b, the first fifth metal layer M4 line 1114c is electrically connected to the first word line driver 1104c through first conductive path 1118c, and the first fifth metal layer M4 line 1114d is electrically connected to the first word line driver 1104d through first conductive path 1118d. The first conductive paths 1118a-1118d extend in the z-direction, along the z-axis. In this configuration, one or more of the first word lines drivers 1104a-1104d, up to all the first word line drivers 1104a-1104d, can be used to simultaneously drive the word line 1106.

The second word line drivers 1110a-1110d are electrically connected to second fifth metal layer M4 lines 1120a-1120d through second conductive paths 1122a-1122d. The second word line driver 1110a is electrically connected to second fifth metal layer M4 line 1120a through second conductive path 1122a, the second word line driver 1110b is electrically connected to second fifth metal layer M4 line 1120b through second conductive path 1122b, the second word line driver 1110c is electrically connected to second fifth metal layer M4 line 1120c through second conductive path 1122c, and the second word line driver 1110d is electrically connected to second fifth metal layer M4 line 1120d through second conductive path 1122d. The second conductive paths 1122a-1122d extend in the z-direction, along the z-axis. The second fifth metal layer M4 lines 1120a-1120d are connected singly or in groups to word lines of the second memory array.

The first word line drivers 1104a-1104d and the second word line drivers 1110a-1110d are connected through the first conductive paths 1118a-1118d and the second conductive paths 1122a-1122d, respectively, to word lines in the first and second memory arrays. This can be done without changing the placement of the first word line drivers 1104a-1104d and the second word line drivers 1110a-1110d. Also, the same word line driver layouts can be used in memory arrays that have different bit line and word line pitches.

FIGS. 26 and 27 are diagrams schematically illustrating a first memory device 1140 and a second memory device 1142 that have memory arrays with different bit line pitches and different word line pitches. The first memory device 1140 has a memory array that has smaller bit line and word line pitches, and the second memory device 1142 has a memory array that has larger bit line and word line pitches. The same word line drivers 1144, such as the same layouts of the word line drivers 1144, are electrically connected to the memory array with the smaller bit line and word line pitches in the first memory device 1140 and to the memory array with the larger bit line and word line pitches in the second memory device 1142.

In some embodiments, using different bit line pitches and different word line pitches with the same word line drivers 1144, such as the same layouts of the word line drivers 1144, is part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18. In some embodiments, the first memory device 1140 is like or part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18. In some embodiments, the second memory device 1142 is like or part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

FIG. 26 is a diagram schematically illustrating the first memory device 1140 that includes the word line drivers 1144 electrically connected to first word lines 1146a-1146c that have a smaller word line pitch P1, in accordance with some embodiments. The first word lines 1146a-1146c are electrically connected to the word line drivers 1144 through conductive paths that extend in the z-direction and include fifth metal layer M4 lines 1148a-1148c. The first word lines 1146a-1146c are electrically connected to the word line drivers 1144 through the conductive paths without changing the placement of the word line drivers 1144.

The first word lines 1146a-1146c are sixth metal layer M5 lines that are electrically connected to the fifth metal layer M4 lines 1148a-1148c through vias 1150a-1150c. The first word line 1146a is electrically connected to fifth metal layer M4 line 1148a through via 1150a, the first word line 1146b is electrically connected to fifth metal layer M4 line 1148b through via 1150b, and the first word line 1146c is electrically connected to fifth metal layer M4 line 1148c through via 1150c.

FIG. 27 is a diagram schematically illustrating the second memory device 1142 that includes the word line drivers 1144 electrically connected to second word lines 1152a-1152c that have a larger word line pitch P2, in accordance with some embodiments. The second word lines 1152a-1152c extend in the y-direction, along the y-axis, and are spread-out further in the x-direction than the first word lines 1146a-1146c due to the word line pitch P2 being larger than the word line pitch P1. The second word lines 1152a-1152c are electrically connected to the word line drivers 1144 through conductive paths that extend in the z-direction and include fifth metal layer M4 lines 1154a-1154c that extend in the x-direction, along the x-axis. The second word lines 1152a-1152c are electrically connected to the word line drivers 1144 through the conductive paths without changing the placement of the word line drivers 1144.

The second word lines 1152a-1152c are sixth metal layer M5 lines that are electrically connected to the fifth metal layer M4 lines 1154a-1154c through vias 1156a-1156c. The second word line 1152a is electrically connected to fifth metal layer M4 line 1154a through via 1156a, the second word line 1152b is electrically connected to fifth metal layer M4 line 1154b through via 1156b, and the second word line 1152c is electrically connected to fifth metal layer M4 line 1154c through via 1156c. Using the fifth metal layer M4 lines 1154a-1154c that extend in the x-direction, the second word lines 1152a-1152c with the larger word line pitch P2 can be electrically connected to the word line drivers 1144 without changing the placement of the word line drivers 1144.

FIGS. 28 and 29 are diagrams schematically illustrating memory devices 1200 and 1202 that have different word line connections to word line drivers 1204. In some embodiments, the word line connections of the memory device 1200 are like word line connections in or part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18. In some embodiments, the word line connections of the memory device 1202 are like word line connections in or part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

FIG. 28 is a diagram schematically illustrating the memory device 1200 that includes the word line drivers 1204 electrically connected to word lines 1206a-1206d through metal layer lines 1208a-1208d, in accordance with some embodiments. The word lines 1206a-1206d are sixth metal layer M5 lines that extend in the y-direction, along the y-axis. The metal layer lines 1208a-1208d are fifth metal layer M4 lines that extend in the x-direction, along the x-axis. In other embodiments, the word lines 1206a-1206d can be different metal layer lines that extend in the x-direction or the y-direction. Also, in other embodiments, the metal layer lines 1208a-1208d can be different metal layer lines that extend in the x-direction or the y-direction.

The word lines 1206a-1206d are electrically connected to the metal layer lines 1208a-1208d at connections that cascade in a stair-step arrangement from the right side to the left side of FIG. 28. The word line 1206a is electrically connected to the metal layer line 1208a through a via 1210a, the word line 1206b is electrically connected to the metal layer line 1208b through a via 1210b, the word line 1206c is electrically connected to the metal layer line 1208c through a via 1210c, and the word line 1206d is electrically connected to the metal layer line 1208d through a via 1210d.

FIG. 29 is a diagram schematically illustrating the memory device 1202 that includes word lines 1212a-1212d electrically connected to metal layer lines 1214a-1214d in a staggered connection arrangement, in accordance with some embodiments. The word lines 1212a-1212d are sixth metal layer M5 lines that extend in the y-direction, along the y-axis. The metal layer lines 1214a-1214d are fifth metal layer M4 lines that extend in the x-direction, along the x-axis. In other embodiments, the word lines 1212a-1212d can be different metal layer lines that extend in the x-direction or the y-direction. Also, in other embodiments, the metal layer lines 1214a-1214d can be different metal layer lines that extend in the x-direction or the y-direction.

The word lines 1212a-1212d are electrically connected to the metal layer lines 1214a-1214d in an alternating, staggered connection arrangement from the right side to the left side of FIG. 29. The word line 1212a is electrically connected to the metal layer line 1214a through a via 1216a, the word line 1212c is electrically connected to the metal layer line 1214c through a via 1216c, the word line 1212b is electrically connected to the metal layer line 1214b through a via 1216b, and the word line 1212d is electrically connected to the metal layer line 1214d through a via 1216d.

Figure 30:
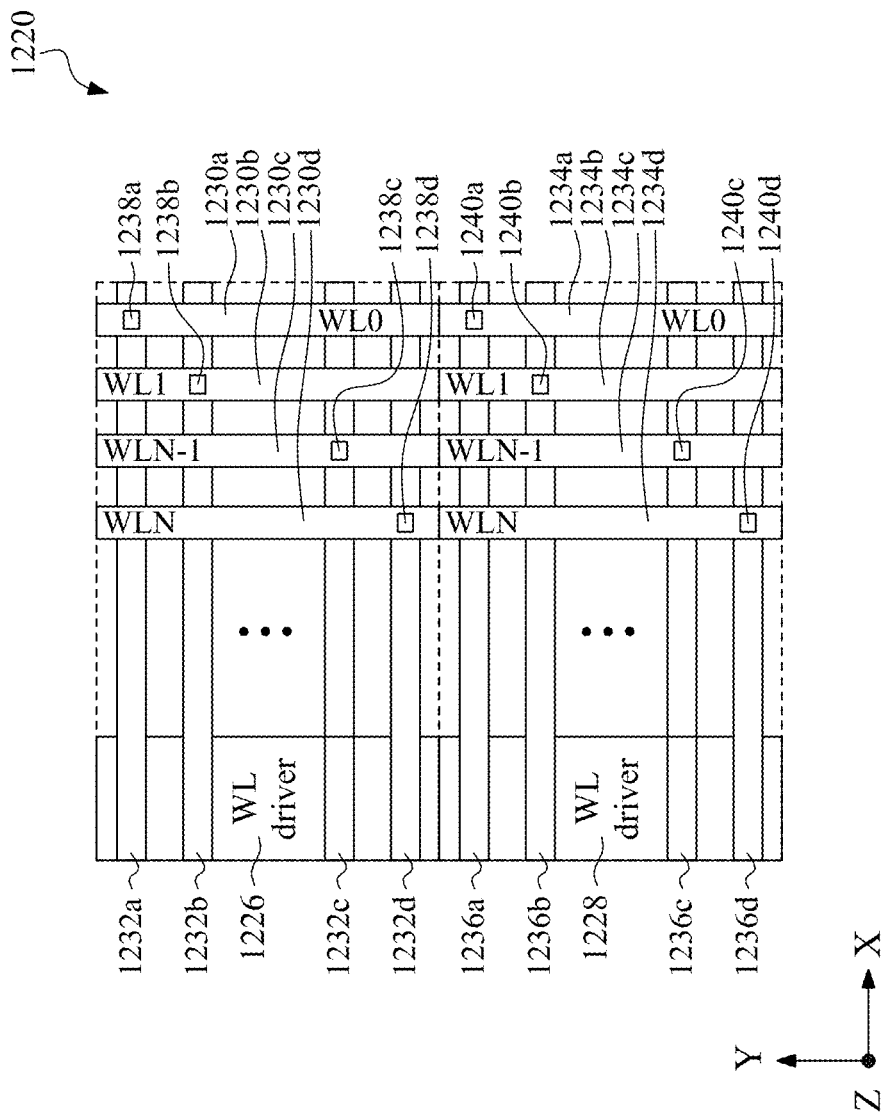
FIG. 30 is a diagram schematically illustrating a memory device that includes word line drivers, in accordance with some embodiments.
Figure 31:
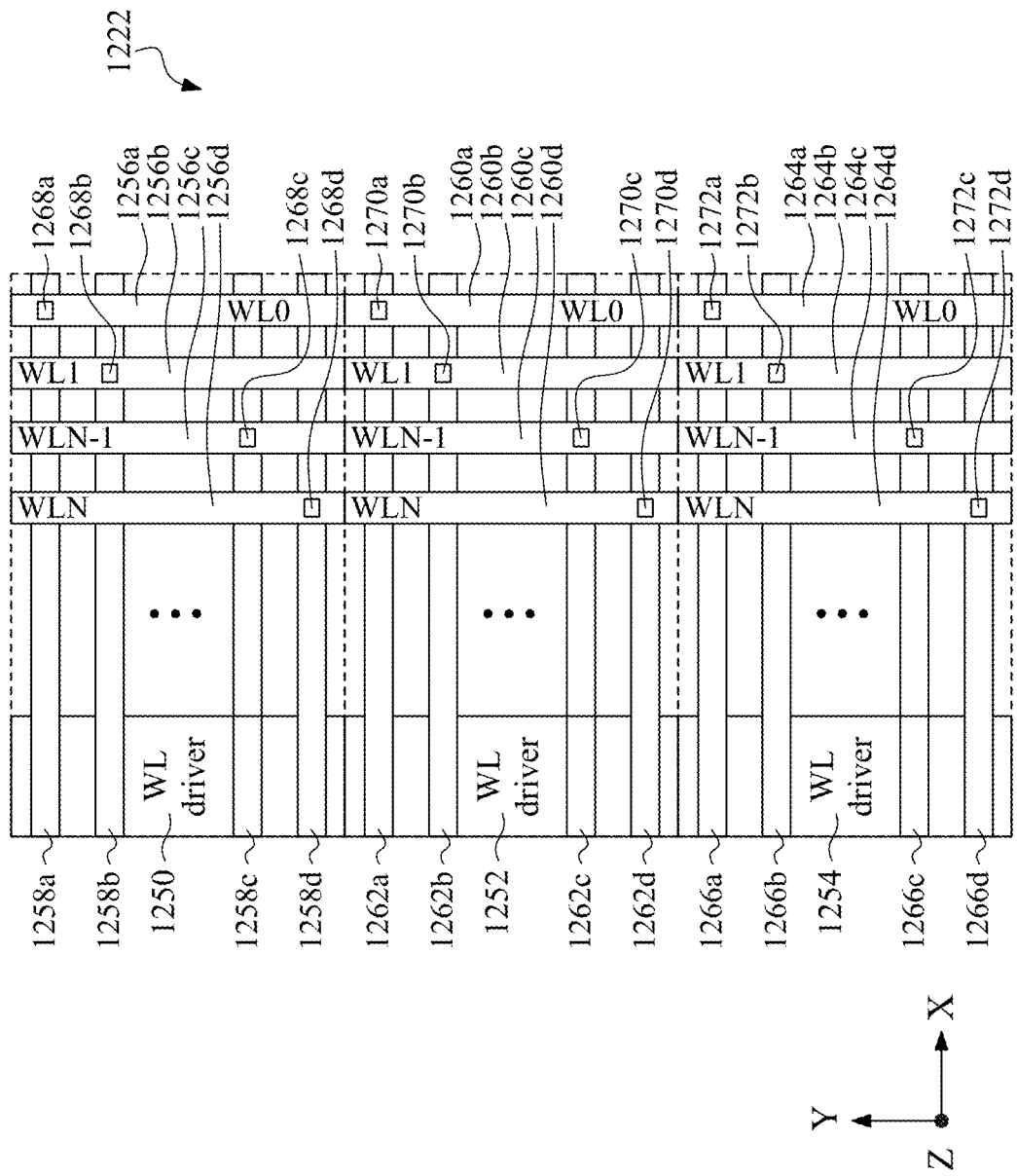
FIG. 31 is a diagram schematically illustrating a memory device that includes word line drivers, in accordance with some embodiments.
Figure 32:
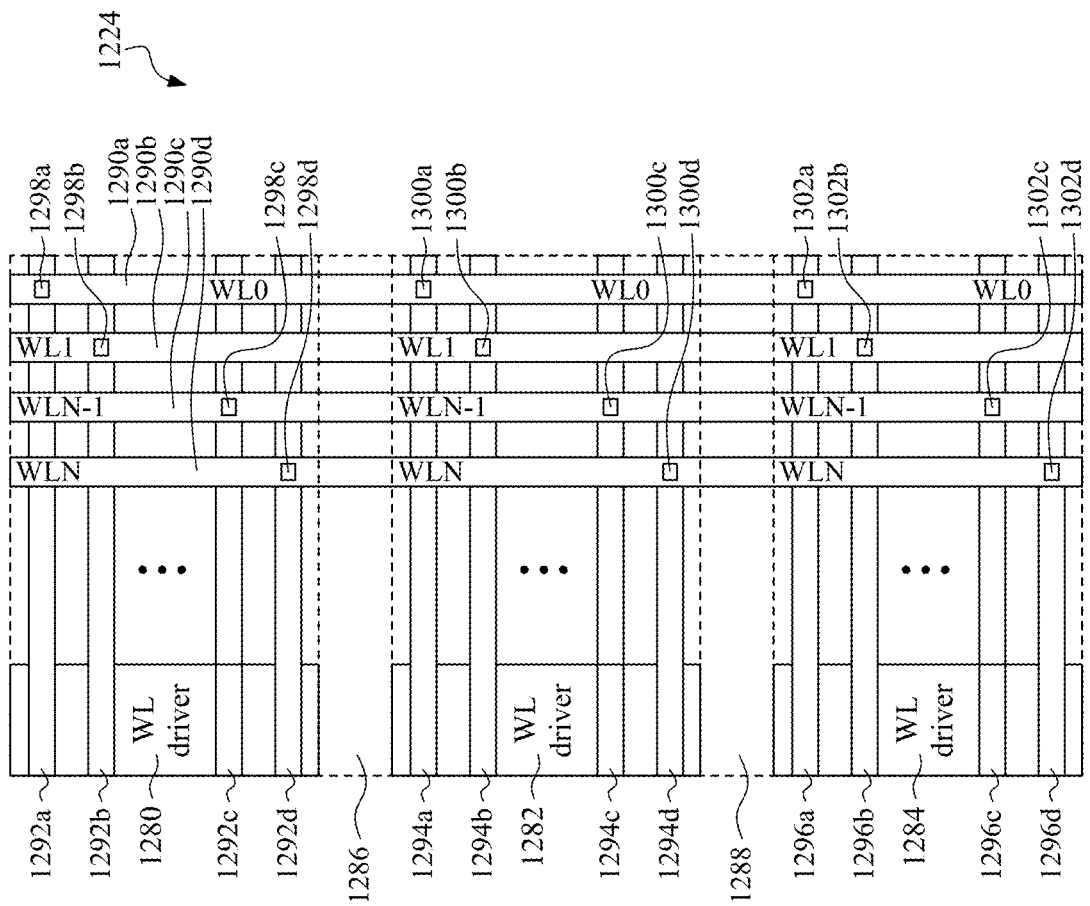
FIG. 32 is a diagram schematically illustrating a memory device that includes word line drivers spaced apart by semiconductor areas, in accordance with some embodiments.

FIGS. 30-32 are diagrams schematically illustrating memory devices 1220, 1222, and 1224 that include multiple word line drivers and multiple word line driver placement to enhance word line speed. In some embodiments, the multiple word line drivers are placed and used in combination to drive word lines to enhance or speed-up access times through the word lines. In some embodiments, the placement and use of the word line drivers in the memory device 1220 is like the placement and use of the word line drivers in one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18. In some embodiments, the placement and use of the word line drivers in the memory device 1222 is like the placement and use of the word line drivers in one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18. In some embodiments, the placement and use of the word line drivers in the memory device 1224 is like the placement and use of the word line drivers in one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

FIG. 30 is a diagram schematically illustrating the memory device 1220 that includes word line drivers 1226 and 1228, in accordance with some embodiments. The memory device 1220 includes the word line driver 1226 electrically connected to word lines 1230a-1230d through conductive paths that include metal layer lines 1232a-1232d, and the word line driver 1228 electrically connected to word lines 1234a-1234d through conductive paths that include metal layer lines 1236a-1236d. The word lines 1230a-1230d and 1234a-1234d are sixth metal layer M5 lines that extend in the y-direction, along the y-axis. The metal layer lines 1232a-1232d and 1236a-1236d are fifth metal layer M4 lines that extend in the x-direction, along the x-axis. In some embodiments, the word lines 1230a-1230d are electrically connected to the word lines 1234a-1234d, respectively. Also, in other embodiments, the word lines 1230a-1230d and 1234a-1234d can be different metal layer lines that extend in the x-direction or the y-direction. Also, in other embodiments, the metal layer lines 1232a-1232d and 1236a-1236d can be different metal layer lines that extend in the x-direction or the y-direction.

The word lines 1230a-1230d are electrically connected to the metal layer lines 1232a-1232d at connections that cascade in a stair-step arrangement from the right side to the left side of FIG. 30. The word line 1230a is electrically connected to the metal layer line 1232a through a via 1238a, the word line 1230b is electrically connected to the metal layer line 1232b through a via 1238b, the word line 1230c is electrically connected to the metal layer line 1232c through a via 1238c, and the word line 1230d is electrically connected to the metal layer line 1232d through a via 1238d. In other embodiments, the word lines 1230a-1230d can be electrically connected to the metal layer lines 1232a-1232d at connections in a different arrangement, such as a staggered arrangement like in the memory device 1202 of FIG. 29.

The word lines 1234a-1234d are electrically connected to the metal layer lines 1236a-1236d at connections that cascade in a stair-step arrangement from the right side to the left side of FIG. 30. The word line 1234a is electrically connected to the metal layer line 1236a through a via 1240a, the word line 1234b is electrically connected to the metal layer line 1236b through a via 1240b, the word line 1234c is electrically connected to the metal layer line 1236c through a via 1240c, and the word line 1234d is electrically connected to the metal layer line 1236d through a via 1240d. In other embodiments, the word lines 1234a-1234d can be electrically connected to the metal layer lines 1236a-1236d at connections in a different arrangement, such as a staggered arrangement like in the memory device 1202 of FIG. 29.

In some embodiments, the word line drivers 1226 and 1228 are used in combination to drive word lines WL0, WL1, WLN−1, and WLN to enhance or speed-up access times through the word lines WL0, WL1, WLN−1, and WLN. In some embodiments, the word line drivers 1226 and 1228 are placed or situated in the memory device 1220 to enhance or speed-up access times through the word lines WL0, WL1, WLN−1, and WLN.

FIG. 31 is a diagram schematically illustrating the memory device 1222 that includes word line drivers 1250, 1252, and 1254, in accordance with some embodiments. The memory device 1222 includes the word line driver 1250 electrically connected to word lines 1256a-1256d through conductive paths that include metal layer lines 1258a-1258d, the word line driver 1252 electrically connected to word lines 1260a-1260d through conductive paths that include metal layer lines 1262a-1262d, and the word line driver 1254 electrically connected to the word lines 1264a-1264d through conductive paths that include metal layer lines 1266a-1266d. The word lines 1256a-1256d, 1260a-1260d, and 1264a-1264d are sixth metal layer M5 lines that extend in the y-direction, along the y-axis. The metal layer lines 1258a-1258d, 1262a-1262d, and 1266a-1266d are fifth metal layer M4 lines that extend in the x-direction, along the x-axis. In some embodiments, the word lines 1256a-1256d are electrically connected to the word lines 1260a-1260d, respectively, and the word lines 1260a-1260d are electrically connected to the word lines 1264a-1264d, respectively. Also, in other embodiments, the word lines 1256a-1256d, 1260a-1260d, and 1264a-1264d can be different metal layer lines that extend in the x-direction or the y-direction. Also, in other embodiments, the metal layer lines 1258a-1258d, 1262a-1262d, and 1266a-1266d can be different metal layer lines that extend in the x-direction or the y-direction.

The word lines 1256a-1256d are electrically connected to the metal layer lines 1258a-1258d at connections that cascade in a stair-step arrangement from the right side to the left side of FIG. 31. The word line 1256a is electrically connected to the metal layer line 1258a through a via 1268a, the word line 1256b is electrically connected to the metal layer line 1258b through a via 1268b, the word line 1256c is electrically connected to the metal layer line 1258c through a via 1268c, and the word line 1256d is electrically connected to the metal layer line 1258d through a via 1268d. In other embodiments, the word lines 1256a-1256d can be electrically connected to the metal layer lines 1258a-1258d at connections in a different arrangement, such as a staggered arrangement like in the memory device 1202 of FIG. 29.

The word lines 1260a-1260d are electrically connected to the metal layer lines 1262a-1262d at connections that cascade in a stair-step arrangement from the right side to the left side of FIG. 31. The word line 1260a is electrically connected to the metal layer line 1262a through a via 1270a, the word line 1260b is electrically connected to the metal layer line 1262b through a via 1270b, the word line 1260c is electrically connected to the metal layer line 1262c through a via 1270c, and the word line 1260d is electrically connected to the metal layer line 1262d through a via 1270d. In other embodiments, the word lines 1260a-1260d can be electrically connected to the metal layer lines 1262a-1262d at connections in a different arrangement, such as a staggered arrangement like in the memory device 1202 of FIG. 29.

The word lines 1264a-1264d are electrically connected to the metal layer lines 1266a-1266d at connections that cascade in a stair-step arrangement from the right side to the left side of FIG. 31. The word line 1264a is electrically connected to the metal layer line 1266a through a via 1272a, the word line 1264b is electrically connected to the metal layer line 1266b through a via 1272b, the word line 1264c is electrically connected to the metal layer line 1266c through a via 1272c, and the word line 1264d is electrically connected to the metal layer line 1266d through a via 1272d. In other embodiments, the word lines 1264a-1264d can be electrically connected to the metal layer lines 1266a-1266d at connections in a different arrangement, such as a staggered arrangement like in the memory device 1202 of FIG. 29.

In some embodiments, the word line drivers 1250, 1252, and 1254 are used in combination to drive word lines WL0, WL1, WLN-1, and WLN to enhance or speed-up access times through the word lines WL0, WL1, WLN-1, and WLN. In some embodiments, the word line drivers 1250, 1252, and 1254 are placed or situated in the memory device 1222 to enhance or speed-up access times through the word lines WL0, WL1, WLN-1, and WLN.

FIG. 32 is a diagram schematically illustrating the memory device 1224 that includes word line drivers 1280, 1282, and 1284 spaced apart by semiconductor areas 1286 and 1288, in accordance with some embodiments. In some embodiments, the semiconductor areas 1286 and 1288 are used for other circuits and/or routing channels in the memory device 1224. In some embodiments, the semiconductor areas 1286 and 1288 are unused areas in the memory device 1224.

The memory device 1224 includes the word line driver 1280 electrically connected to word lines 1290a-1290d through conductive paths that include metal layer lines 1292a-1292d, the word line driver 1282 electrically connected to the word lines 1290a-1290d through conductive paths that include metal layer lines 1294a-1294d, and the word line driver 1284 electrically connected to the word lines 1290a-1290d through conductive paths that include metal layer lines 1296a-1296d. The word lines 1290a-1290d are sixth metal layer M5 lines that extend in the y-direction, along the y-axis. The metal layer lines 1292a-1292d, 1294a-1294d, and 1296a-1296d are fifth metal layer M4 lines that extend in the x-direction, along the x-axis. Also, in other embodiments, the word lines 1290a-1290d can be different metal layer lines that extend in the x-direction or the y-direction. Also, in other embodiments, the metal layer lines 1292a-1292d, 1294a-1294d, and 1296a-1296d can be different metal layer lines that extend in the x-direction or the y-direction.

The word lines 1290a-1290d are electrically connected to the metal layer lines 1292a-1292d at connections that cascade in a stair-step arrangement from the right side to the left side of FIG. 32. The word line 1290a is electrically connected to the metal layer line 1292a through a via 1298a, the word line 1290b is electrically connected to the metal layer line 1292b through a via 1298b, the word line 1290c is electrically connected to the metal layer line 1292c through a via 1298c, and the word line 1290d is electrically connected to the metal layer line 1292d through a via 1298d. In other embodiments, the word lines 1290a-1290d can be electrically connected to the metal layer lines 1292a-1292d at connections in a different arrangement, such as a staggered arrangement like in the memory device 1202 of FIG. 29.

The word lines 1290a-1290d are electrically connected to the metal layer lines 1294a-1294d at connections that cascade in a stair-step arrangement from the right side to the left side of FIG. 32. The word line 1290a is electrically connected to the metal layer line 1294a through a via 1300a, the word line 1290b is electrically connected to the metal layer line 1294b through a via 1300b, the word line 1290c is electrically connected to the metal layer line 1294c through a via 1300c, and the word line 1290d is electrically connected to the metal layer line 1294d through a via 1300d. In other embodiments, the word lines 1290a-1290d can be electrically connected to the metal layer lines 1294a-1294d at connections in a different arrangement, such as a staggered arrangement like in the memory device 1202 of FIG. 29.

The word lines 1290a-1290d are electrically connected to the metal layer lines 1296a-1296d at connections that cascade in a stair-step arrangement from the right side to the left side of FIG. 32. The word line 1290a is electrically connected to the metal layer line 1296a through a via 1302a, the word line 1290b is electrically connected to the metal layer line 1296b through a via 1302b, the word line 1290c is electrically connected to the metal layer line 1296c through a via 1302c, and the word line 1290d is electrically connected to the metal layer line 1296d through a via 1302d. In other embodiments, the word lines 1290a-1290d can be electrically connected to the metal layer lines 1296a-1296d at connections in a different arrangement, such as a staggered arrangement like in the memory device 1202 of FIG. 29.

In some embodiments, the word line drivers 1280, 1282, and 1284 are used in combination to drive word lines WL0, WL1, WLN−1, and WLN to enhance or speed-up access times through the word lines WL0, WL1, WLN−1, and WLN. In some embodiments, the word line drivers 1280, 1282, and 1284 are placed or situated in the memory device 1224 to enhance or speed-up access times through the word lines WL0, WL1, WLN−1, and WLN.

Figure 33:
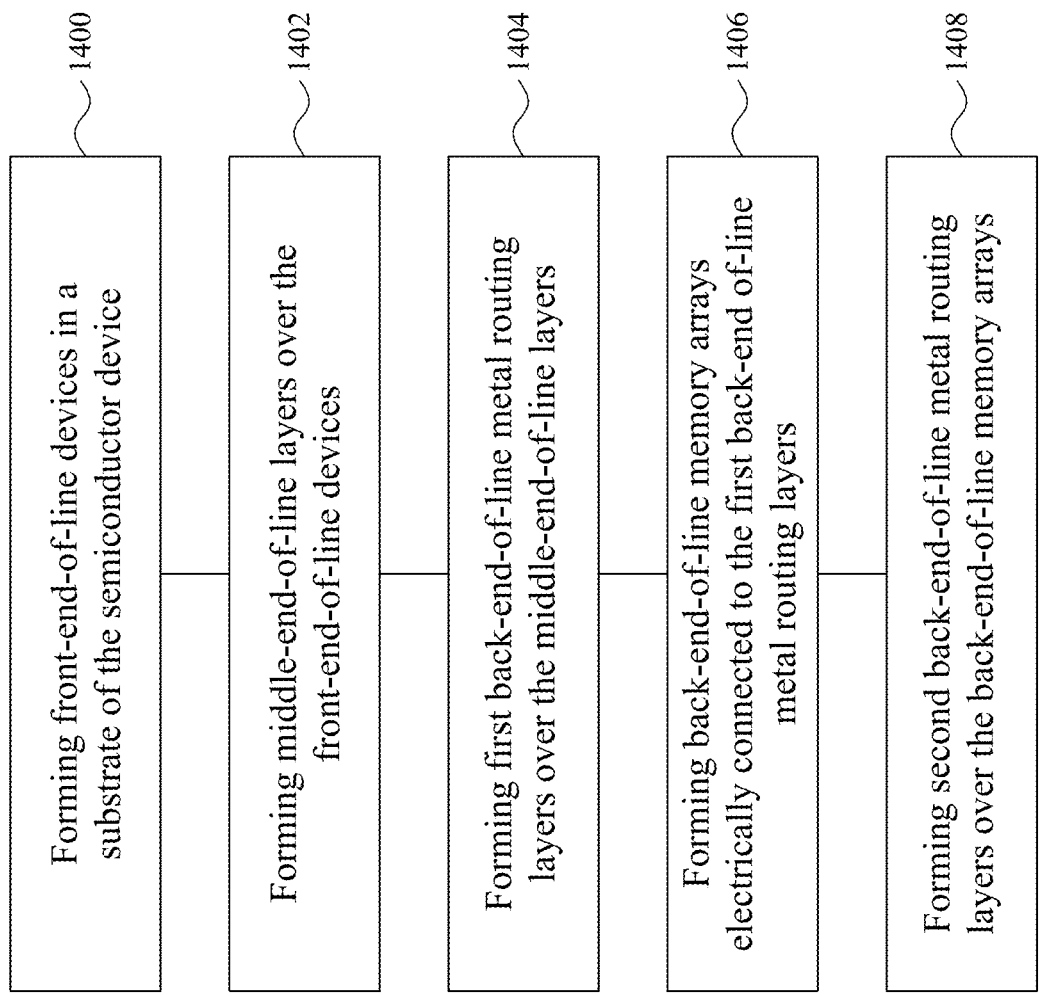
FIG. 33 is a diagram schematically illustrating a method of manufacturing a semiconductor device, such as a memory device, in accordance with some embodiments.

FIG. 33 is a diagram schematically illustrating a method of manufacturing a semiconductor device, such as a memory device, in accordance with some embodiments. In some embodiments, the method of manufacturing the semiconductor device is used to manufacture one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18.

At step 1400, the method includes forming FEOL devices in a substrate of the semiconductor device. In some embodiments, forming FEOL devices includes forming gate structures that include isolation regions and metal gates. In some embodiments, forming FEOL devices includes forming S/D regions in the substrate.

In some embodiments, forming FEOL devices includes forming a first sense amplifier, forming a first word line driver adjacent the first sense amplifier, forming a second sense amplifier, and forming a second word line driver adjacent the second sense amplifier. In some embodiments, forming FEOL devices includes forming the first sense amplifier and the first word line driver spaced apart from the second sense amplifier and the second word line driver.

At step 1402, the method includes forming MEOL layers over the FEOL devices and, at step 1404, the method includes forming first BEOL metal routing layers over the MEOL layers. In some embodiments, forming MEOL layers includes one or more of forming metal over poly layers, forming via over gate layers, and forming first metal layers M0. In some embodiments, forming first BEOL metal routing layers includes forming different metal layers and vias in a conductive path that extends in the z-direction.

In some embodiments, forming MEOL layers and forming first BEOL metal routing layers includes forming conductive segments configured to connect the first sense amplifier to each of the first memory array and the second memory array and to connect the second sense amplifier to each of the first memory array and the second memory array.

At step 1406, the method includes forming BEOL memory arrays electrically connected to the first BEOL metal routing layers and, at step 1408, the method includes forming second BEOL metal routing layers over the BEOL memory arrays. In some embodiments, forming BEOL memory arrays includes forming a first memory array above a first sense amplifier and a first word line driver, and forming a second memory array above a second sense amplifier and a second word line driver.

Figure 34:
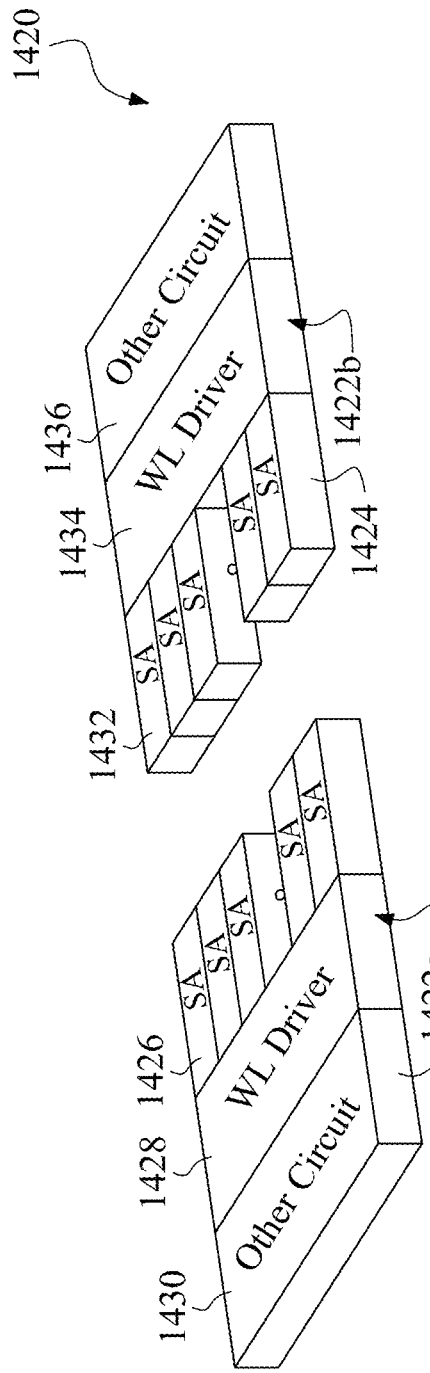
FIG. 34 is a diagram schematically illustrating a memory device that includes peripheral circuits manufactured during the method of FIG. 33, in accordance with some embodiments.
Figure 35:
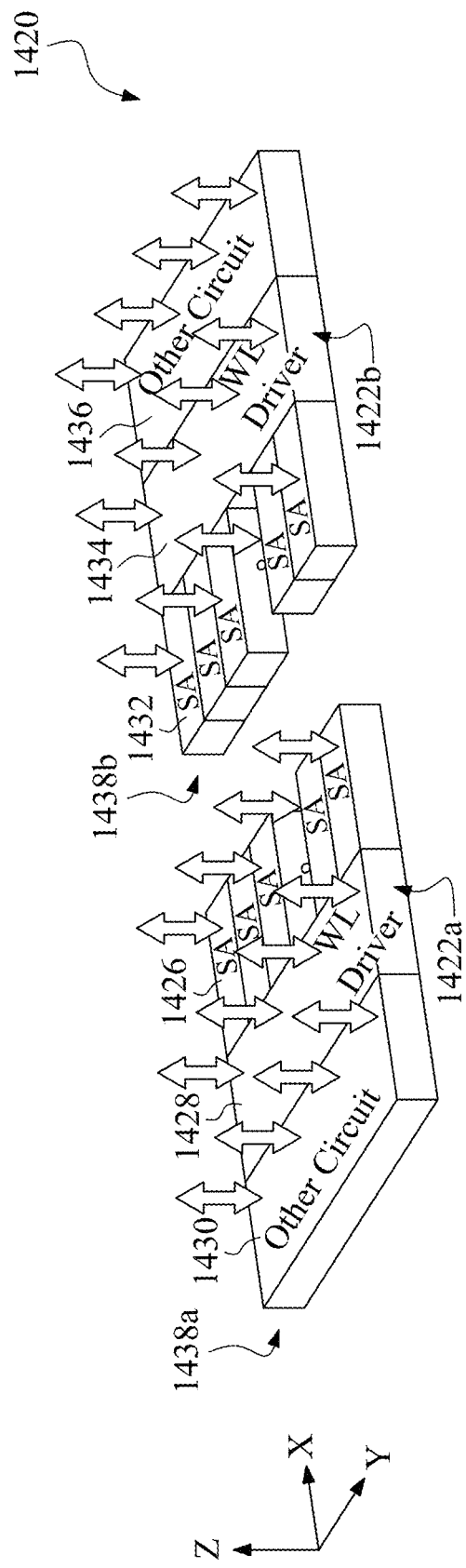
FIG. 35 is a diagram schematically illustrating conductive paths that extend in the z-direction over the peripheral circuits of the memory device, in accordance with some embodiments.
Figure 36:
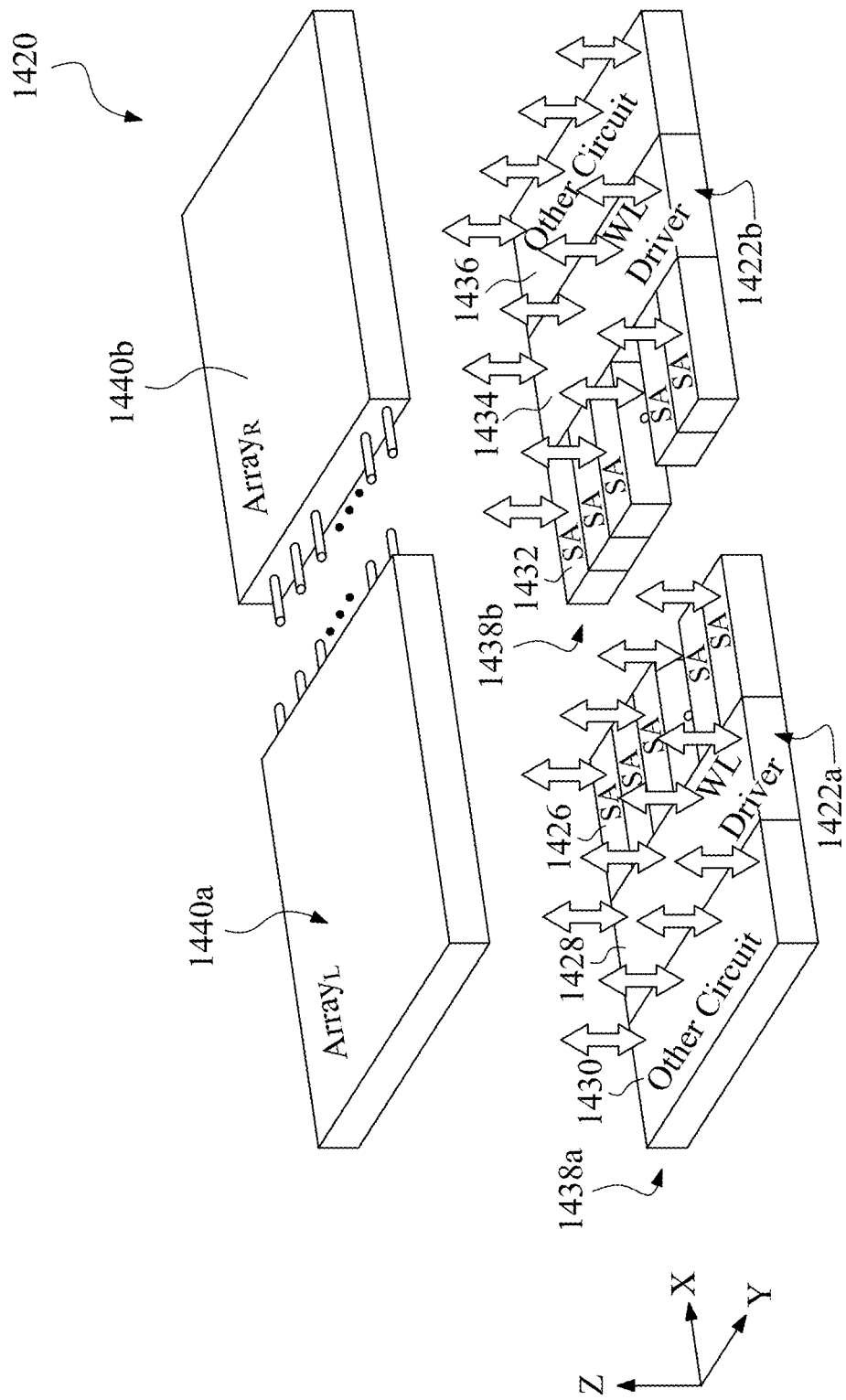
FIG. 36 is a diagram schematically illustrating a first memory array situated over a peripheral circuit, and a second memory array situated over another peripheral circuit, in accordance with some embodiments.

FIGS. 34-36 are diagrams schematically illustrating the manufacturing of a memory device 1420 with the method of FIG. 33. In some embodiments, the memory device 1420 is like one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18, and others, disclosed herein.

FIG. 34 is a diagram schematically illustrating the memory device 1420, which includes peripheral circuits 1422a and 1422b manufactured during step 1400 of FIG. 33, in accordance with some embodiments. The peripheral circuits 1422a and 1422b include FEOL devices manufactured by forming the FEOL devices in a substrate 1424 of the memory device 1420.

The peripheral circuits 1422a and 1422b include first SAs 1426, first word line drivers 1428, first other circuits 1430, second SAs 1432, second word line drivers 1434, and second other circuits 1436. The first SAs 1426 are formed adjacent the first word line drivers 1428, and the second SAs 1432 are formed adjacent the second word line drivers 1434. The first SAs 1426 and the first word line drivers 1428 are spaced apart from the second SAs 1432 and the second word line drivers 1434. In some embodiments, forming the FEOL devices includes forming gate structures that include isolation regions and metal gates. In some embodiments, forming the FEOL devices includes forming S/D regions in the substrate 1424.

FIG. 35 is a diagram schematically illustrating conductive paths 1438a and 1438b that extend in the z-direction over the peripheral circuits 1422a and 1422b, respectively, of the memory device 1420, in accordance with some embodiments. The conductive paths 1438a and 1438b are formed during steps 1402 and 1404 of FIG. 33.

During step 1402, the MEOL layers are formed over the FEOL devices, such as the conductive paths 1438a and 1438b. In some embodiments, the MEOL layers include one or more of metal over poly layers, via over gate layers, and first metal layers M0.

During step 1404, the first BEOL metal routing layers are formed over the MEOL layers. In some embodiments, the first BEOL metal routing layers include multiple different metal layers and vias formed over the MEOL layers in the conductive paths 1438a and 1438b.

FIG. 36 is a diagram schematically illustrating a first memory array 1440a situated over the peripheral circuit 1422a, and a second memory array 1440b situated over the peripheral circuit 1422b, respectively, in accordance with some embodiments. The first memory array 1440a and the second memory array 1440b are formed during step 1406 of FIG. 33. In some embodiments, the first memory array 1440a is electrically connected to each of the peripheral circuits 1422a and 1422b. In some embodiments, the second memory array 1440b is electrically connected to each of the peripheral circuits 1422a and 1422b.

During step 1406, the first memory array 1440a and the second memory array 1440b are formed and electrically connected to the conductive paths 1438a and 1438b, including to the first BEOL metal routing layers. Also, in a further step 1408, second BEOL metal routing layers are formed over the first memory array 1440a and the second memory array 1440b.

Figure 37:
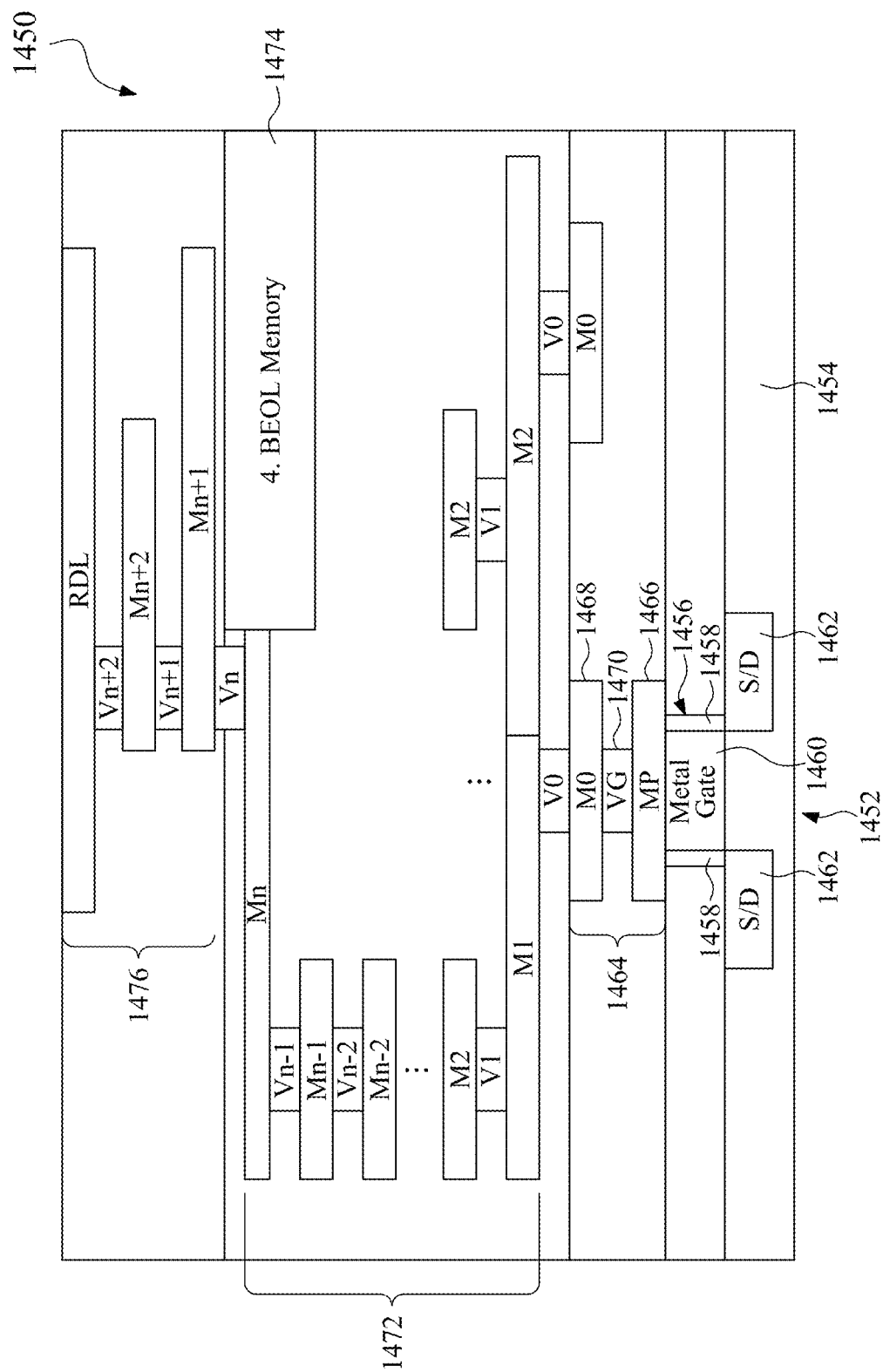
FIG. 37 is a diagram schematically illustrating another memory device, in accordance with some embodiments.

FIG. 37 is a diagram schematically illustrating a memory device 1450, in accordance with some embodiments. The memory device 1450 is manufactured by the method of FIG. 33. In some embodiments, the memory device 1450 is like or part of the memory device 1420. In some embodiments, the memory device 1450 is like or part of one or more of the memory devices disclosed herein including the memory device 20 of FIG. 1, the memory device 60 of FIG. 2, the memory device 300 of FIG. 5, the memory device 340 of FIG. 6, the memory device 500 of FIG. 9 and FIGS. 10-16, the memory device 900 of FIG. 17, and the memory device 902 of FIG. 18, and others, disclosed herein.

The memory device 1450 includes a FEOL device 1452 manufactured by forming the FEOL device 1452 on a substrate 1454 of the memory device 1450. The FEOL device 1452 includes a gate structure 1456 formed on the substrate 1454 in a FEOL process. The gate structure 1456 includes isolation regions 1458, a metal gate 1460 and, in some embodiments, a poly layer on the gate structure 1456. In some embodiments, forming the FEOL device 1452 includes forming S/D regions 1462 in the substrate 1454. In some embodiments, the FEOL device 1452 is part of a SA. In some embodiments, the FEOL device 1452 is part of a word line driver.

The memory device 1450 includes MEOL metal layers and vias 1464 electrically connected to the metal gate 1460 of the gate structure 1456. The MEOL metal layers and vias 1464 are manufactured during a MEOL process and include a metal over poly (MP) layer 1466 over the gate structure 1456 and a first metal layer M0 1468 electrically connected to the MP layer 1466 through a via-over-gate (VG) 1470.

The memory device 1450 further includes first BEOL metal routing layers 1472 electrically connected to the MEOL metal layers and vias 1464. The first BEOL metal routing layers 1472 are manufactured during a BEOL process and include multiple different metal layers, such as metal layers M1, M2, . . . . Mn−2, Mn−1, and Mn formed over and electrically connected to the MEOL metal layers and vias 1464 through vias V0, V1, . . . . Vn−2, and Vn−1.

A BEOL memory array 1474 is manufactured during the BEOL process. The BEOL memory array 1474 is electrically connected to the FEOL device 1452 through the metal layer Mn of the first BEOL metal routing layers 1472. The BEOL memory array 1474 is formed during step 1406 of FIG. 33.

Also, in the BEOL process, second BEOL metal routing layers 1476 are formed over the BEOL memory array 1474. The second BEOL metal routing layers 1476 include metal layers Mn+1 and Mn+2 and a redistribution layer (RDL) electrically connected to the BEOL memory array 1474 through metal layer Mn and vias Vn, Vn+1, and Vn+2.

Disclosed embodiments thus provide FEOL peripheral circuits, such as SAs and word line drivers, connected to BEOL memory arrays through MEOL and BEOL conductive layers, such as metal layers and vias. In some embodiments, the FEOL peripheral circuits are situated under the BEOL memory arrays, such that the MEOL and BEOL conductive layers provide conductive paths in the z-direction, along a z-axis, between the FEOL peripheral circuits and the BEOL memory arrays.

In some embodiments, a device includes a sense amplifier and a word line driver disposed under a memory array. First conductive segments connect the sense amplifier to a bit line of the memory array and second conductive segments connect the word line driver to a word line of the memory array. In some embodiments, the memory array has an array footprint where the word line driver is situated in a middle portion of the array footprint and the sense amplifier is situated near a boundary of the array footprint. In some embodiments, the memory array has an array footprint where the sense amplifier is situated in a middle portion of the array footprint and the word line driver is situated near a boundary of the array footprint.

Embodiments further provide a device that includes a first memory array and a second memory array that is spaced apart from the first memory array. A first sense amplifier is situated under the first memory array and a second sense amplifier is situated under the second memory array. First conductive segments connect the first sense amplifier and the second sense amplifier to the first memory array, and second conductive segments connect the first sense amplifier and the second sense amplifier to the second memory array.

Disclosed embodiments further provide a method of manufacturing a memory device. The method includes forming FEOL peripheral circuits in a substrate; forming MEOL conductive layers that are electrically connected to the FEOL peripheral circuits; forming BEOL conductive layers that are electrically connected to the MEOL conductive layers; and forming BEOL memory arrays above the FEOL peripheral circuits with the BEOL memory arrays electrically connected to the BEOL conductive layers.

Advantages of the disclosed embodiments include reducing the size of the memory device by reducing the area occupied by the memory arrays and peripheral circuits, which reduces the cost of the memory device, and using all memory cells in the edge arrays of the memory device, which increases area efficiency and provides a higher memory cell density. In addition, advantages include varying memory cell dimensions and/or changing technology nodes without changing placement of the peripheral circuits and without changing the FEOL masks, which improves product yields and performance, reduces the duration of yield learning, and assists in meeting performance, power, area, cost, and time to market criteria.

In accordance with some embodiments, a device includes a substrate, a first sense amplifier disposed on the substrate, a first word line driver disposed on the substrate and situated adjacent the first sense amplifier on the substrate in the x-direction, and a first memory array disposed above the first sense amplifier and above the first word line driver in the z-direction. A plurality of first conductive segments extend alternately in the x-direction and the y-direction, the plurality of first conductive segments disposed between the first memory array and the first sense amplifier and configured to electrically connect the first sense amplifier to a first bit line of the first memory array, and a plurality of second conductive segments extend alternately in the x-direction and the y-direction, the plurality of second conductive segments disposed between the first memory array and the first word line driver and configured to electrically connect the first word line driver to a first word line of the first memory array.

In accordance with further embodiments, a device includes a first memory array and a second memory array that is spaced apart from the first memory array in the x-direction, and a first sense amplifier situated under the first memory array in the z-direction and a second sense amplifier situated under the second memory array in the z-direction.

A plurality of first conductive segments extend alternately in the x-direction and the y-direction, the plurality of first conductive segments disposed between the first memory array and the first sense amplifier and between the first memory array and the second sense amplifier and configured to electrically connect the first sense amplifier and the second sense amplifier to the first memory array. A plurality of second conductive segments extend alternately in the x-direction and the y-direction, the plurality of second conductive segments disposed between the second memory array and the first sense amplifier and between the second memory array and the second sense amplifier and configured to electrically connect the first sense amplifier and the second sense amplifier to the second memory array.

In accordance with still further disclosed aspects, a method of manufacturing a semiconductor device includes: forming front-end-of-line devices on a substrate of the semiconductor device; forming middle-end-of-line layers over the front-end-of-line devices in the z-direction; forming first back-end-of-line metal routing layers over the middle-end-of-line layers in the z-direction; forming back-end-of-line memory arrays adjacent each other in the x-direction and electrically connected to the first back-end-of-line metal routing layers; and forming second back-end-of-line metal routing layers over the back-end-of-line memory arrays in the z-direction.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a substrate;
    a first sense amplifier disposed on the substrate;
    a first word line driver disposed on the substrate and situated adjacent the first sense amplifier on the substrate in the x-direction;
    a first memory array disposed above the first sense amplifier and above the first word line driver in the z-direction;
    a plurality of first conductive segments that extend alternately in the x-direction and the y-direction, the plurality of first conductive segments disposed between the first memory array and the first sense amplifier and configured to electrically connect the first sense amplifier to a first bit line of the first memory array; and
    a plurality of second conductive segments that extend alternately in the x-direction and the y-direction, the plurality of second conductive segments disposed between the first memory array and the first word line driver and configured to electrically connect the first word line driver to a first word line of the first memory array.

2. The device of claim 1, wherein the first memory array has an array footprint that has a middle portion and a footprint boundary, and the first word line driver is situated in the middle portion of the array footprint and the first sense amplifier is situated near the footprint boundary of the array footprint.

3. The device of claim 1, wherein the first memory array has an array footprint that has a middle portion and a footprint boundary, and the first sense amplifier is situated in the middle portion of the array footprint and the first word line driver is situated near the footprint boundary of the array footprint.

4. The device of claim 1, wherein the first bit line of the first memory array is situated in the x-direction, along an x-axis, of the first memory array and the first word line of the first memory array is situated in the y-direction, along a y-axis, of the first memory array.

5. The device of claim 4, wherein the first bit line is connected to the first sense amplifier through a first conductive segment that extends in the y-direction, along the y-axis, and the first word line is connected to the first word line driver through a second conductive segment that extends in the x-direction, along the x-axis.

6. The device of claim 1, wherein the first word line of the first memory array is situated in the x-direction, along an x-axis, of the first memory array and the first bit line of the first memory array is situated in the y-direction, along a y-axis, of the memory array.

7. The device of claim 6, wherein the first word line is connected to the first word line driver through a first conductive segment that extends in the y-direction, along the y-axis, and the first bit line of the first memory array is connected to the first sense amplifier through a second conductive segment that extends in the x-direction, along the x-axis.

8. The device of claim 1, comprising:
    a second sense amplifier disposed on the substrate;
    a second word line driver disposed on the substrate and situated adjacent the second sense amplifier on the substrate in the x-direction;
    a second memory array disposed above the second sense amplifier and above the second word line driver in the z-direction; and
    a plurality of third conductive segments that extend alternately in the x-direction and the y-direction, the plurality of third conductive segments disposed between the second memory array and the first sense amplifier and configured to electrically connect the first sense amplifier to a second bit line of the second memory array.

9. The device of claim 8, comprising a plurality of fourth conductive segments that extend alternately in the x-direction and the y-direction, the plurality of fourth conductive segments disposed between the second memory array and the second sense amplifier and configured to electrically connect the second sense amplifier to a third bit line of the second memory array.

10. The device of claim 9, comprising a plurality of fifth conductive segments that extend alternately in the x-direction and the y-direction, the plurality of fifth conductive segments disposed between the first memory array and the second sense amplifier and configured to electrically connect the second sense amplifier to a fourth bit line of the first memory array.

11. A device, comprising:
    a first memory array and a second memory array that is spaced apart from the first memory array in the x-direction;

a first sense amplifier situated under the first memory array in the z-direction and a second sense amplifier situated under the second memory array in the z-direction;

a plurality of first conductive segments that extend alternately in the x-direction and the y-direction, the plurality of first conductive segments disposed between the first memory array and the first sense amplifier and between the first memory array and the second sense amplifier and configured to electrically connect the first sense amplifier and the second sense amplifier to the first memory array; and a plurality of second conductive segments that extend alternately in the x-direction and the y-direction, the plurality of second conductive segments disposed between the second memory array and the first sense amplifier and between the second memory array and the second sense amplifier and configured to electrically connect the first sense amplifier and the second sense amplifier to the second memory array.

12. The device of claim 11, comprising a first word line driver situated under the first memory array in the z-direction and a second word line driver situated under the second memory array in the z-direction.

13. The device of claim 12, comprising a plurality of third conductive segments that extend alternately in the x-direction and the y-direction, the plurality of third conductive segments disposed between the first memory array and the first word line driver and configured to electrically connect the first word line driver to the first memory array.

14. The device of claim 13, comprising a plurality of fourth conductive segments that extend alternately in the x-direction and the y-direction, the plurality of fourth conductive segments disposed between the second memory array and the second word line driver and configured to electrically connect the second word line driver to the second memory array.

15. The device of claim 11, wherein the first memory array has an array footprint that has a middle portion and a footprint boundary, and the first word line driver is situated in the middle portion of the array footprint and the first sense amplifier is situated near the footprint boundary of the array footprint.

16. The device of claim 11, wherein the first memory array has an array footprint that has a middle portion and a footprint boundary, and the first sense amplifier is situated in the middle portion of the array footprint and the first word line driver is situated near the footprint boundary of the array footprint.

17. A method of manufacturing a semiconductor device, the method comprising:

forming front-end-of-line devices on a substrate of the semiconductor device;

forming middle-end-of-line layers over the front-end-of-line devices in the z-direction;

forming first back-end-of-line metal routing layers over the middle-end-of-line layers in the z-direction;

forming back-end-of-line memory arrays adjacent each other in the x-direction and electrically connected to the first back-end-of-line metal routing layers; and forming second back-end-of-line metal routing layers over the back-end-of-line memory arrays in the z-direction.

18. The method of claim 17, wherein forming front-end-of-line devices includes:

forming a first sense amplifier on the substrate;

forming a first word line driver on the substrate adjacent the first sense amplifier on the substrate in the x-direction;

forming a second sense amplifier on the substrate; and forming a second word line driver on the substrate adjacent the second sense amplifier on the substrate in the x-direction, wherein the first sense amplifier and the first word line driver are spaced apart from the second sense amplifier and the second word line driver in the x-direction.

19. The method of claim 18, wherein forming back-end-of-line memory arrays includes:

forming a first memory array above the first sense amplifier and above the first word line driver in the z-direction; and forming a second memory array above the second sense amplifier and above the second word line driver in the z-direction.

20. The method of claim 19, wherein forming middle-end-of-line layers and forming first back-end-of-line metal routing layers includes forming conductive segments that extend alternately in the x-direction and the y-direction, the conductive segments configured to connect the first sense amplifier to each of the first memory array and the second memory array and to connect the second sense amplifier to each of the first memory array and the second memory array.

* * * * *